(12) United States Patent
Ohkawa

(10) Patent No.: US 7,619,269 B2
(45) Date of Patent: Nov. 17, 2009

(54) SEMICONDUCTOR DEVICE, MANUFACTURING PROCESS THEREOF AND IMAGING DEVICE

(75) Inventor: Narumi Ohkawa, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/094,821

(22) Filed: Mar. 31, 2005

(65) Prior Publication Data

US 2005/0224853 A1 Oct. 13, 2005

Related U.S. Application Data

(63) Continuation of application No. PCT/JP03/03316, filed on Mar. 19, 2003.

(51) Int. Cl.
*H01L 29/72* (2006.01)

(52) U.S. Cl. .................. 257/296; 257/79; 257/309; 257/401; 257/440; 257/445; 257/461; 257/529

(58) Field of Classification Search .................. 257/79, 257/296, 309, 401, 440, 445, 461, 529
See application file for complete search history.

(56) References Cited

U.S. PATENT DOCUMENTS

| 5,665,959 | A | | 9/1997 | Fossum et al. |
| 5,786,827 | A | * | 7/1998 | Jukl et al. ................. 345/519 |
| 6,441,482 | B1 | | 8/2002 | Foster |
| 6,472,698 | B1 | * | 10/2002 | Nakashiba ................. 257/222 |
| 6,563,187 | B1 | * | 5/2003 | Park ................................ 257/446 |
| 2002/0117690 | A1 | | 8/2002 | Rhodes |
| 2002/0195637 | A1 | | 12/2002 | Kokubun |

FOREIGN PATENT DOCUMENTS

| EP | 0 660 421 | * | 6/1995 |
| EP | 0660421 | A2 | 6/1995 |
| JP | 59-52973 | | 3/1984 |
| JP | 59-052973 | A | 3/1984 |
| JP | 11-17107 | | 1/1999 |
| JP | 11-163274 | | 6/1999 |
| JP | 11-163274 | A | 6/1999 |
| JP | 2000-41186 | | 2/2000 |
| JP | 2000-196995 | | 7/2000 |
| JP | 2000-196995 | A | 7/2000 |
| JP | 2000-260971 | | 9/2000 |
| JP | 2002-231889 | | 8/2002 |
| JP | 2002-231889 | A | 8/2002 |
| JP | 2002-334928 | | 11/2002 |

(Continued)

OTHER PUBLICATIONS

Patent Abstracts of Japan, Publication No. 11017107 A, published on Jan. 22, 1999.

(Continued)

*Primary Examiner*—Edward Wojciechowicz
(74) *Attorney, Agent, or Firm*—Westerman, Hattori, Daniels & Adrian, LLP

(57) ABSTRACT

A semiconductor device including a pixel region in which one or more pixels are formed and a DRAM cell region in which one or more DRAM cells for storing output signals from the pixels are formed, characterized in that the layers constituting the pixel region and the DRAM cell region are formed in the same semiconductor process.

18 Claims, 63 Drawing Sheets

FOREIGN PATENT DOCUMENTS

| | | |
|---|---|---|
| JP | 2002-368201 | 12/2002 |
| JP | 2002-368201 A | 12/2002 |
| JP | 2003-7856 | 1/2003 |
| JP | 2003-007856 A | 1/2003 |
| KR | 2000-0003469 A | 1/2000 |
| KR | 2001-19304 | 3/2001 |

OTHER PUBLICATIONS

Office Action dated Nov. 16, 2006 issued in Corresponding Korean Application No. 2005-7006285.

European Search Report dated in Oct. 1, 2007, issued in corresponding European Patent Application No. 03708667.5.

* cited by examiner

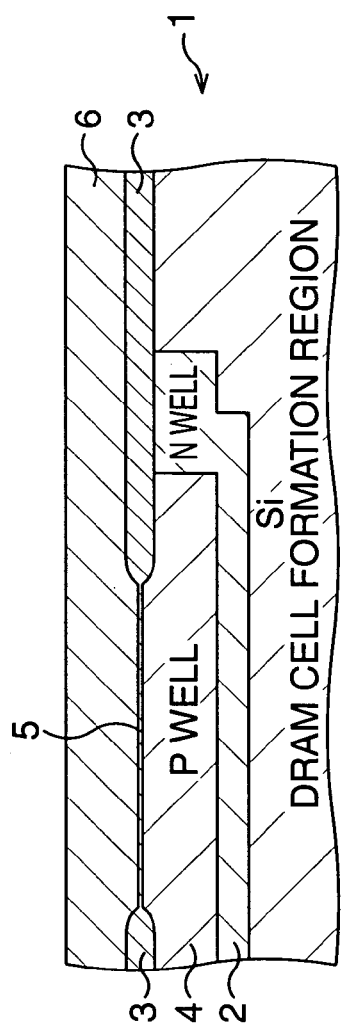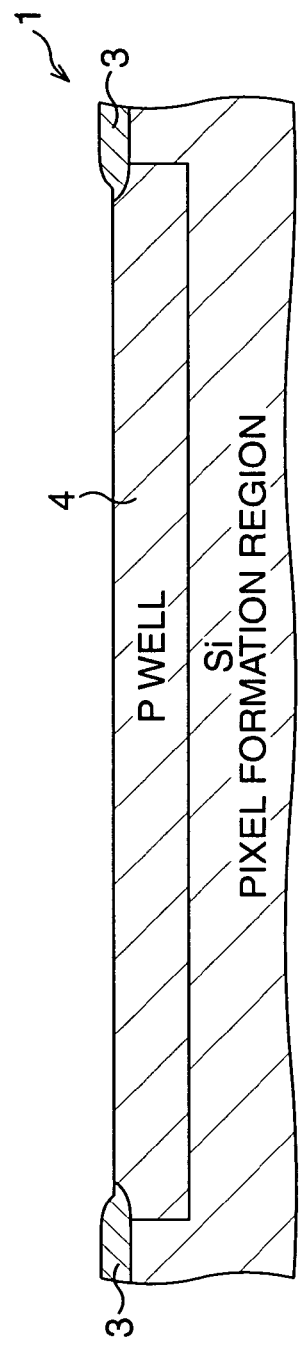

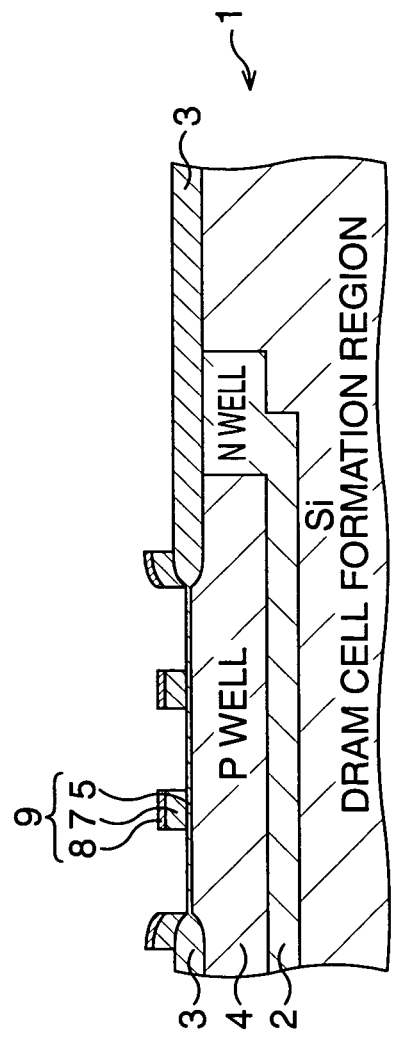
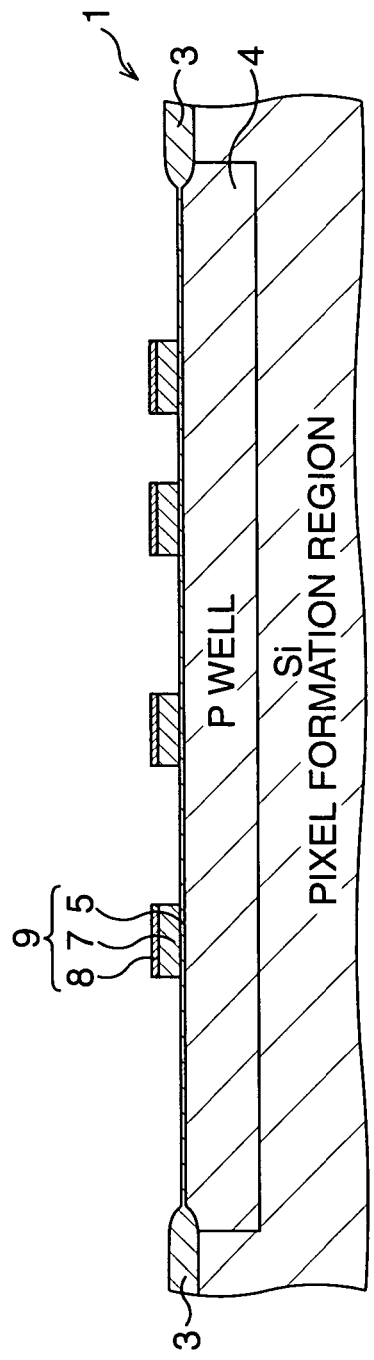

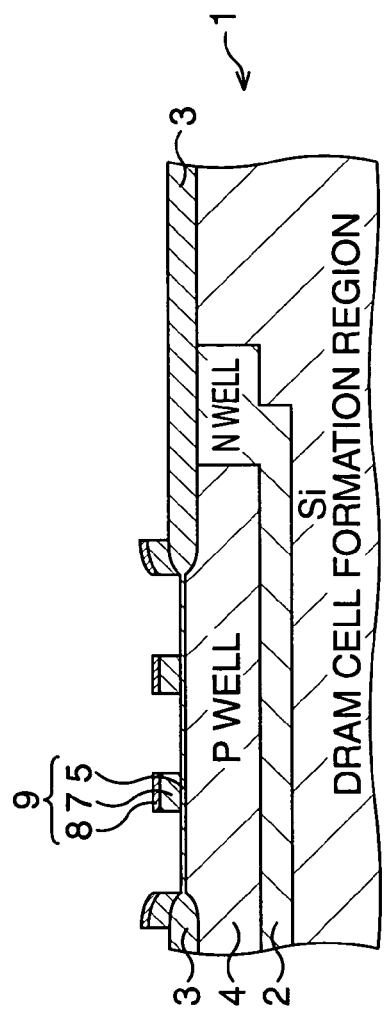
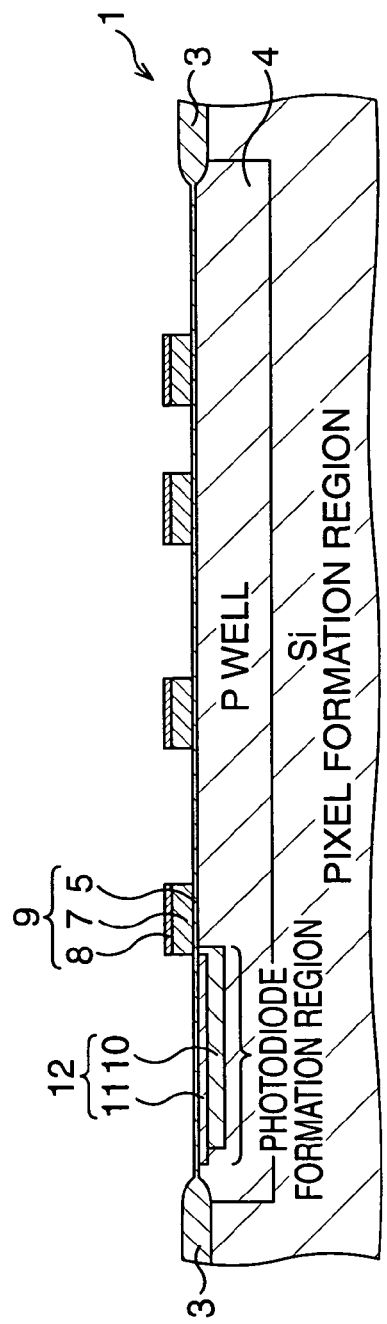

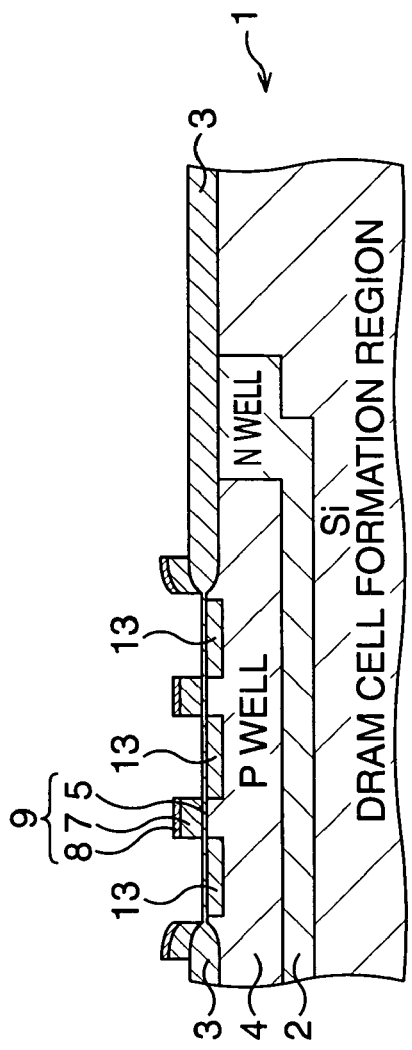
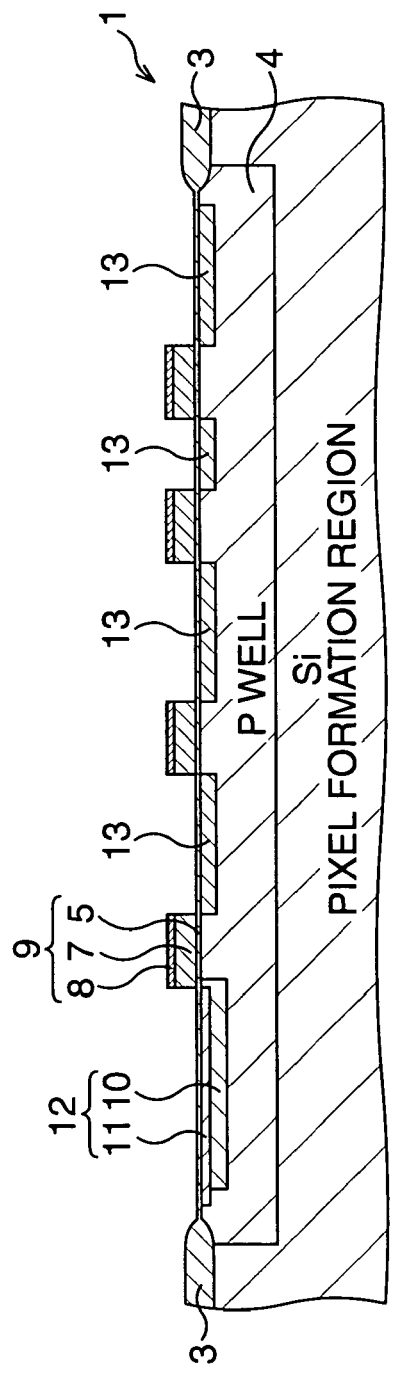

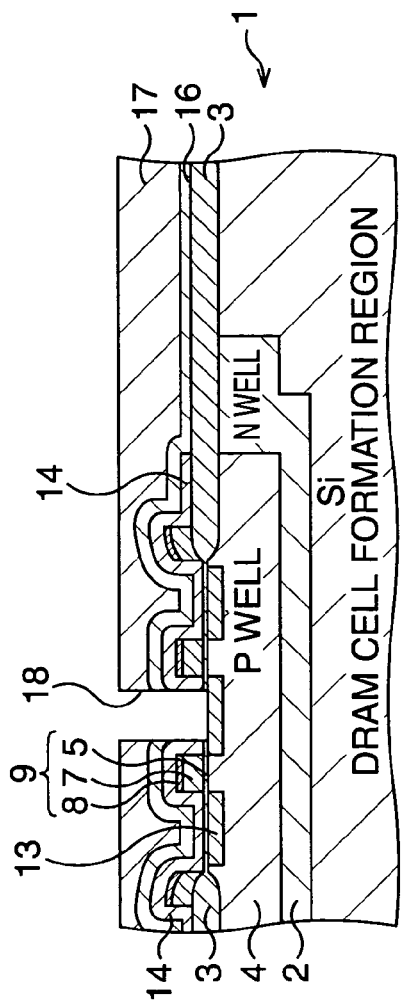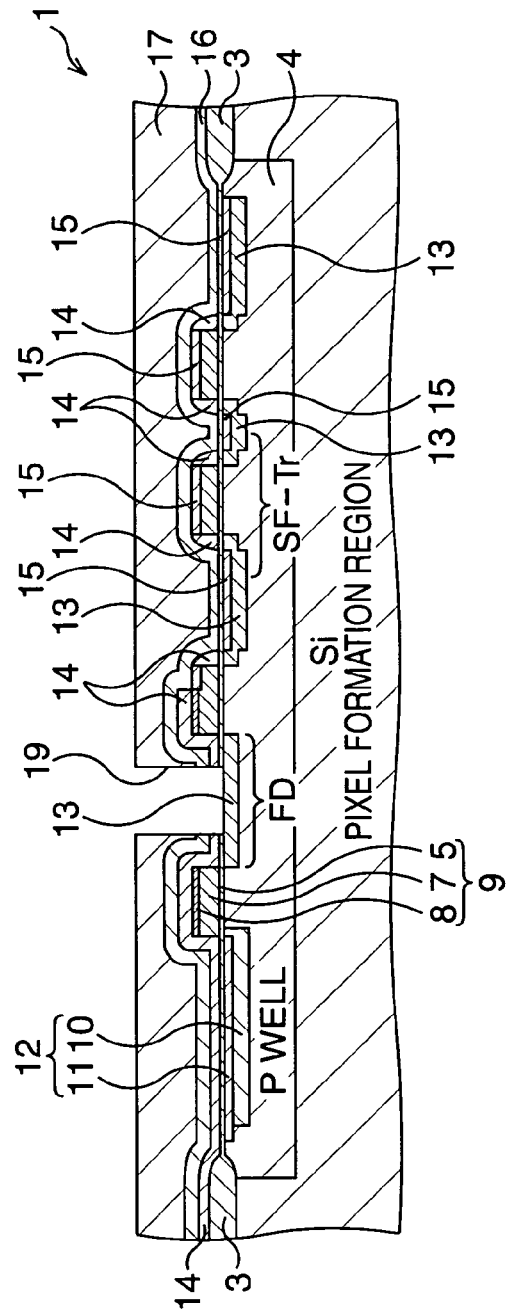

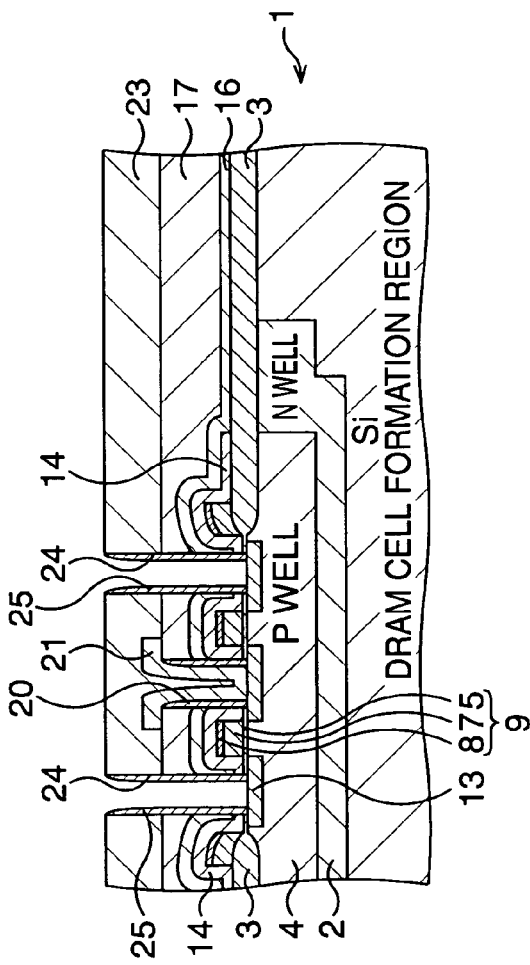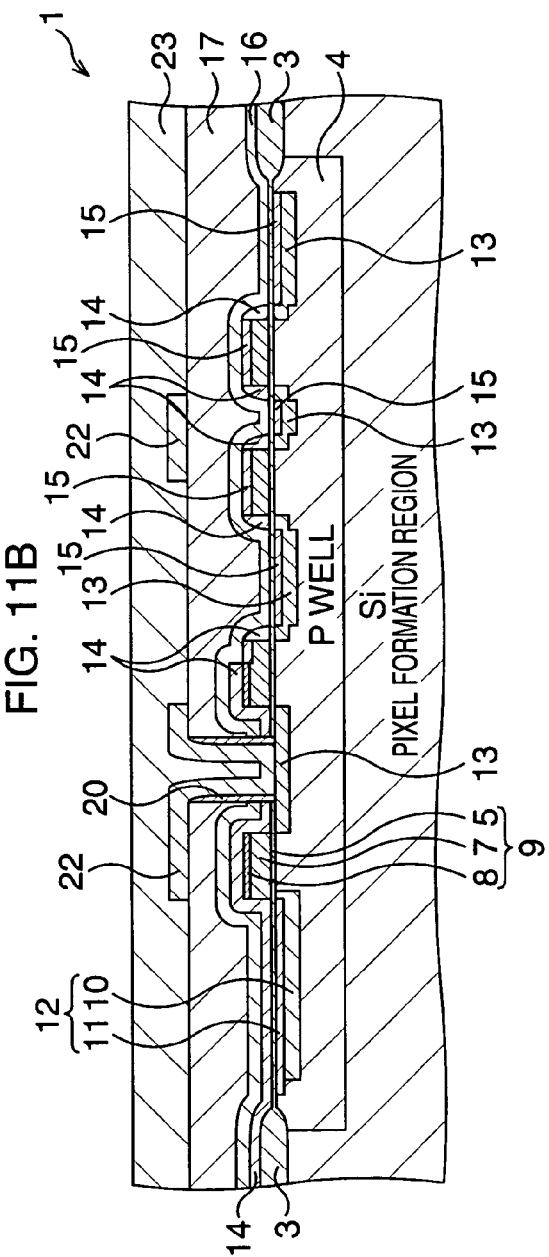

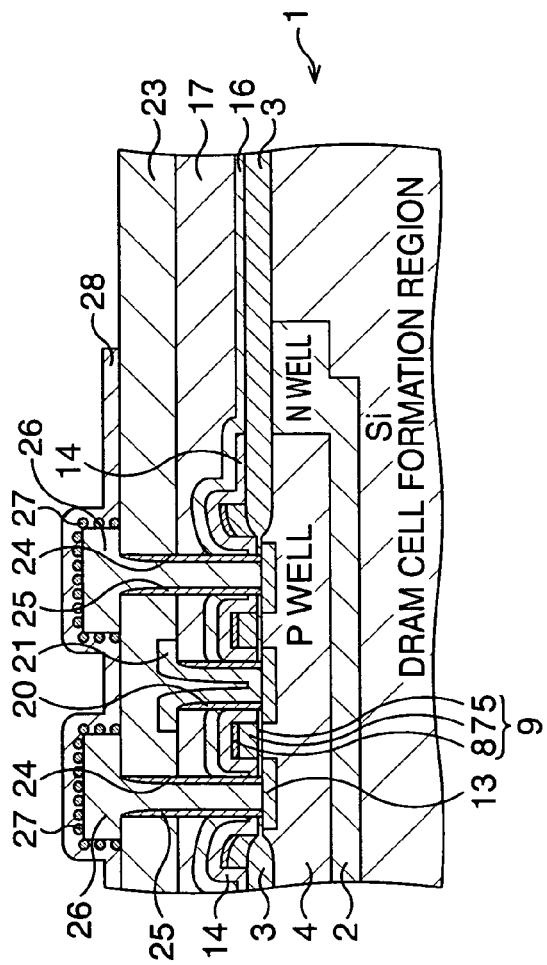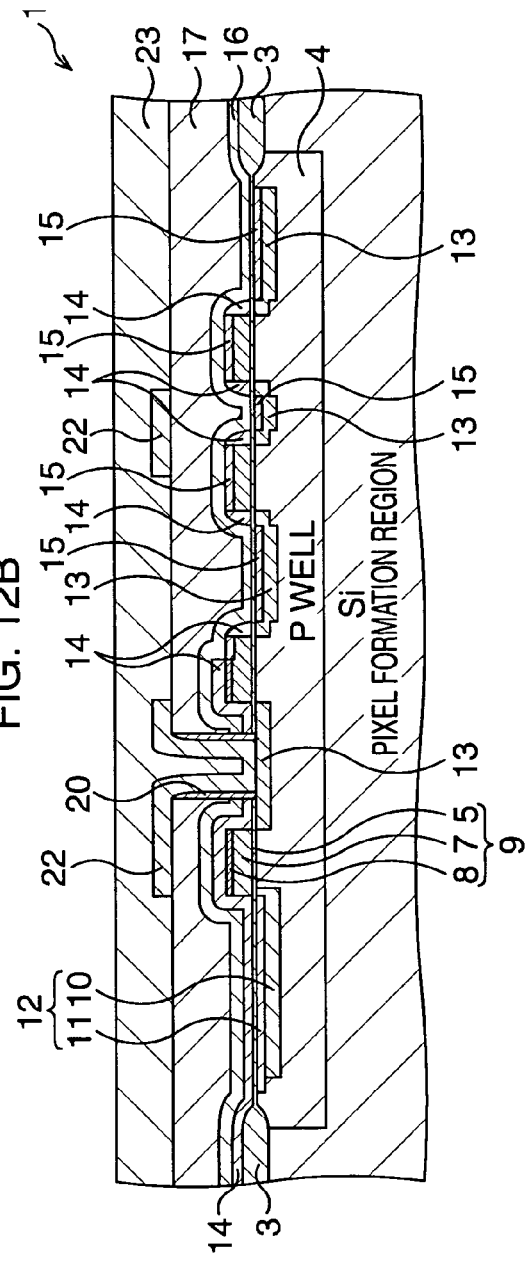

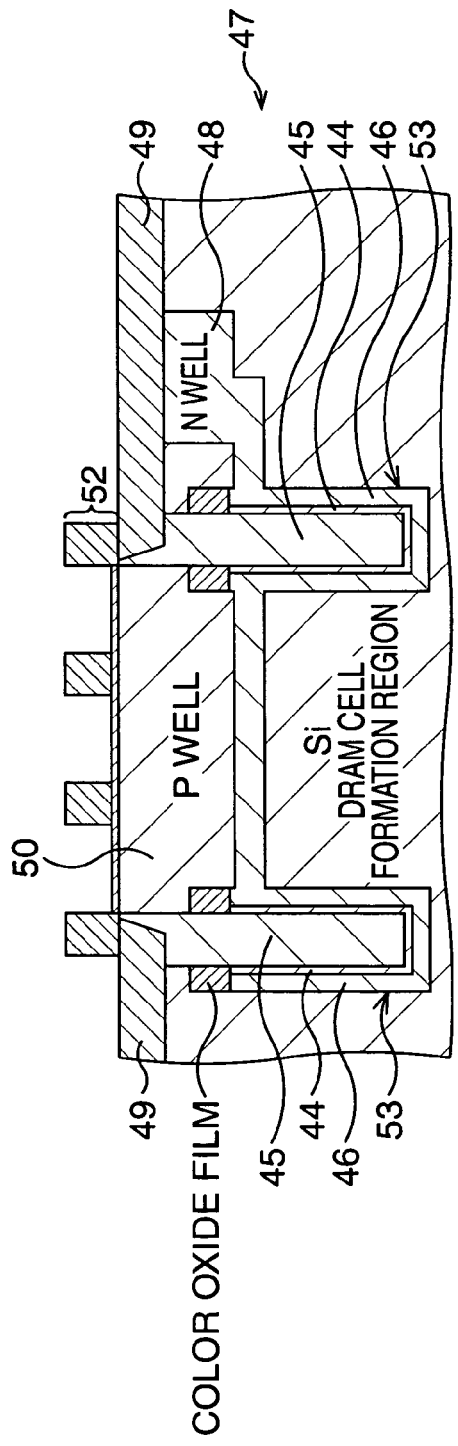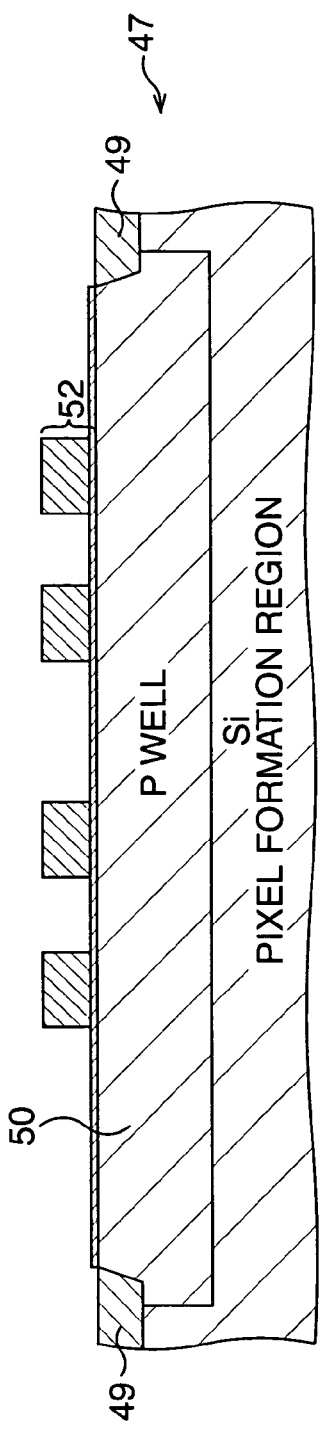

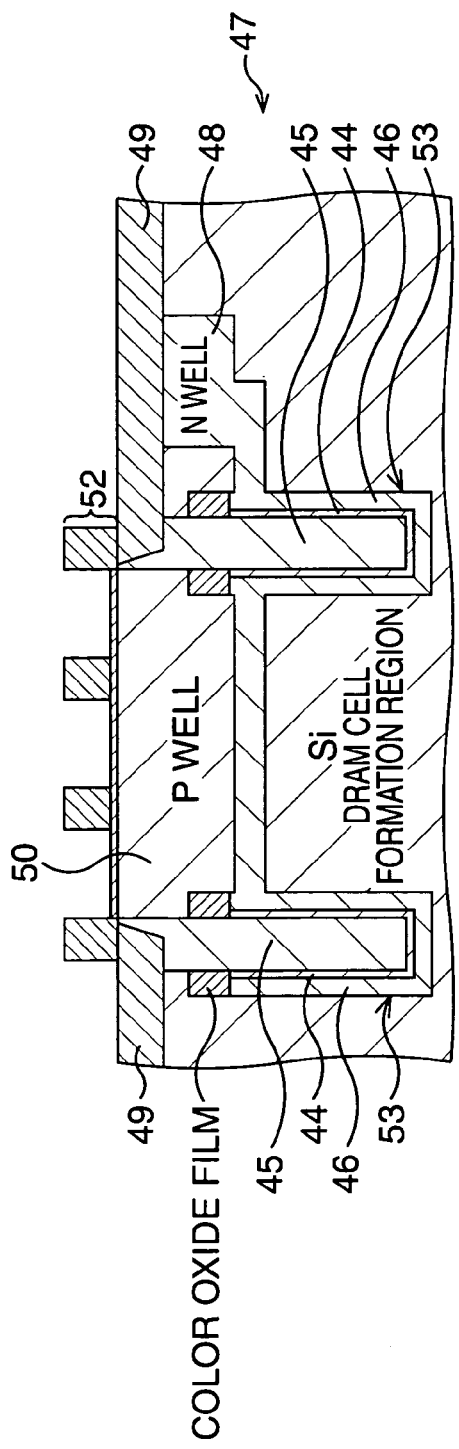
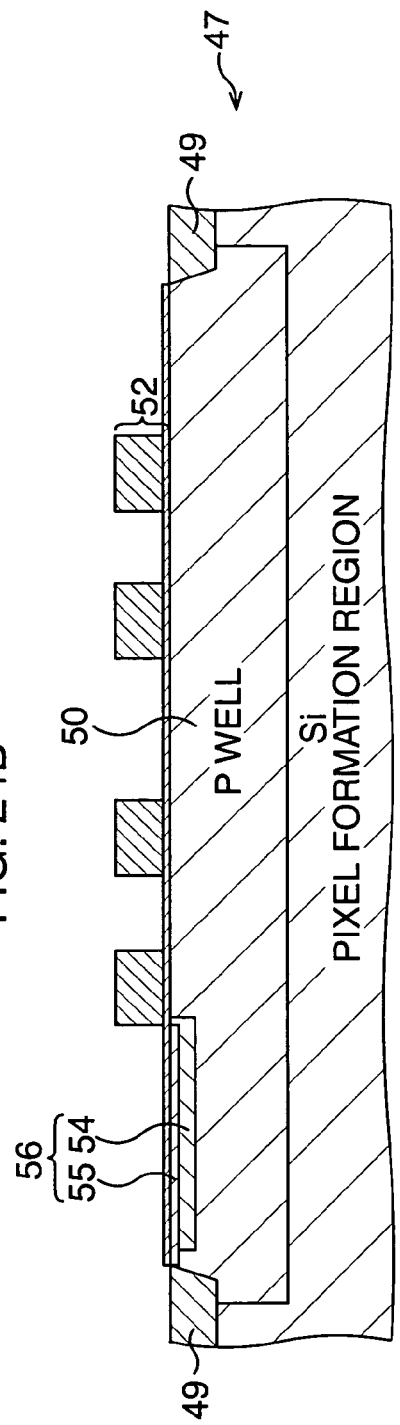
FIG. 24A
FIG. 24B

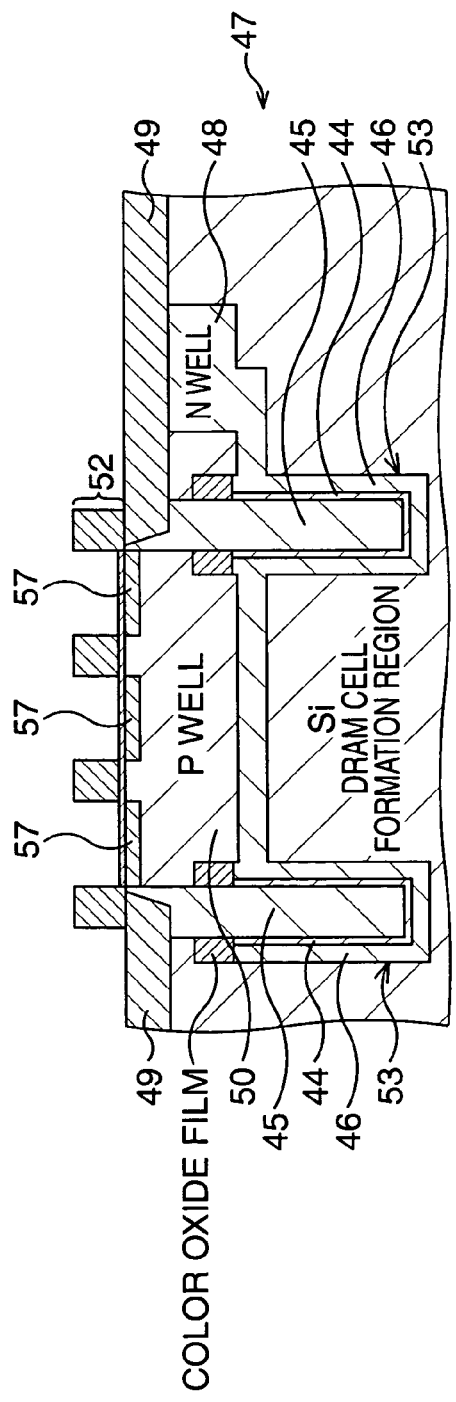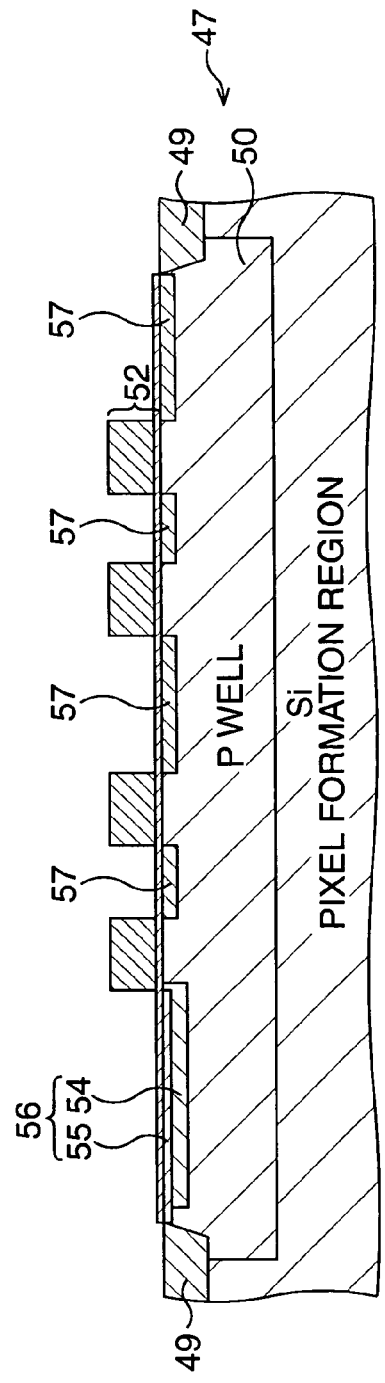

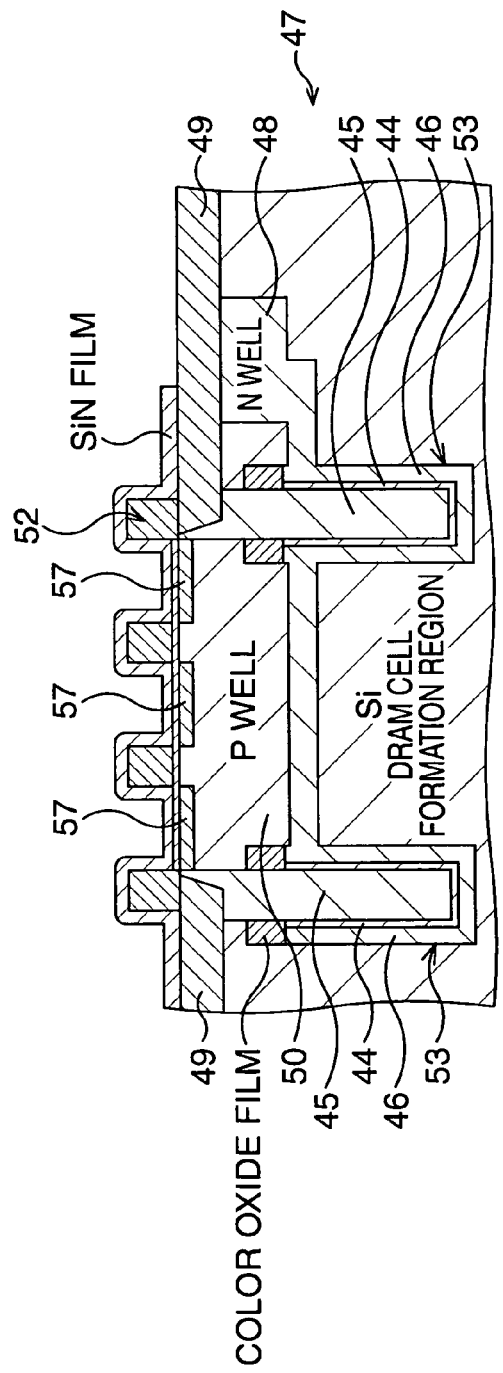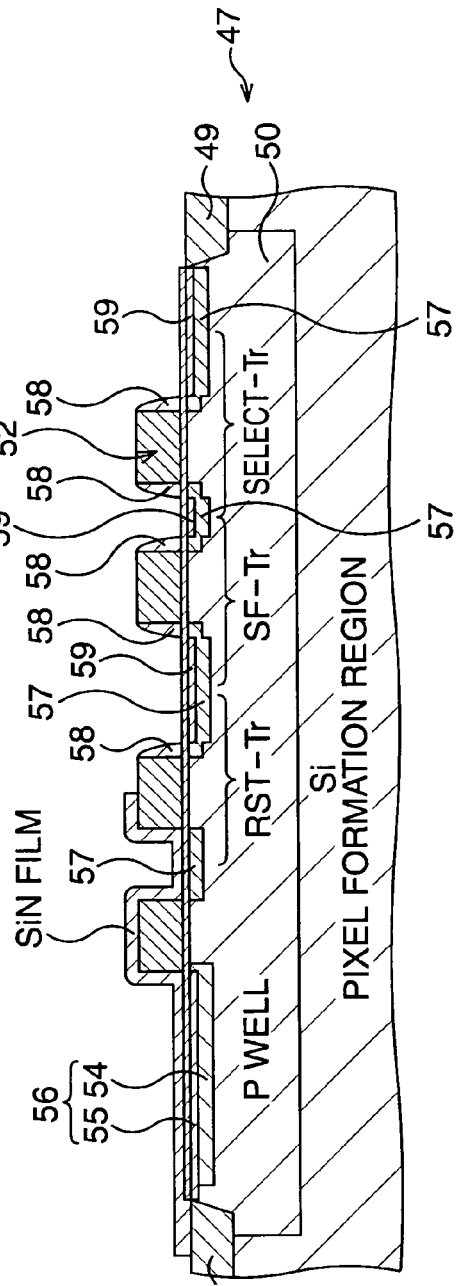

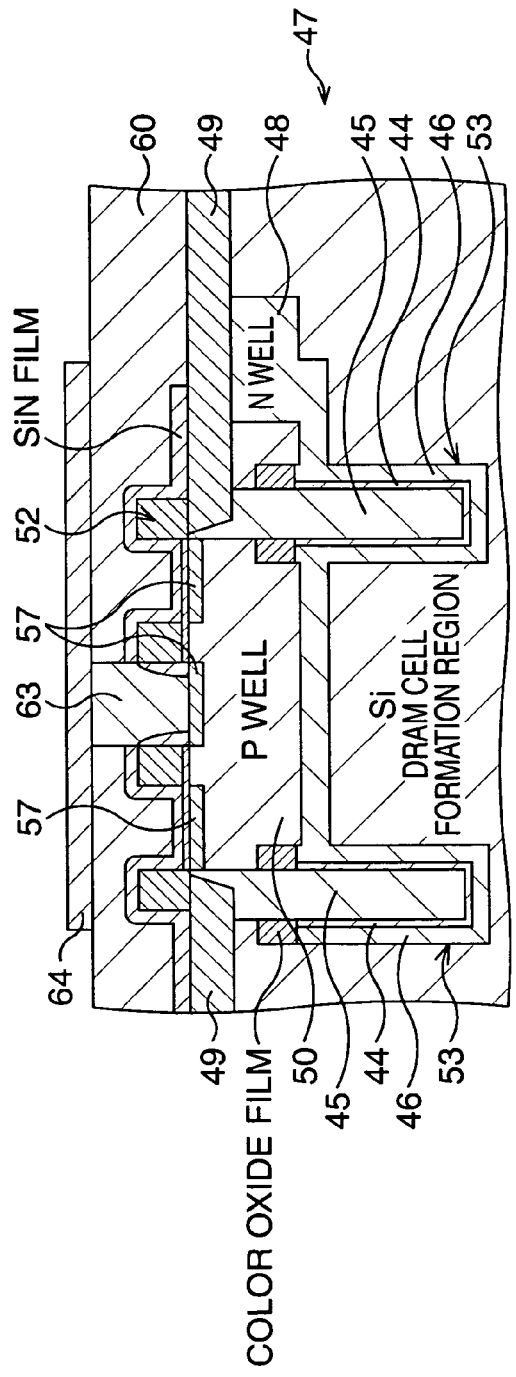
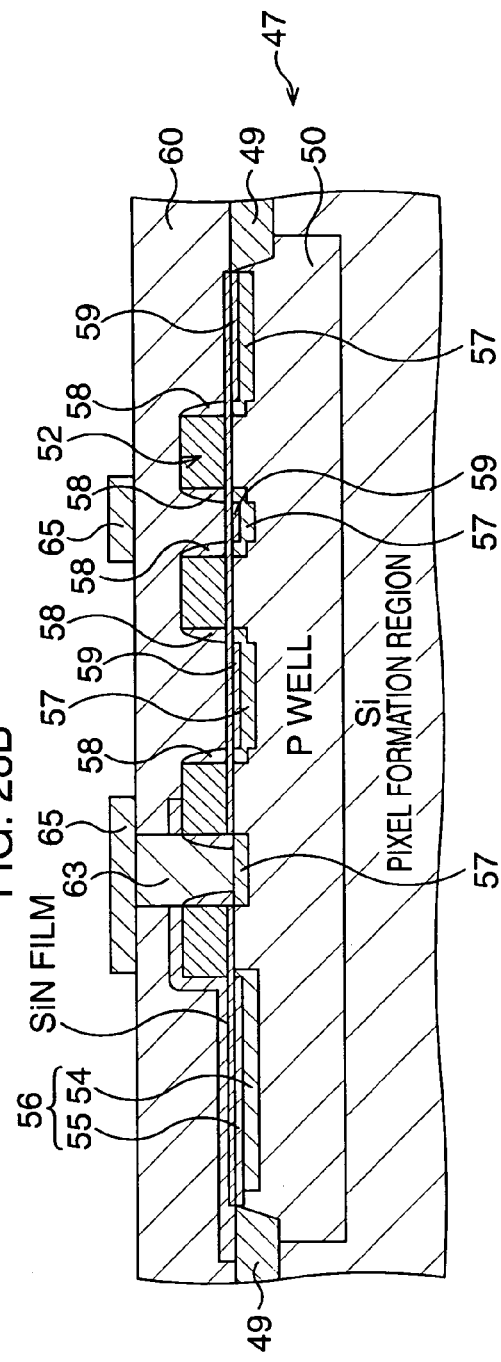

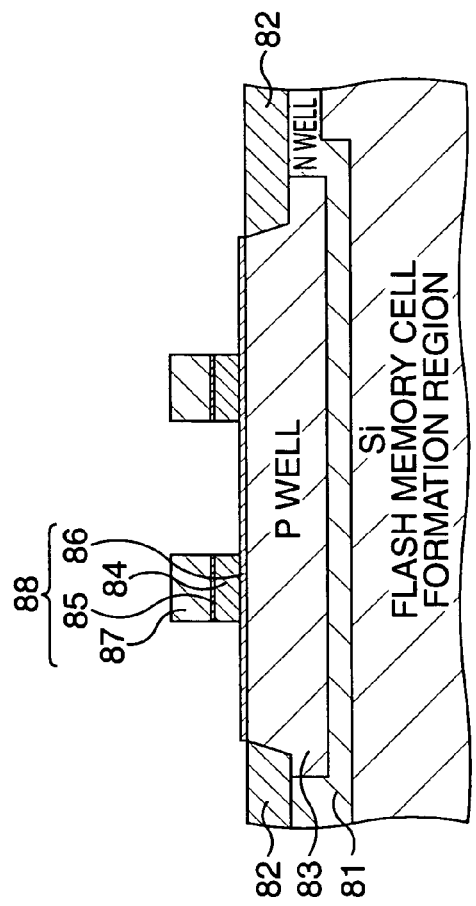
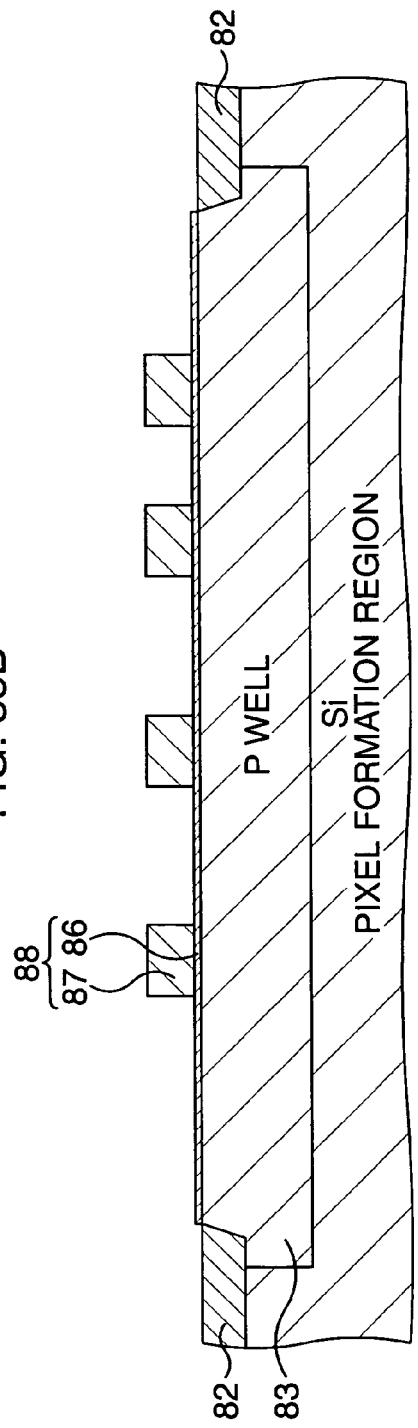

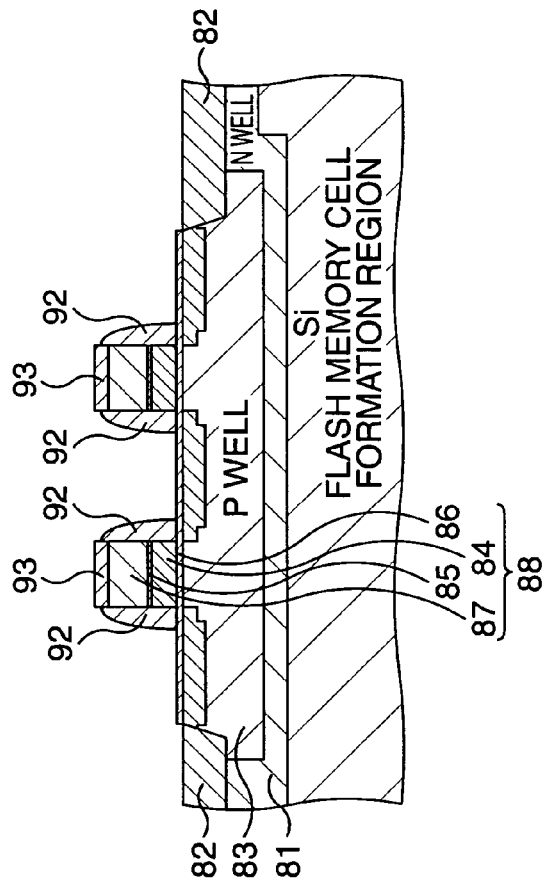
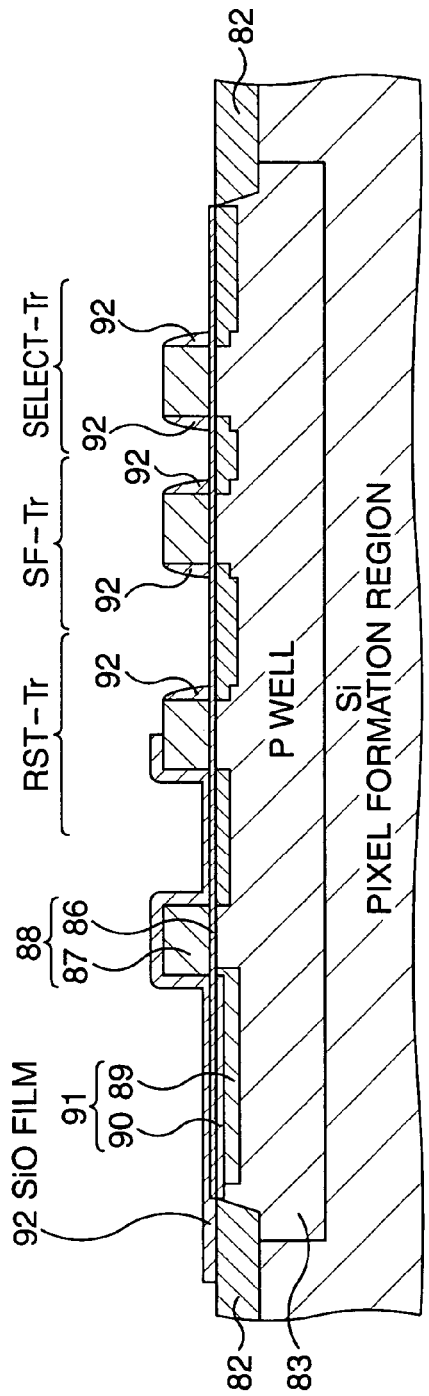

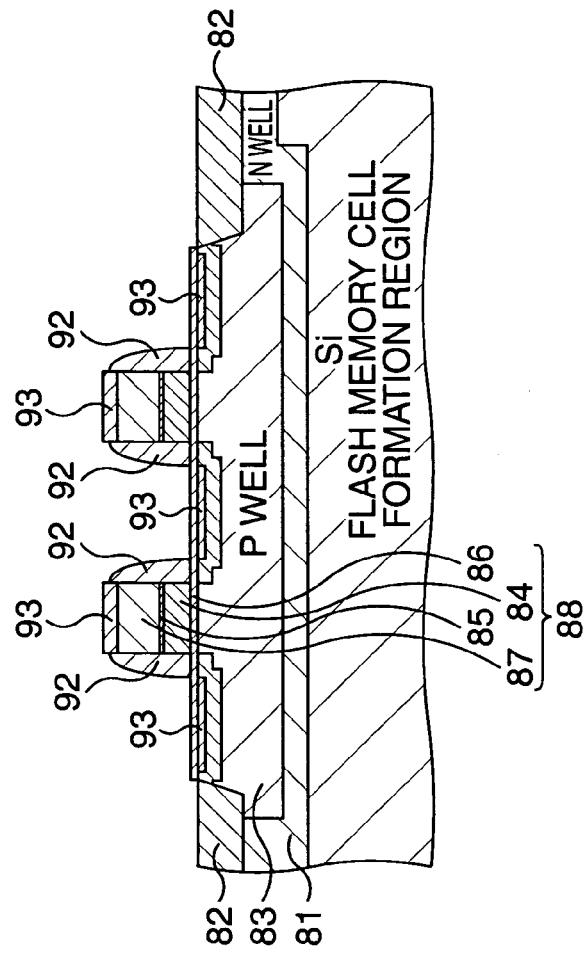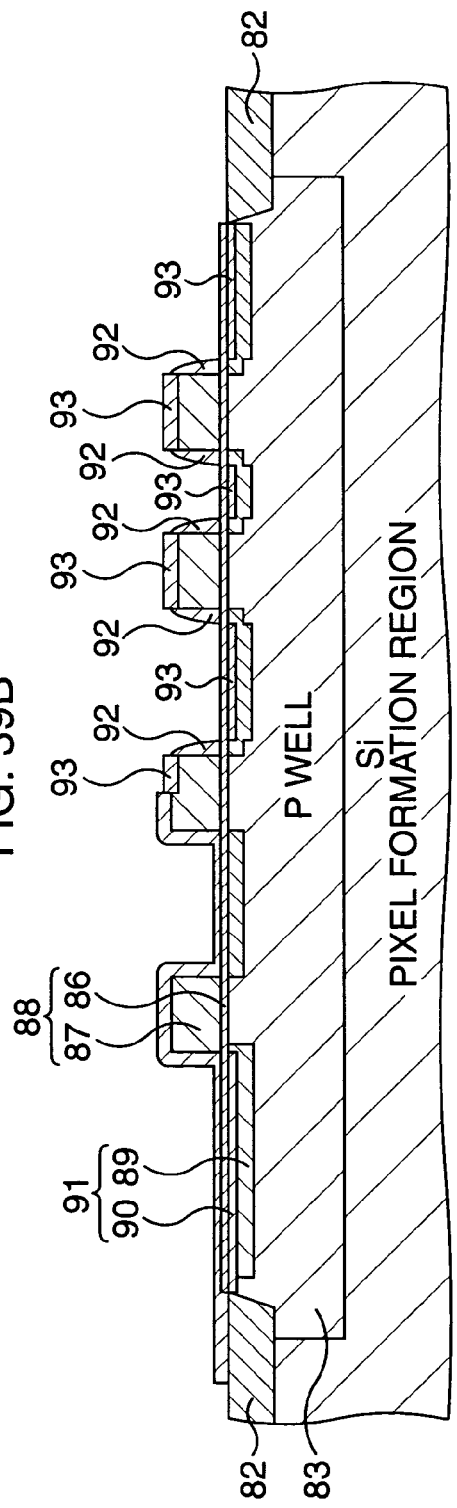

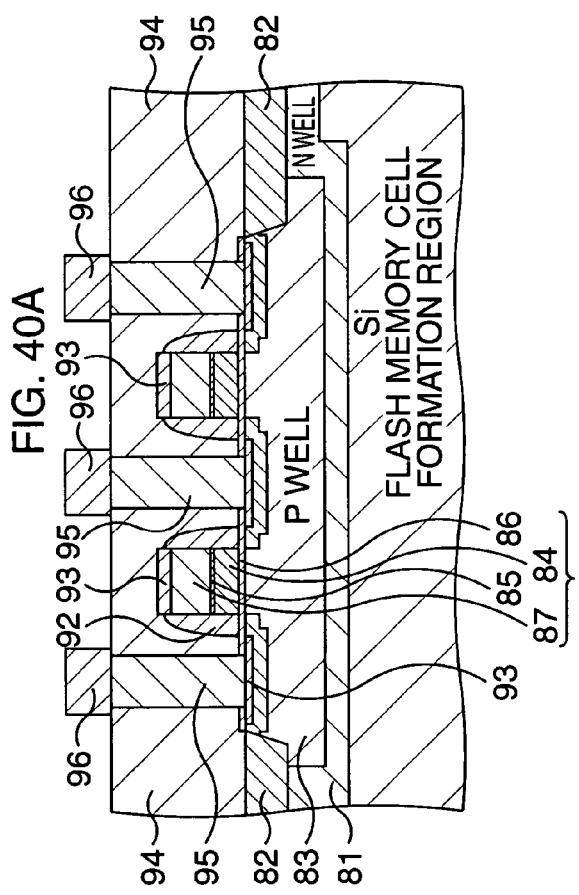
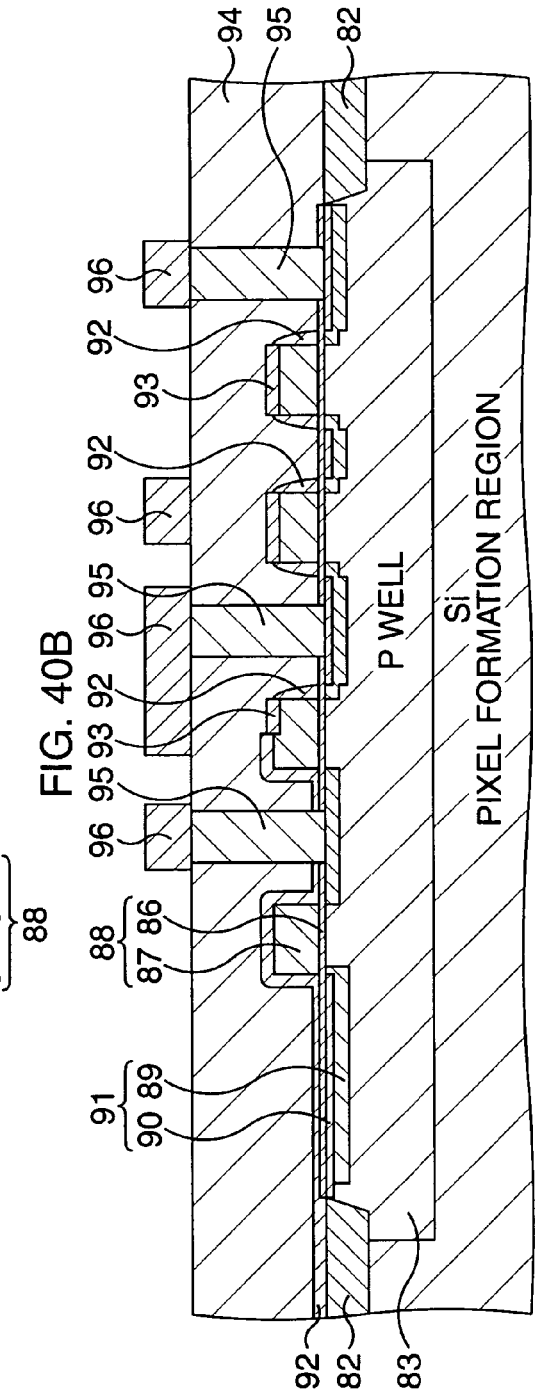

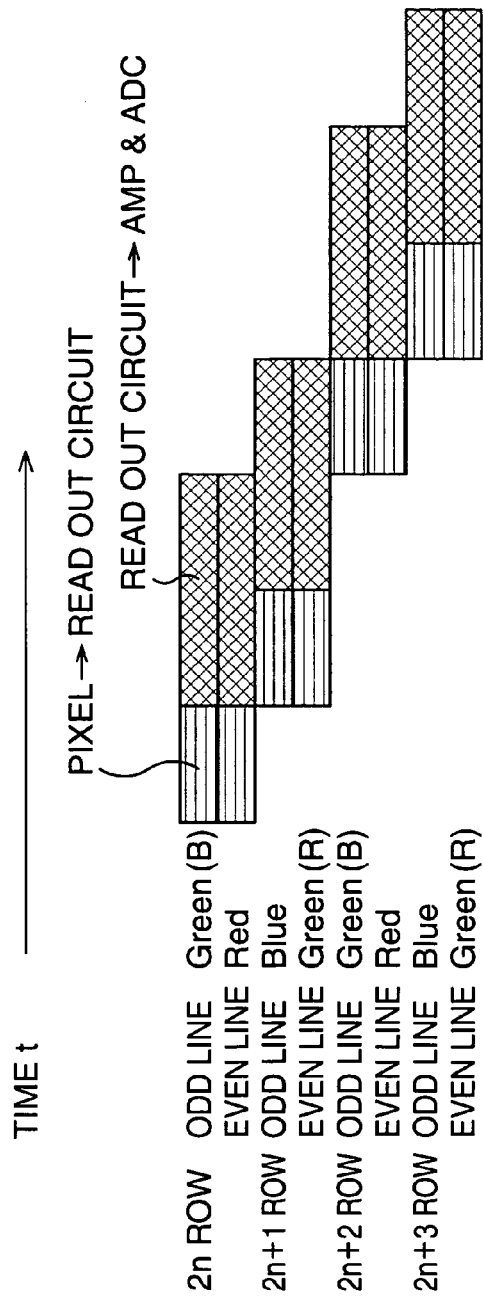

FIG. 64
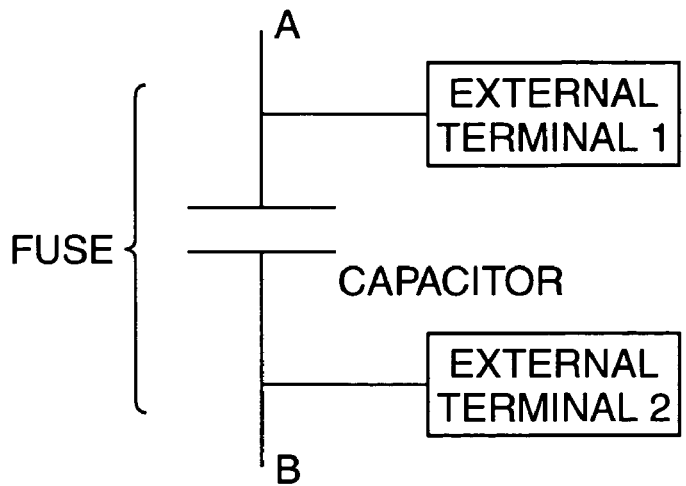
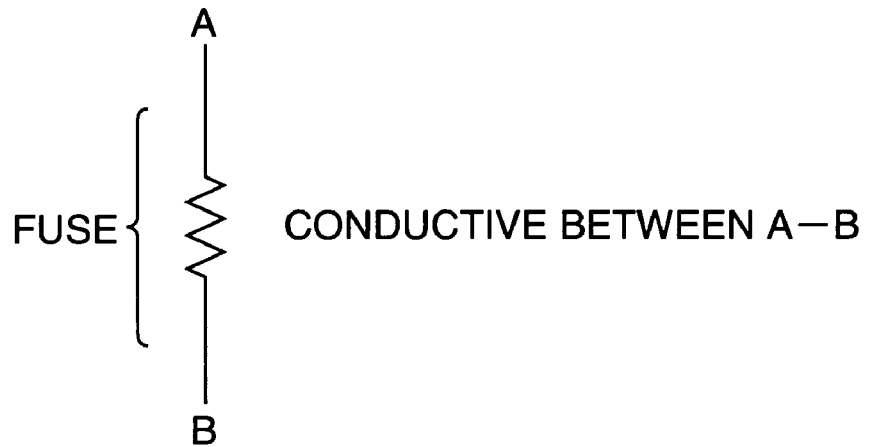

# SEMICONDUCTOR DEVICE, MANUFACTURING PROCESS THEREOF AND IMAGING DEVICE This application is a continuation of international application PCT/JP03/03316 filed on Mar. 19, 2003.

TECHNICAL FIELD

The present invention relates to a semiconductor device including a pixel region in which a pixel is formed and a storage element region in which a storage element for storing output signals from the pixel is formed being packaged together, a manufacturing process thereof and an imaging device.

BACKGROUND ART

In the case where a CMOS image sensor and a DRAM for temporarily storing image data are packaged on one chip, when a stack type capacitor is used for DRAM cell, a bulk interlayer film from a substrate to a lowermost wiring formed in the upper layer on the stack type capacitor is formed too thick, the entire chip also is accordingly formed too thick. Therefore, if a microlens formed on the surface of the chip is not configured satisfactorily thin, focal length is hardly ensured in accordance with the thickness of the chip. As a result, the light is focused at a point before the substrate.

If sufficient light is not converged to a photodiode, the CMOS image sensor reduces the sensitivity. As shown in FIG. 65, when the inter-layer film is too thick, the light is hardly converged on the surface of the substrate through a microlens. Particularly, when the pixel size is reduced, the above tendency appears considerably.

The present invention has been proposed in view of the above problem. An object of the invention is to provide a semiconductor device capable of preventing the sensitivity from decreasing due to the light irradiated through a microlens being focused at a point in front of a pixel, a manufacturing process thereof and an imaging device.

SUMMARY OF THE INVENTION

As a result of intensive examination, the inventor of the present invention has reached an aspect of the invention as described below.

The present invention is a semiconductor device including a pixel region wherein one or more pixels are formed and a storage element region wherein one or more storage elements for storing output signals from the pixels are formed. The present invention is characterized in that the layers constituting the pixel region and the storage element region are formed in the same process.

BRIEF DESCRIPTION OF THE DRAWINGS

FIG. 2A and FIG. 2B are, continuous with FIG. 1A and FIG. 1B, sectional views each schematically showing the manufacturing method of the CMOS image sensor packaged with the DRAM in accordance with the first embodiment of the present invention in the processing sequence.

FIG. 4A and FIG. 4B are, continuous with FIG. 3A and FIG. 3B, sectional views each schematically showing the manufacturing method of the CMOS image sensor packaged with the DRAM in accordance with the first embodiment of the present invention in the processing sequence.

FIG. 5A and FIG. 5B are, continuous with FIG. 4A and FIG. 4B, sectional views each schematically showing the manufacturing method of the CMOS image sensor packaged with the DRAM in accordance with the first embodiment of the present invention in the processing sequence.

FIG. 6A and FIG. 6B are, continuous with FIG. 5A and FIG. 5B, sectional views each schematically showing the manufacturing method of the CMOS image sensor packaged with the DRAM in accordance with the first embodiment of the present invention in the processing sequence.

FIG. 9A and FIG. 9B are, continuous with FIG. 8A and FIG. 8B, sectional views each schematically showing the manufacturing method of the CMOS image sensor packaged with the DRAM in accordance with the first embodiment of the present invention in the processing sequence.

FIG. 11A and FIG. 11B are, continuous with FIG. 10A and FIG. 10B, sectional views each schematically showing the manufacturing method of the CMOS image sensor packaged with the DRAM in accordance with the first embodiment of the present invention in the processing sequence.

FIG. 12A and FIG. 12B are, continuous with FIG. 11A and FIG. 11B, sectional views each schematically showing the manufacturing method of the CMOS image sensor packaged with the DRAM in accordance with the first embodiment of the present invention in the processing sequence.

FIG. 23A and FIG. 23B are, continuous with FIG. 22A and FIG. 22B, sectional views each schematically showing the manufacturing method of the CMOS image sensor packaged with the DRAM in accordance with the second embodiment of the present invention in the processing sequence.

FIG. 24A and FIG. 24B are, continuous with FIG. 23A and FIG. 23B, sectional views each schematically showing the manufacturing method of the CMOS image sensor packaged with the DRAM in accordance with the second embodiment of the present invention in the processing sequence.

FIG. 25A and FIG. 25B are, continuous with FIG. 24A and FIG. 24B, sectional views each schematically showing the manufacturing method of the CMOS image sensor packaged with the DRAM in accordance with the second embodiment of the present invention in the processing sequence.

FIG. 26A and FIG. 26B are, continuous with FIG. 25A and FIG. 25B, sectional views each schematically showing the manufacturing method of the CMOS image sensor packaged with the DRAM in accordance with the second embodiment of the present invention in the processing sequence.

FIG. 28A and FIG. 28B are, continuous with FIG. 27A and FIG. 27B, sectional views each schematically showing the manufacturing method of the CMOS image sensor packaged with the DRAM in accordance with the second embodiment of the present invention in the processing sequence.

FIG. 35A and FIG. 35B are, continuous with FIG. 34A and FIG. 34B, sectional views each schematically showing the manufacturing method of the CMOS image sensor packaged with the flash memory in accordance with the third embodiment of the present invention in the processing sequence.

FIG. 38A and FIG. 38B are, continuous with FIG. 37A and FIG. 37B, sectional views each schematically showing the manufacturing method of the CMOS image sensor packaged with the flash memory in accordance with the third embodiment of the present invention in the processing sequence.

FIG. 39A and FIG. 39B are, continuous with FIG. 38A and FIG. 38B, sectional views each schematically showing the manufacturing method of the CMOS image sensor packaged with the flash memory in accordance with the third embodiment of the present invention in the processing sequence.

FIG. 40A and FIG. 40B are, continuous with FIG. 39A and FIG. 39B, sectional views each schematically showing the manufacturing method of the CMOS image sensor packaged with the flash memory in accordance with the third embodiment of the present invention in the processing sequence.

FIG. 59A and FIG. 59B are diagrams each schematically showing the read out operation of voltage signals.

FIG. 64 is a diagram showing an example of another configuration of a fuse applicable to the semiconductor device according to one embodiment of the present invention.

DETAILED DESCRIPTION OF THE PREFERRED EMBODIMENTS

Hereinafter, preferred embodiments to which the present invention is applied will be described in detail with reference to the accompanying drawings.

First Embodiment

First of all, a manufacturing process of a CMOS image sensor packaged with DRAM according to a first embodiment of the present invention will be described with reference to FIG. 1 to FIG. 15. In FIG. 1A to FIG. 12B, a manufacturing process of a DRAM cell formation region and a pixel formation region in the CMOS image sensor packaged with DRAM will be shown together.

Figure 1A:
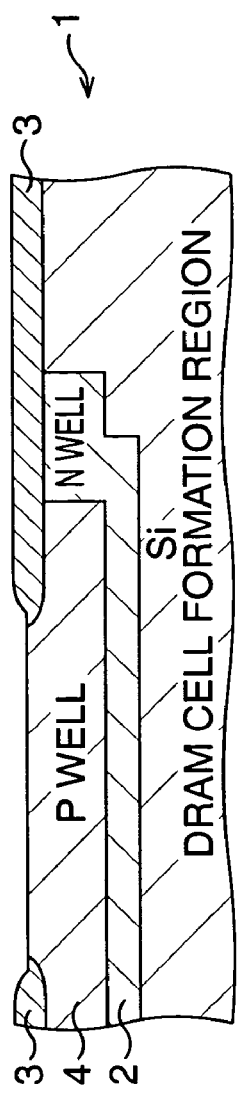
FIG. 1A and FIG. 1B are sectional views each schematically showing the manufacturing method of a CMOS image sensor packaged with a DRAM in accordance with a first embodiment of the present invention in processing sequence.

As shown in FIG. 1A, an N-type well 2 is formed selectively in a DRAM cell formation region on a P-type Si substrate 1. Here, phosphorous or arsenic is ion implanted with a high energy to form the N-type well 2 to a deep level of the P-type Si substrate 1.

Figure 1B:
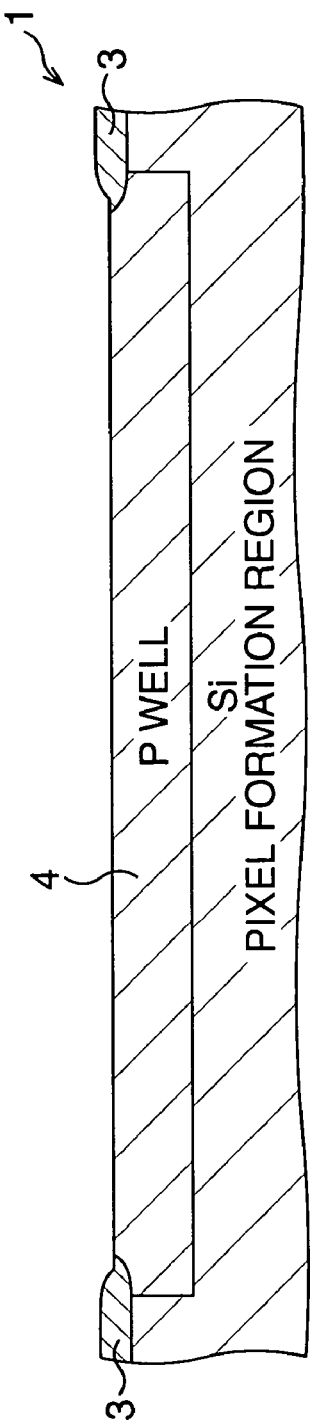

Then, as shown in FIG. 1A and FIG. 1B, a field oxide film 3 is formed by means of LOCOS, to define each of the element active regions such as a DRAM cell formation region, a pixel formation region and a periphery logic circuit formation region. Then, a P-type well 4 is formed to a shallow level in these elements active regions.

Then, as shown in FIG. 2A and FIG. 2B, a gate oxide film 5 of approximately 5 nm in film thickness is formed over the entire surface and a resist pattern 6, which coats the DRAM cell formation region only, is formed. The gate oxide film 5, which is formed in the region other than the DRAM cell formation region, is removed by means of wet etching using hydrofluoric acid as a chemical.

Figure 3A:
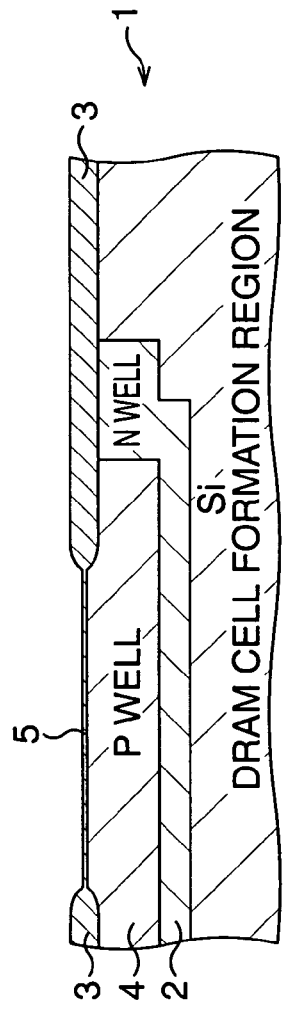
FIG. 3A and FIG. 3B are, continuous with FIG. 2A and FIG. 2B, sectional views each schematically showing the manufacturing method of the CMOS image sensor packaged with the DRAM in accordance with the first embodiment of the present invention in the processing sequence.
Figure 3B:
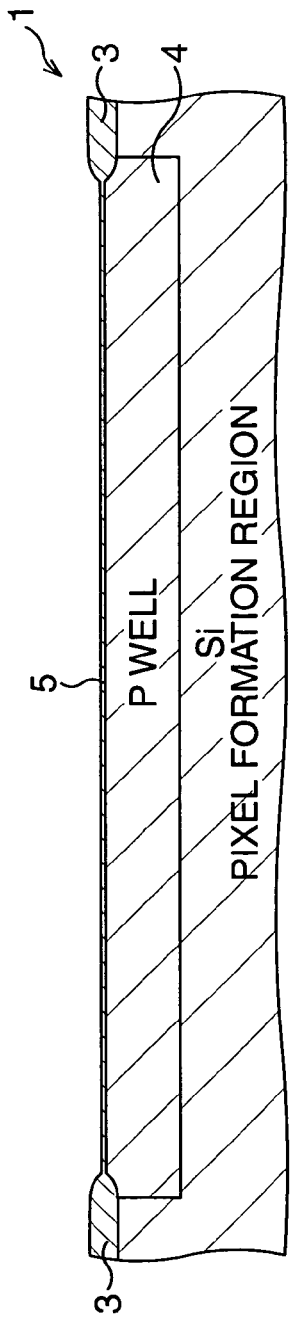

Then, as shown in FIG. 3A and FIG. 3B, the resist pattern 6 is removed by means of incineration process. Further, the gate oxide film 5 of approximately of 5 nm in film thickness is formed over the entire surface. Owing to this, the gate insulation film 5 of approximately 8 nm in film thickness is formed in the DRAM cell formation region; and the gate insulation film 5 of approximately 5 nm in film thickness is formed in the pixel formation region and the periphery logic circuit formation region.

Then, a polysilicon film 7 of approximately 180 nm in film thickness is formed by means of CVD, and a resist pattern, which opens above the pixel formation region and the periphery logic circuit formation region, is formed; and then, phosphorous is ion implanted under the conditions of 10 keV to 30 keV, $3 \times 10^{15}/cm^2$ to $6 \times 10^{15}/cm^2$.

Then, a silicon nitride film 8 is formed as anti-reflection film over the entire surface by means of plasma CVD, and the silicon nitride film 8 and the polysilicon film 7 are subjected to a patterning by means of photo lithography process, and then, etching process. Thereby, as shown in FIG. 4A and FIG. 4B, a gate electrode 9 is formed on the substrate 1.

Then, a resist pattern, which opens above the photo diode formation region within the pixel formation region, is formed, and phosphor is ion implanted under the conditions of 30 keV to 300 keV and $1 \times 10^{12}/cm^2$ to $1 \times 10^{13}/cm^2$. Owing to this, as shown in FIG. 5B, an N-type diffusion layer 10 is formed to a deep level of the substrate in the photo diode formation region. Then, boron is ion implanted under the conditions of 7 keV and approximately $1 \times 10^{13}/cm^2$ to form a P-type diffusion layer 11 as photodiode surface shield layer in the surface portion of the substrate in the photo diode formation region. Thus, a photodiode (PD) 12 is formed within the pixel formation region.

Then, a resist pattern, which opens above the DRAM cell formation region and the pixel formation region excluding the photodiode portion, is formed, and phosphorous is ion implanted under the conditions of approximately 20 keV and $2 \times 10^{13}/cm^2$. Thereby, as shown in FIG. 6A and FIG. 6B, an N-type diffusion layer 13 is formed in a shallow level of the substrate in the DRAM cell formation region and the pixel formation region.

Then, a resist pattern, which opens above the periphery logic circuit formation region only, is formed, and arsenic is ion implanted under the conditions of approximately 10 keV and $6 \times 10^{13}/cm^2$. Thereby, an N-type diffusion layer is formed in a shallow level of the substrate in the periphery logic circuit formation region.

Owing to this, it is possible to reduce the junction leak between the transfer transistor (TR-Tr) and the reset transistor (RST-Tr), which will be formed later in the pixel formation region, compared to the transistor formed in the periphery logic circuit formation region, to a small level.

Here, the ion implantation to the DRAM cell formation region and the pixel formation region is carried out prior to the ion implantation to the periphery logic circuit formation region. However, the order is not particularly limited to the above. The ion implantation process to the periphery logic circuit formation region may be carried out first.

Then, an HTO (High Temperature Oxide) film of approximately 80 nm in film thickness is formed over the entire surface. Then, a resist pattern, which coats region from the photodiode portion in the pixel formation region to the upper surface of a part of the gate electrode in the reset transistor portion, and the element active region of the DRAM cell formation region, is formed, and the HTO film is subjected to anisotropic dry etching.

Figure 7A:
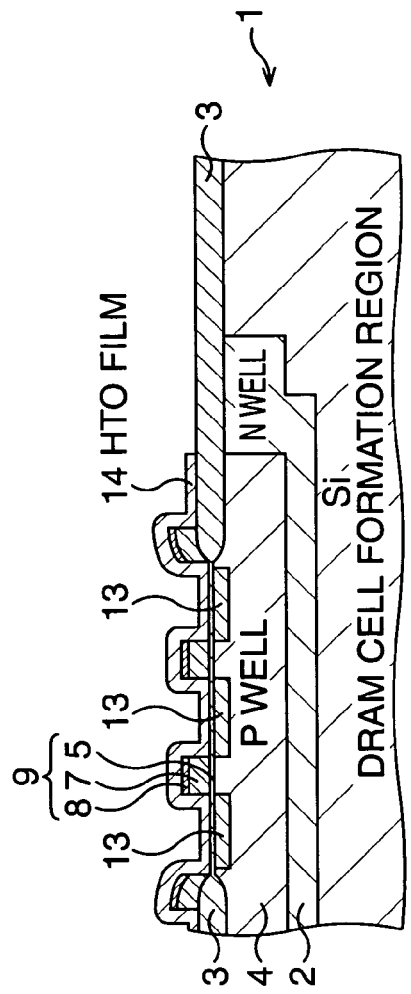
FIG. 7A and FIG. 7B are, continuous with FIG. 6A and FIG. 6B, sectional views each schematically showing the manufacturing method of the CMOS image sensor packaged with the DRAM in accordance with the first embodiment of the present invention in the processing sequence.
Figure 7B:
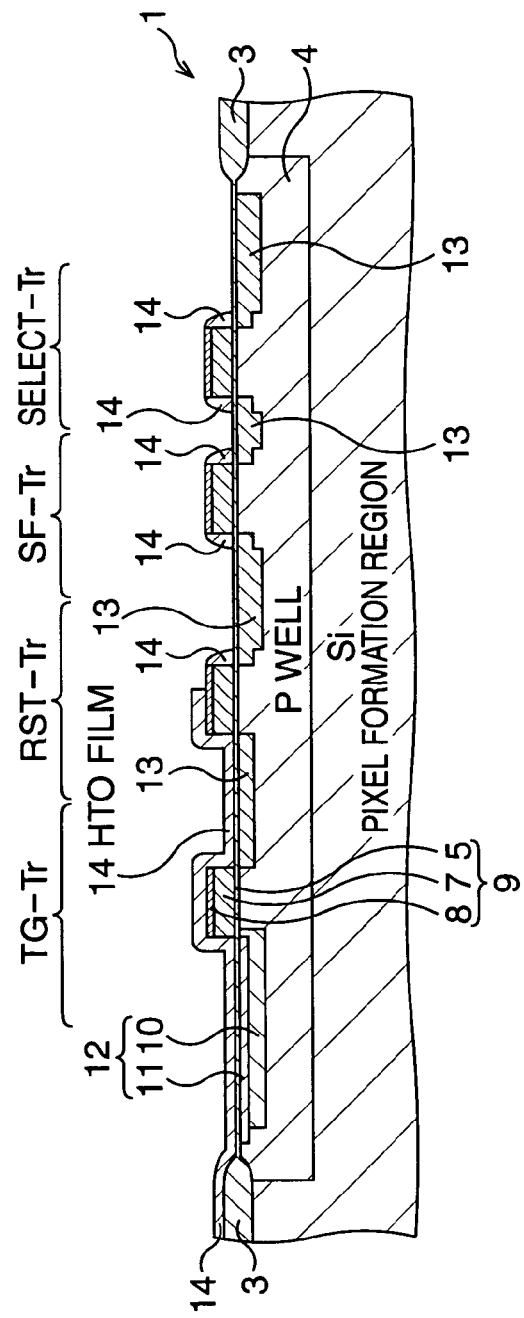

Owing to this, as shown in FIG. 7A and FIG. 7B, on the element active region in the DRAM cell formation region, the HTO film is left. On one side wall of the gate electrode of the reset transistor (RST-Tr) in the pixel formation region, on both the side walls of the gate electrode of the source follower transistor (SF-Tr), and on both the side walls of the gate electrode in the select transistor (Select-Tr) portion, side walls 14 are formed.

Then, a silicon oxide film of approximately 5 nm in film thickness is formed over the entire surface by means of thermal oxidation treatment, and anti-reflection film SiN8 on the gate electrode is removed by means of phosphoric acid treatment. A resist pattern, which opens above the pixel formation region and the periphery logic circuit formation region, is formed, and arsenic is ion implanted under the conditions of approximately 40 keV and $2 \times 10^{15}/cm^2$. Owing to this, in addition to the N-type diffusion layer in the periphery logic circuit formation region, the N-type diffusion layer of the portion in the pixel formation region which is not coated by the HTO film is formed as an LDD structure.

Figure 8A:
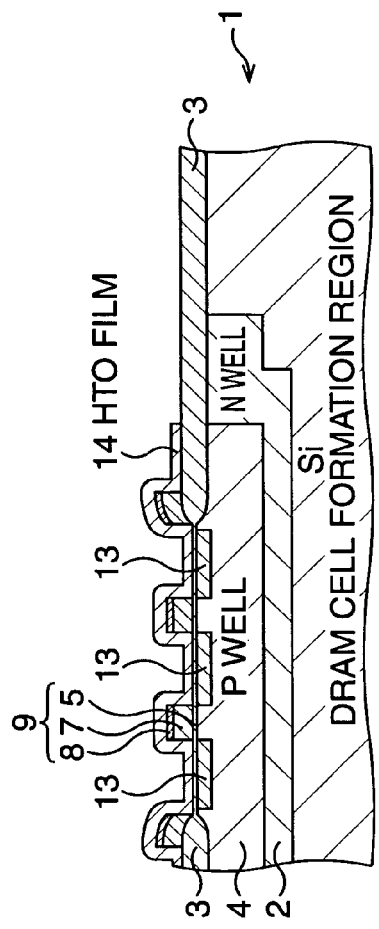
FIG. 8A and FIG. 8B are, continuous with FIG. 7A and FIG. 7B, sectional views each schematically showing the manufacturing method of the CMOS image sensor packaged with the DRAM in accordance with the first embodiment of the present invention in the processing sequence.
Figure 8B:
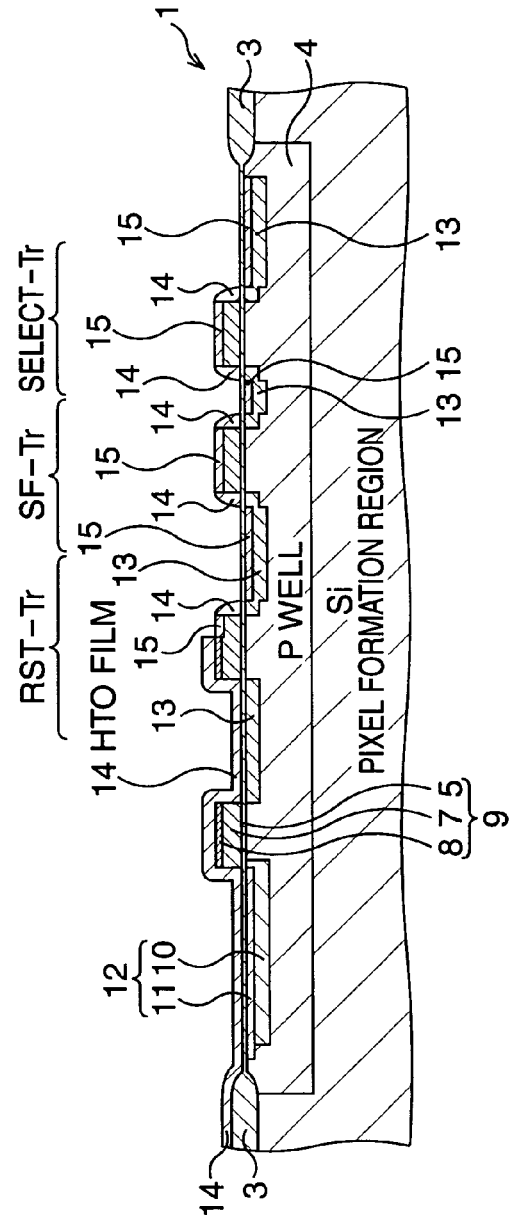

Then, after removing the silicon oxide film of approximately 5 nm in film thickness by means of wet etching treatment using hydrofluoric acid as a chemical, a Co film is formed over the entire surface by means of sputtering. Then, RTA treatment is carried out at approximately 500° C. on the impurity diffusion layer exposed in the pixel formation region and the periphery logic circuit formation region to turn the layer into a silicide to form a $CoSi_2$ film 15. Here, as shown in FIG. 8A and FIG. 8B, in the region from the photodiode portion 12 to the upper surface of a part of the gate electrode of the reset transistor in the pixel formation region and the element active region of the DRAM cell formation region, since the HTO film is formed, the $CoSi_2$ film 15 is not formed.

Then, as shown in FIG. 9A and FIG. 9B, a silicon-oxide-nitride film 16 of approximately 200 nm in film thickness is formed sequentially by means of plasma CVD, and a BPSG (Borophosphosilicate glass) film 17 of approximately 1 μm in film thickness is formed, and the surface thereof is flattened by means of CMP. In place of the silicon-oxide-nitride film 16, a silicon oxide film and a silicon nitride film of approximately 20 nm and 70 nm respectively in film thickness may be formed sequentially.

Then, by means of photo lithography process and the subsequent etching process, in the DRAM cell formation region, a bit line contact 18, which is an opening for connecting the bit line and the DRAM cell, is formed; and in the pixel formation region, a contact (contact of the source follower transistor is not shown) 19, which is an opening for connecting the gate electrode and the wiring in the upper layer in the floating diffusion (FD) portion and the source follower transistor, is formed respectively.

Figure 10A:
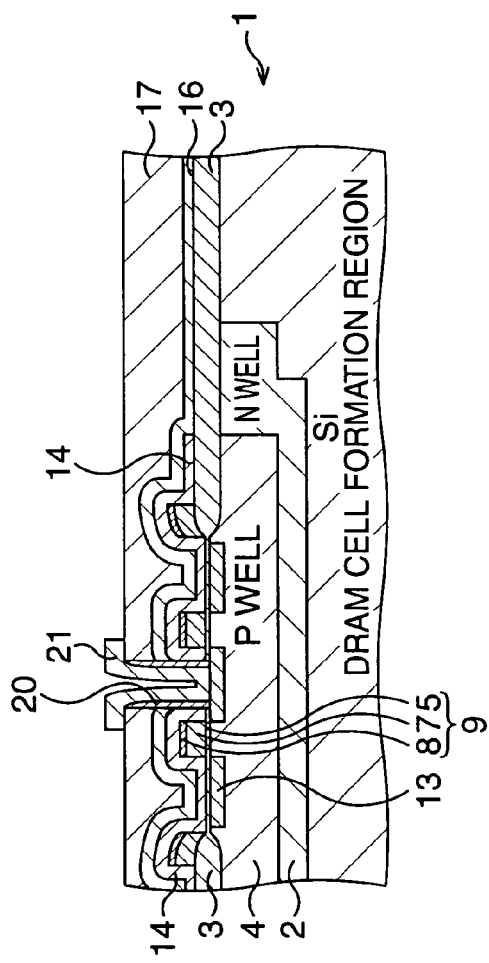
FIG. 10A and FIG. 10B are, continuous with FIG. 9A and FIG. 9B, sectional views each schematically showing the manufacturing method of the CMOS image sensor packaged with the DRAM in accordance with the first embodiment of the present invention in the processing sequence.
Figure 10B:
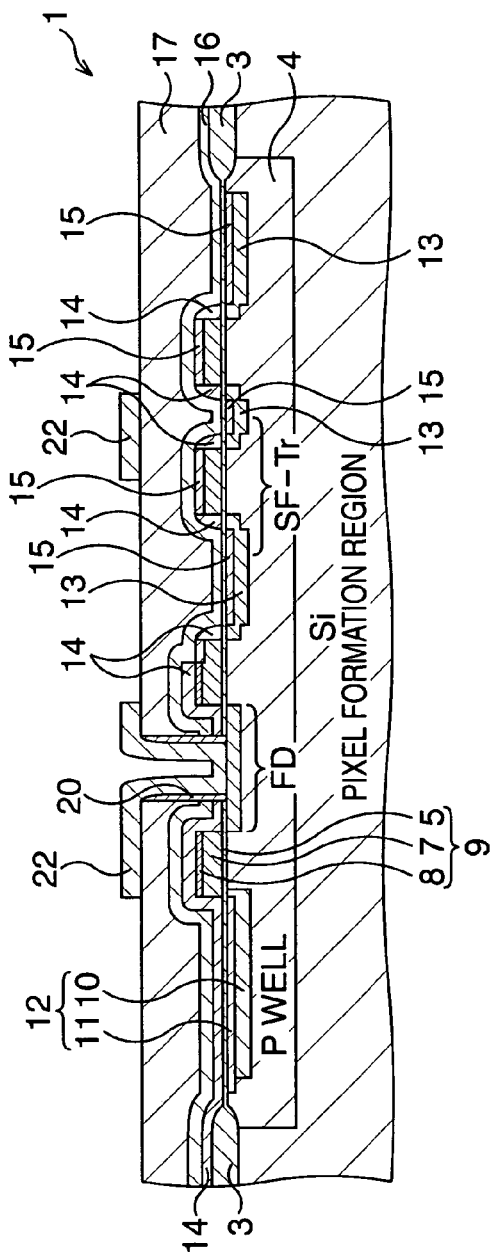

Then, as shown in FIG. 10A and FIG. 10B, a silicon oxide film or a silicon nitride film of approximately 100 nm in film thickness is deposited over the entire surface by means of plasma CVD, and by carrying out etching back, on the side walls of the bit line contact 18 and the contact 19, side walls 20 are formed.

Then, a phosphorous doped amorphous silicon film and a WSi film of approximately 50 nm and 100 nm in film thickness respectively are deposited. And by means of photo lithography process and the subsequent etching process, in the DRAM cell formation region, a bit line 21 is formed in the bit line contact 18; and in the pixel formation region, a local wiring 22 is formed in the contact 19.

Then, as shown in FIG. 11A, a BPSG film 23 of approximately 1.5 μm in film thickness is deposited over the entire surface, and flattened by polishing by means of CMP. Then, by means of photolithography process and the subsequent etching process, a storage contact 24, which is an opening for connecting the N-type diffusion layer and the storage electrode in the DRAM cell formation region, is formed.

Then, a silicon oxide film or a silicon nitride film of a approximately 100 nm in film thickness is deposited by means of CVD over the entire surface, and by carrying out etching back, a side wall 25 is formed on the side wall portion of the storage contact 24.

Then, as show in FIG. 12A, a phosphor doped amorphous silicon film of approximately 600 nm in film thickness is deposited on the entire surface, and the phosphorous doped amorphous silicon film is subjected to photo lithography process and the subsequent etching process to carry out patterning to form a storage electrode 26.

Then, by carrying out annealing treatment in a $SiH_4$ ambient, a HSG polysilicon 27 is formed on the surface of the storage electrode 26, and the surface of the storage electrode 26 is treated so as to be rough.

Owing to this, it is possible to prevent the height of the stack capacitor from increasing, and the capacity of the capacitor is ensured. Thus, it is possible to prevent the thickness of the deposit on the Si substrate 1 from increasing. Accordingly, when a DRAM of stack capacitor type is packaged together, it is possible to prevent the sensitivity of image sensor from being reduced due to miss focusing.

Then, a silicon nitride film of approximately 5 nm in film thickness is deposited over the entire surface by means of CVD, and a thermal oxidation treatment is carried out at approximately 750° C. Then, a phosphor doped amorphous silicon film of approximately 100 nm in film thickness is deposited over the entire surface. The silicon nitride film and the phosphorous doped amorphous silicon film is subjected to a patterning by means of photo lithography process and the subsequent etching process to form a cell plate electrode 28.

Figure 13:
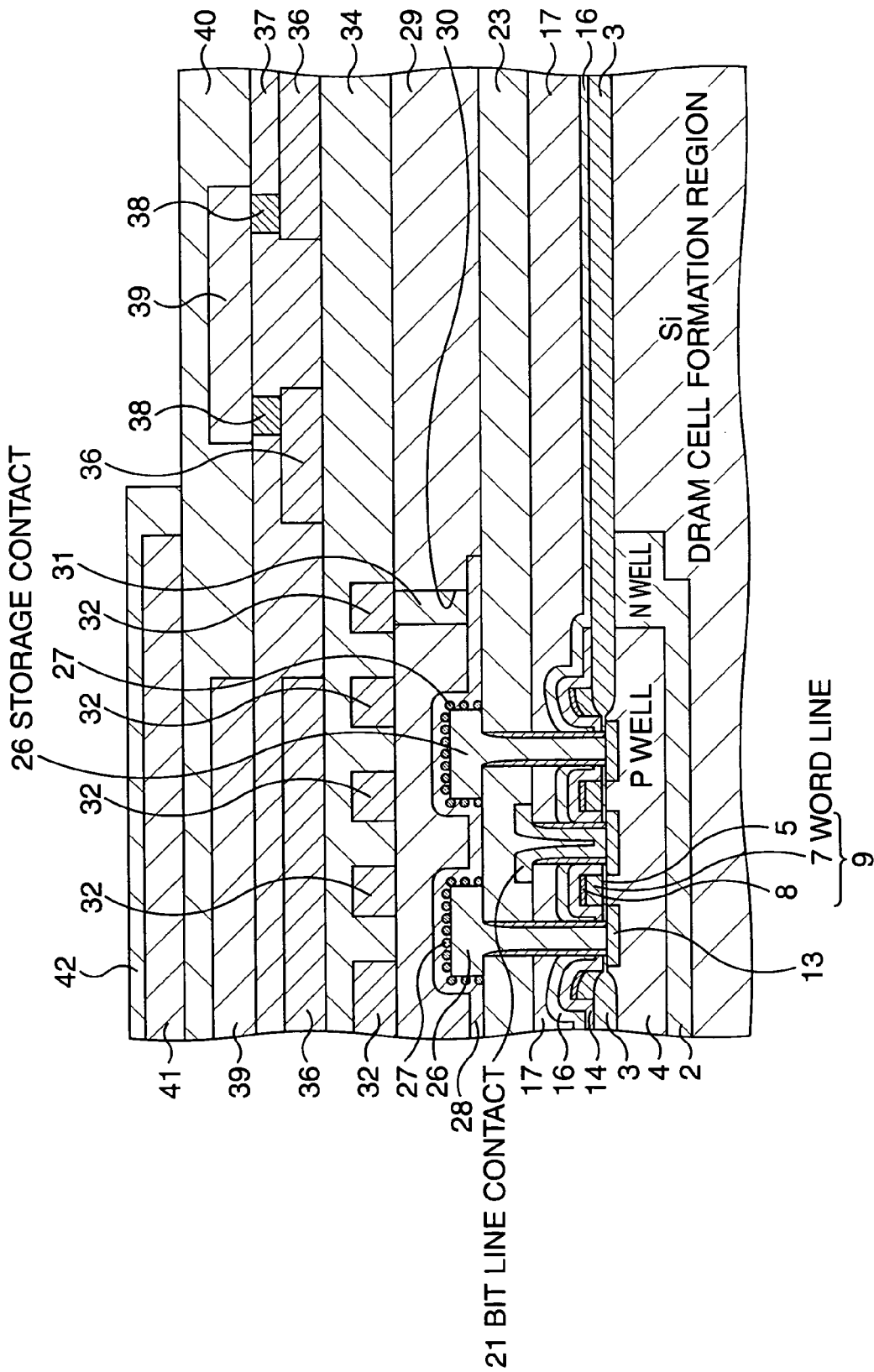
FIG. 13 is, continuous with FIG. 12A and FIG. 12B, a sectional view schematically showing the manufacturing method of the CMOS image sensor packaged with the DRAM in accordance with the first embodiment of the present invention in the processing sequence.
Figure 14:
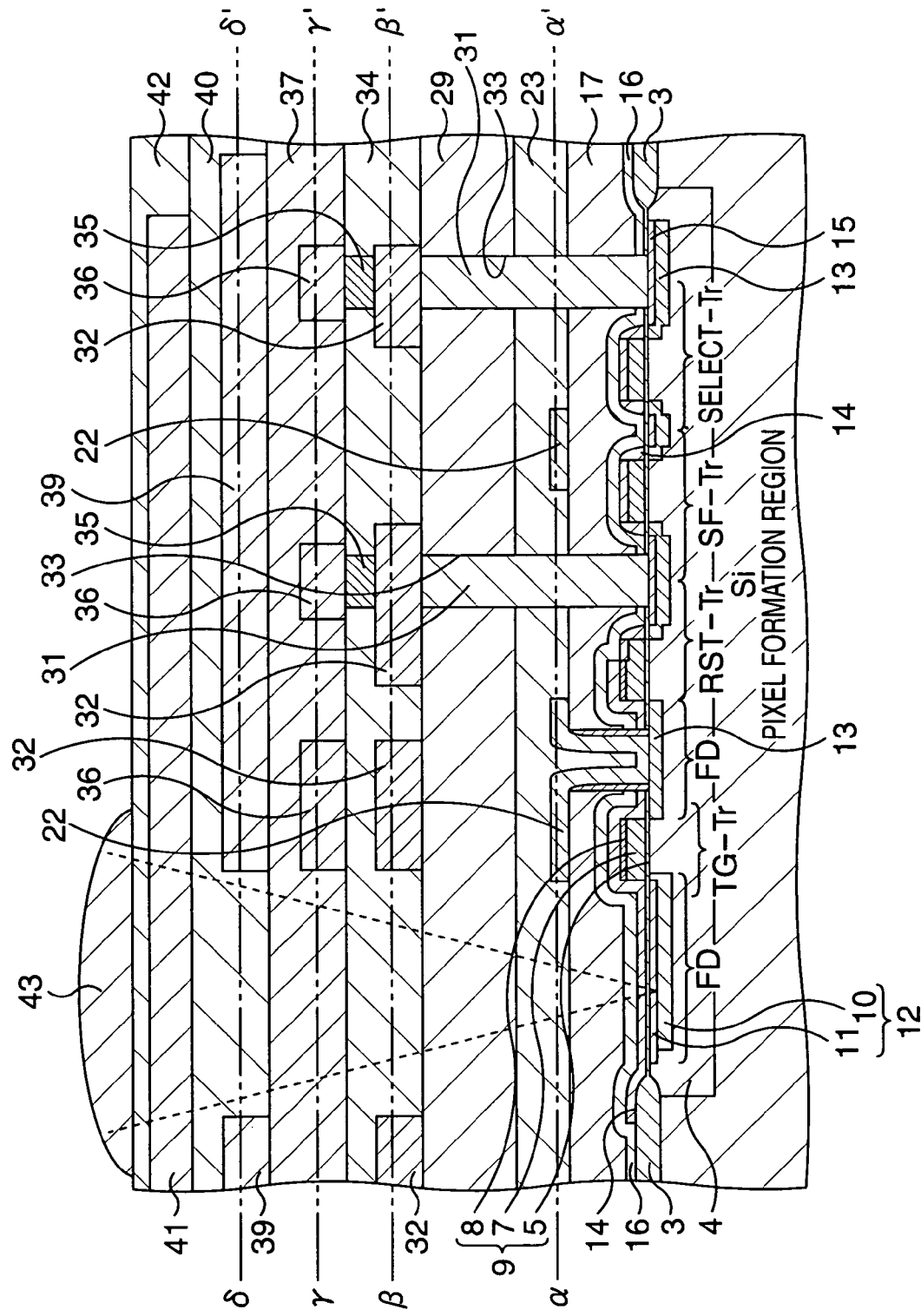
FIG. 14 is, continuous with FIG. 12A and FIG. 12B, a sectional view schematically showing the manufacturing method of the CMOS image sensor packaged with the DRAM in accordance with the first embodiment of the present invention in the processing sequence.
Figure 15:
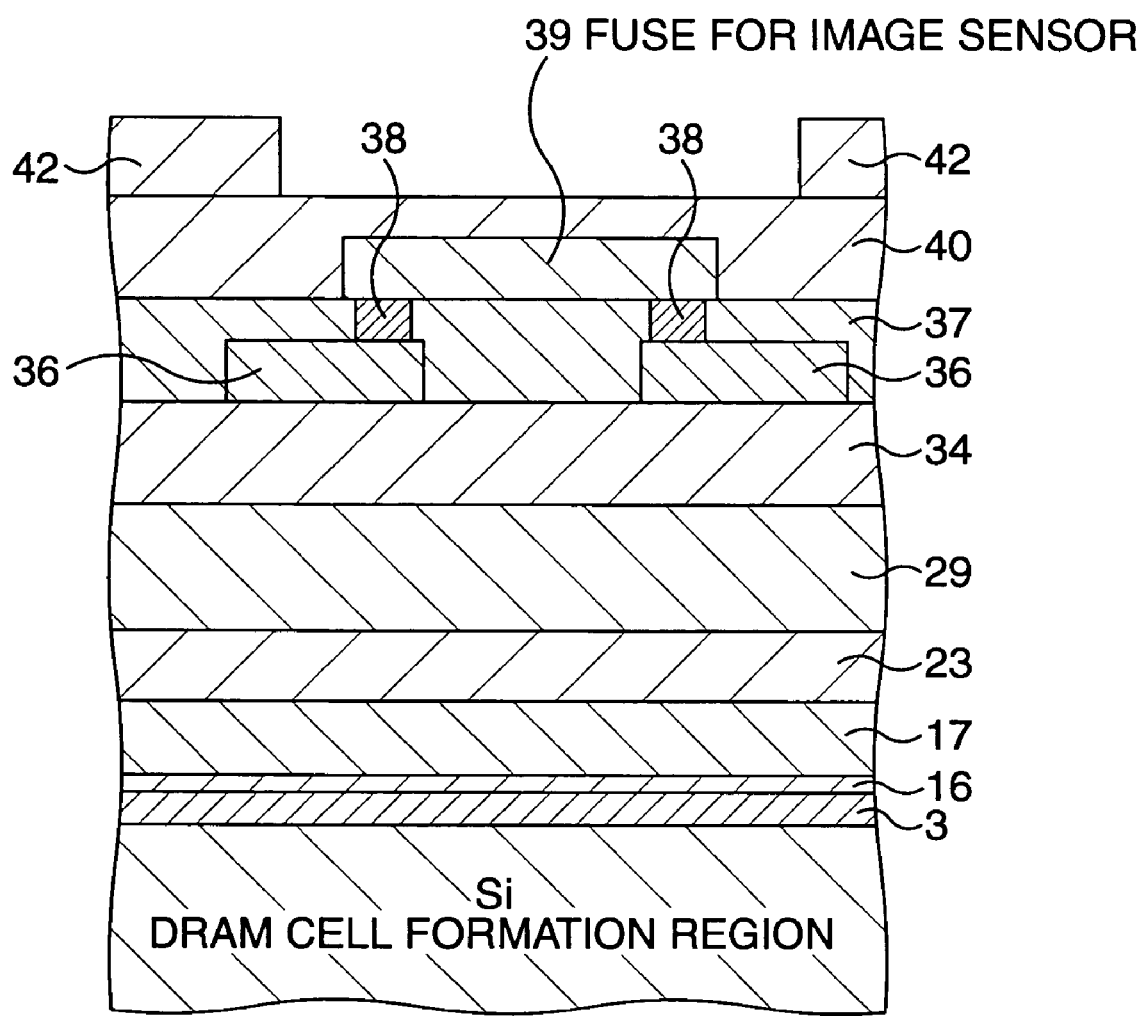
FIG. 15 is, continuous with FIG. 12A and FIG. 12B, a sectional view schematically showing the manufacturing method of the CMOS image sensor packaged with the DRAM in accordance with the first embodiment of the present invention in the processing sequence.

Then, as shown in FIG. 13 to FIG. 15, a BPSG film 29 of approximately 2 μm in film thickness is deposited over the entire surface, and the surface thereof is flattened by means of CMP. Here, FIG. 13 shows a sectional configuration of the DRAM cell formation region; FIG. 14 shows a sectional configuration of the pixel formation region; and FIG. 15 shows a sectional configuration of a fuse formation region for pixel voltage in an image sensor packaged with CMOS. In this embodiment, it is clear from the above description that the DRAM cell formation region and the pixel formation region are formed in the same process. Further the fuse formation region for pixel voltage is also formed in the same process along with the DRAM cell formation region and the pixel formation region. Hereinafter, the manufacturing process of them will be described.

Following the manufacturing process shown in FIG. 12A and FIG. 12B, by carrying out photo lithography process and the subsequent etching process, in the DRAM cell formation region, a via hole 30 for connecting a partial surface of the cell plate electrode 28 and the first metal wiring is formed; and along with the periphery logic circuit formation region, a contact hole 33 for connecting the N-type diffusion layer and the first metal wiring in the pixel formation region, is formed simultaneously. Then, the via hole 30 and the contact hole 33 are filled with tungsten (W) to form a W plug 31.

Then, a Ti film, a TiN film, an Al film, a Ti film and a TiN film are formed sequentially by means of sputtering, and the Ti film to TiN film are subjected to a patterning by means of photo lithography process and the subsequent etching process, a first metal wiring 32 is formed in the periphery logic circuit formation region, the DRAM cell formation region and the pixel formation region.

Then, after a silicon oxide film 34 is deposited over the entire surface by means of plasma CVD or bias high-density plasma CVD (HDP-CVD), and the surface thereof is flattened by means of CMP.

Then, by means of photo lithography process and the subsequent etching process, the silicon oxide film 34 is subjected to patterning until the surface of the first metal wiring 32 is exposed to form a via hole. Then, the via hole is filled with tungsten W to form W plug 35.

Furthermore, in the upper layer, a second metal wiring 36, a third metal wiring 39, a W plug 38 and interlayer insulation films 37 and 40 are formed in the DRAM cell formation region, the pixel formation region, the fuse formation region for pixel voltage and the periphery logic circuit formation region by means of like processes.

Here, in the DRAM cell formation region and the fuse formation region for pixel voltage, the third metal wiring 39 forms a DRAM power supply fuse and a pixel power supply fuse. Further, in the DRAM formation region, the third metal wiring 39 forms a light-shielding layer covering the upper region above the DRAM cell.

After forming the third metal wiring 39, a silicon oxide film 40 is deposited by means of plasma CVD or HDP-CVD, and the surface thereof is polished by means of subsequent CMP to flatten the silicon oxide film 40.

Then, after depositing a silicon nitride film (not shown) over the entire surface as the cover film by means of plasma CVD, in the pad formation region (not shown), the silicon oxide film 40 and the silicon nitride film are subjected to patterning by means of photo lithography process and the subsequent etching process; thereby the third metal wiring surface is exposed, and an electrode pad is formed.

Then, a color filter 41 is formed above the DRAM cell and above the pixel formation region. Here, as the color filter 41 formed above the DRAM cell, a black light shielding layer is used. Then, after forming a protection film 42 coating the color filter 41, a microlens 43 is formed in a position on the protection film 42 above the photodiode 12.

As described above, in the CMOS image sensor packaged with DRAM according to this embodiment, in order to make it possible to cut off the fuse by means of laser irradiation or the like, the color filter and the microlens are formed at positions avoiding the positions above the fuse.

In a test step of the DRAM section, a defective bit is determined, and the fuse of the corresponding cell is cut off by means of laser irradiation. Also, the fuse formed in the image sensor is provided for adjusting the voltage generated within a chip such as reset voltage. By cutting off the fuse by means of laser irradiation, it is possible to fine adjust the reset voltage or the like.

Figure 18:
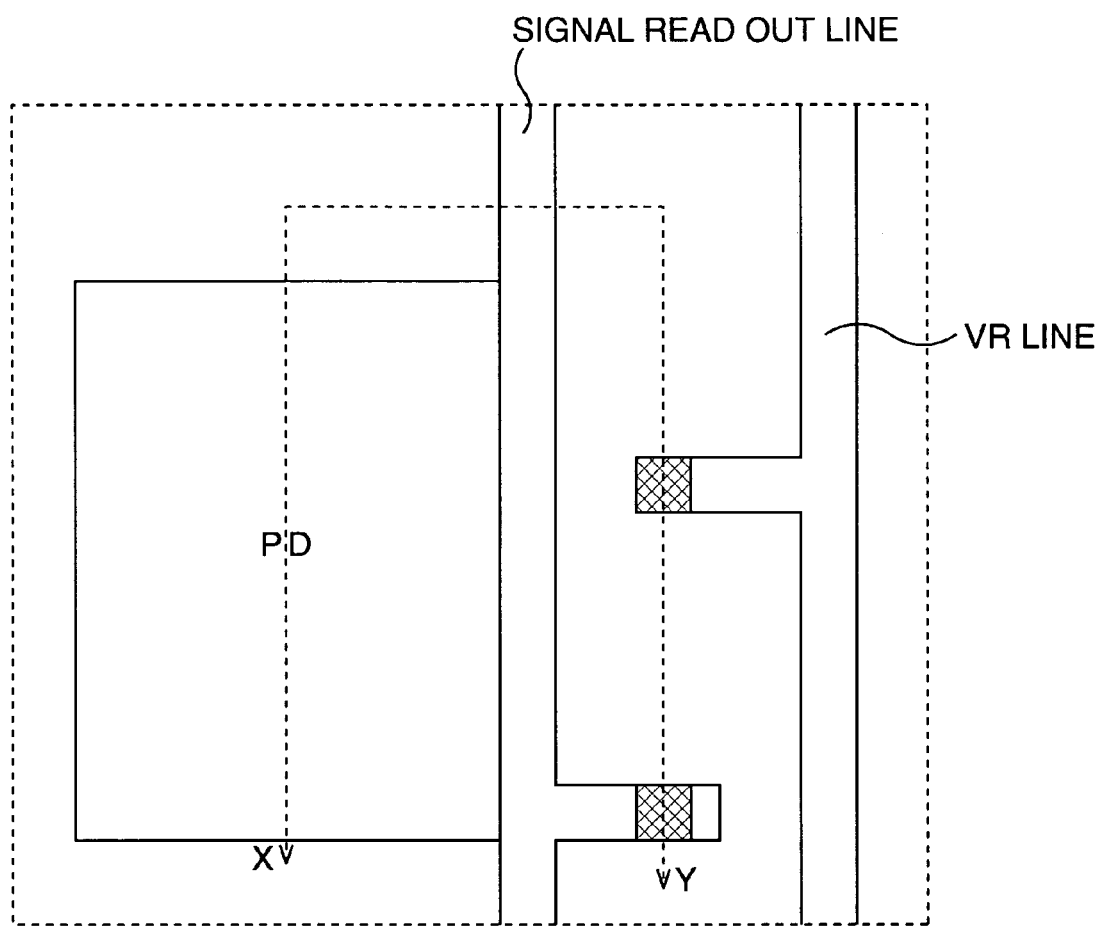
FIG. 18 is a plane configuration diagram of a pixel formation region in the CMOS image sensor packaged with the DRAM in accordance with the first embodiment of the present invention.
Figure 19:
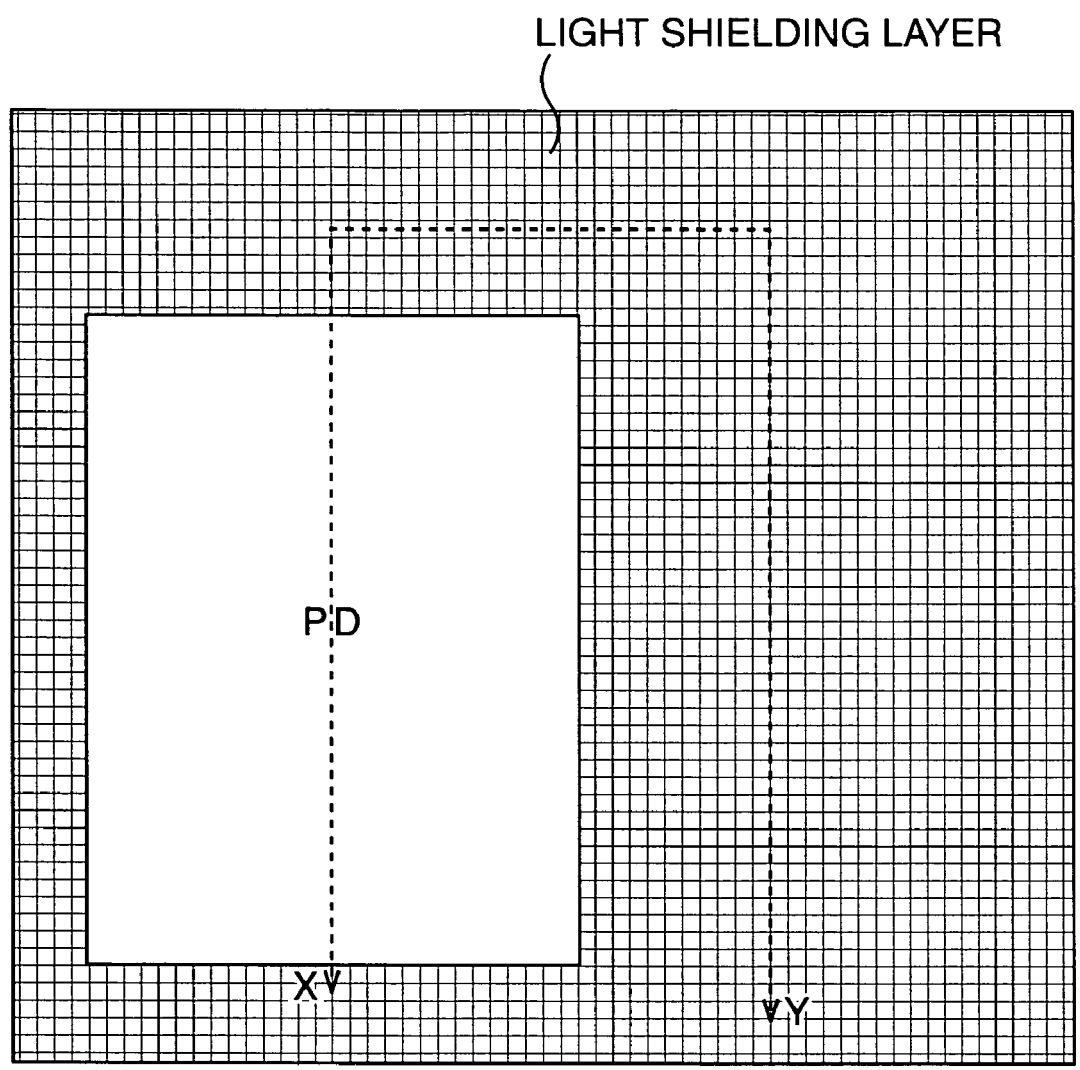
FIG. 19 is a plane configuration diagram of a pixel formation region in the CMOS image sensor packaged with the DRAM in accordance with the first embodiment of the present invention.
Figure 20:
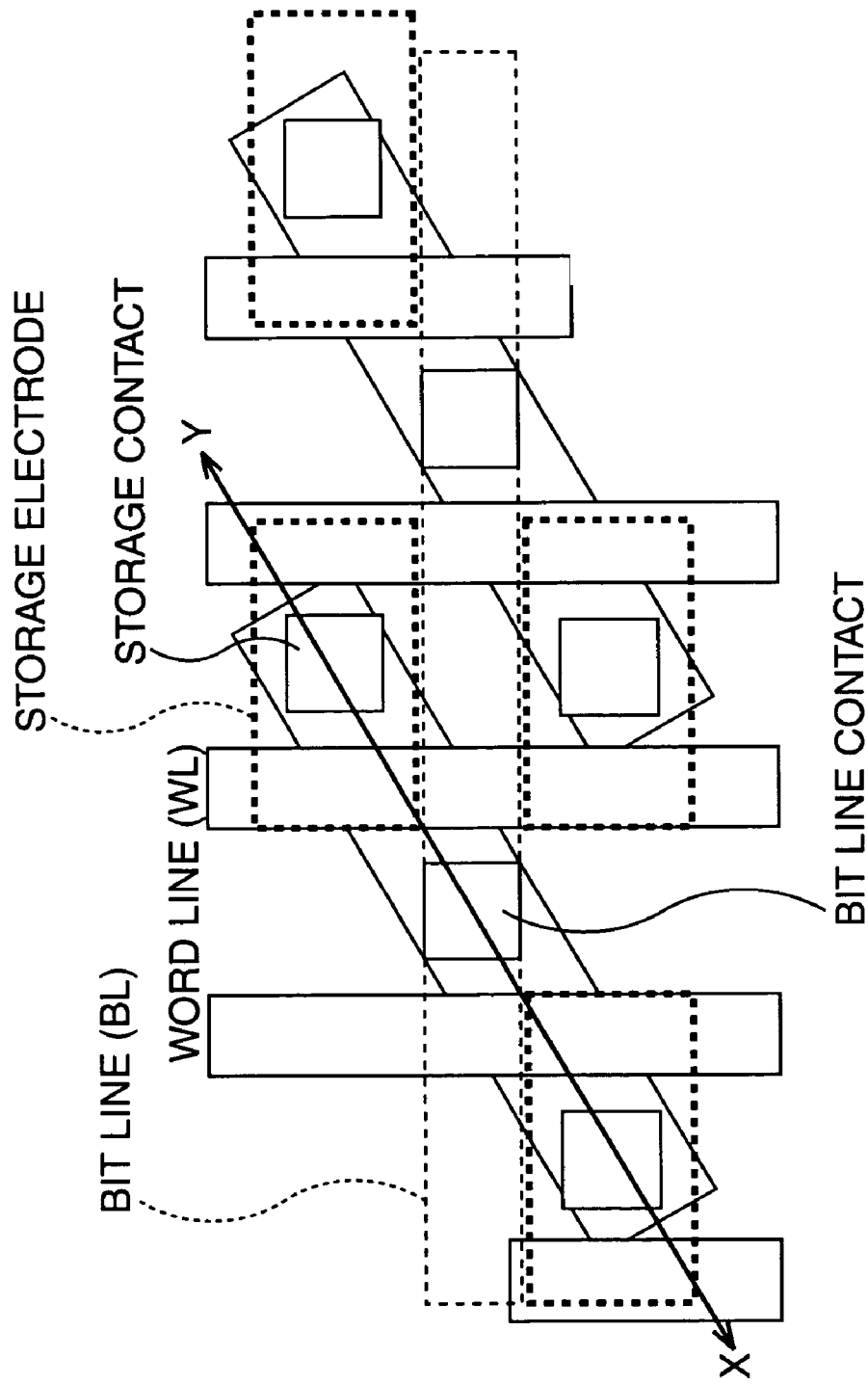
FIG. 20 is a plane configuration diagram of a stack type DRAM applied to the CMOS image sensor packaged with the DRAM in accordance with the first embodiment of the present invention.

FIG. 16 to FIG. 19 are plane configuration diagrams each showing a pixel formation region of the CMOS image sensor packaged with DRAM according to this embodiment. FIG. 20 is a plane configuration diagram of a stack capacitor type DRAM applied to the CMOS image sensor packaged with DRAM in this embodiment. Line X-Y in FIG. 16 to FIG. 20, is the line along which the section in FIG. 14 is taken; the meshed portions in the figures indicate connection portions between the via hole or contact hole and the metal wiring.

Figure 16:
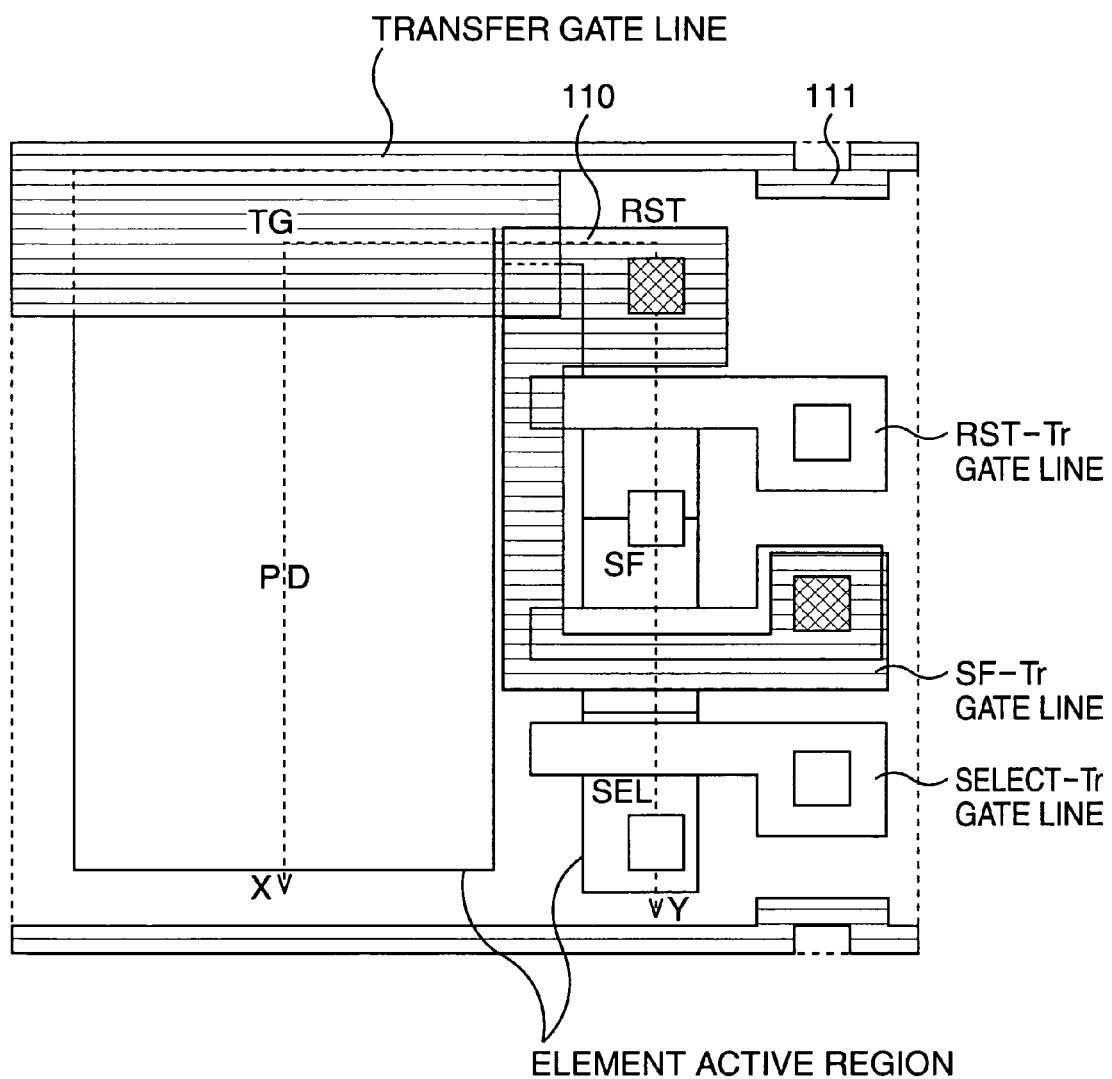
FIG. 16 is a plane configuration diagram of a pixel formation region in the CMOS image sensor packaged with the DRAM in accordance with the first embodiment of the present invention.
Figure 17:
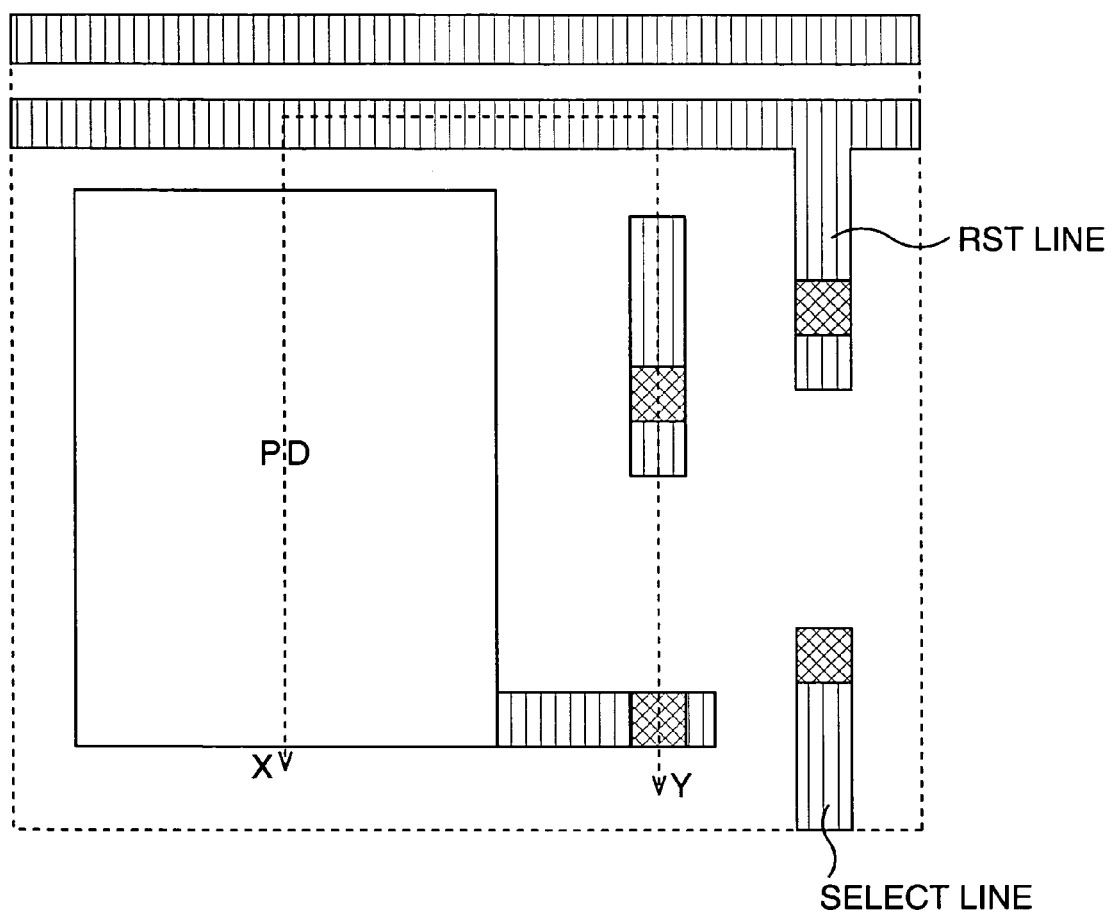
FIG. 17 is a plane configuration diagram of a pixel formation region in the CMOS image sensor packaged with the DRAM in accordance with the first embodiment of the present invention.

FIG. 16 shows a plane configuration along the line α-α' in FIG. 14. FIG. 17 shows a plane configuration along the line β-β' in FIG. 14. FIG. 18 shows a plane configuration along the line γ-γ' in FIG. 14. FIG. 19 shows a plane configuration along the line δ-δ' in FIG. 14. In the CMOS image sensor packaged with DRAM according to this embodiment, as shown in FIG. 16, a wiring 110 for connecting the reset transistor and the source follower transistor is formed of the same material in the same layer as that of the bit line in the DRAM cell.

On the other hand, in the configuration of an ordinary 4-transistor type pixel, the wiring for connecting the reset transistor and the source follower transistor is formed using a first metal wiring within the layer shown in FIG. 14. Accordingly, compared to the ordinary 4-transistor type pixel, the 4-transistor type pixel according to this embodiment does not require a third metal wiring for forming the 4-transistor type pixel. Accordingly, in the image sensor packaged with DRAM in this embodiment, as a layer for light shielding only of the pixel formation region excluding the photodiode portion, the third metal wiring can be used.

Further, a transfer gate line 111 is also formed of the same material (lamination structure of the polysilicon and the W silicide) in the same layer as that of the bit line of the DRAM cell. When filming in a manner of batch shutter operation, since the transfer gate line can be taken by only one operation for full column as a batch, and so high a speed is not required. Accordingly, owing to the batch shutter operation, the polysilicon and W silicide lamination structure can be used for transfer gate line of the 4-transistor type pixel.

Second Embodiment

Next, referring to FIG. 21A to FIG. 31, a manufacturing process of the CMOS image sensor packaged with DRAM according to a second embodiment of the present invention will be described. In each of FIG. 21A to FIG. 28B, the manufacturing process of both of the DRAM cell formation region and the pixel formation region in the CMOS image sensor packaged with DRAM will be shown.

First of all, same as the example shown in FIG. 1A and FIG. 1B, an N-type well is formed selectively in a P-type Si substrate 47 in a DRAM cell formation region. Phosphorous or arsenic is ion implanted with a high energy to form an N-type well 48 to a deep level of the Si substrate 47.

Figure 21A:
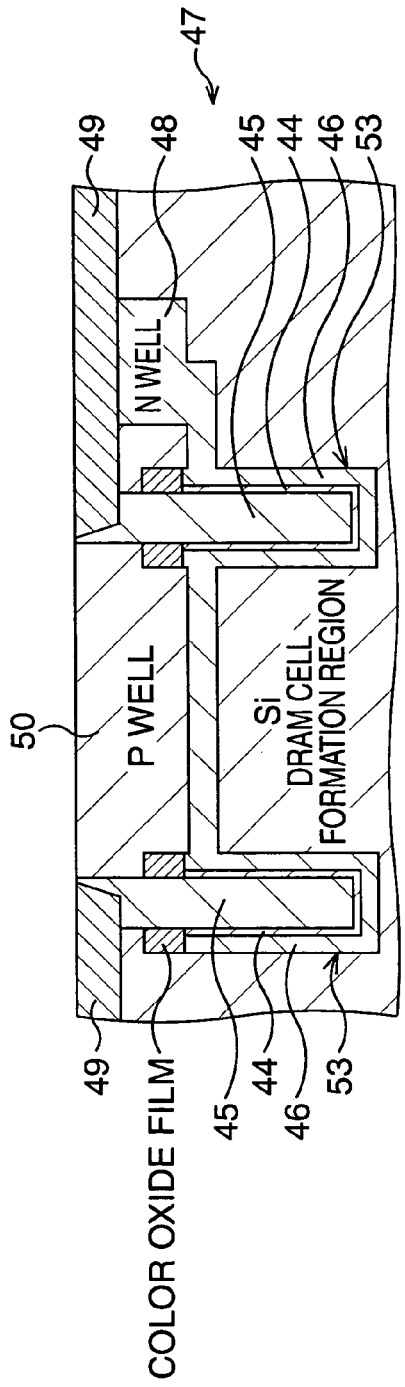
FIG. 21A and FIG. 21B are sectional views each schematically showing the manufacturing method of a CMOS image sensor packaged with a DRAM in accordance with a second embodiment of the present invention in the processing sequence.
Figure 21B:
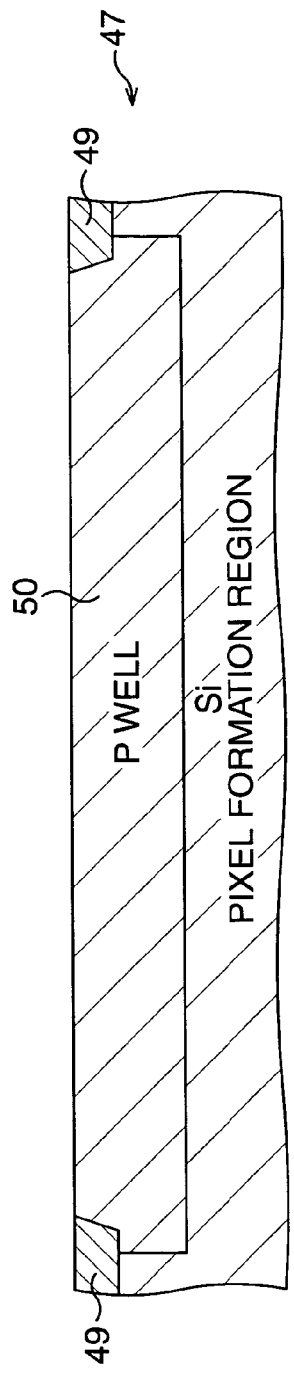

Then, as shown in FIG. 21A, a trench capacitor of a substrate cell plate type is formed. The forming method of the trench capacitor is disclosed in, for example, "43rd Semiconductor Specialist Course Lectures". A trench capacitor 53 is formed of a color oxide film, a SiN film 44, a polysilicon film 45 and a cell plate and the like. In the lower portion of the trench capacitor 53, an N-type diffusion layer 46, in which phosphor or arsenic is diffused into the substrate from the trench capacitor 53, is formed, and is connected to the N well 48 to form a cell plate. After forming the trench capacitor, the Si substrate is subjected to patterning to form a groove for STI, and a silicon oxide film is deposited in the groove, and the surface thereof is polished by means of CMP, and thus an STI (Shallow Trench Isolation) 49 is formed.

Figure 22A:
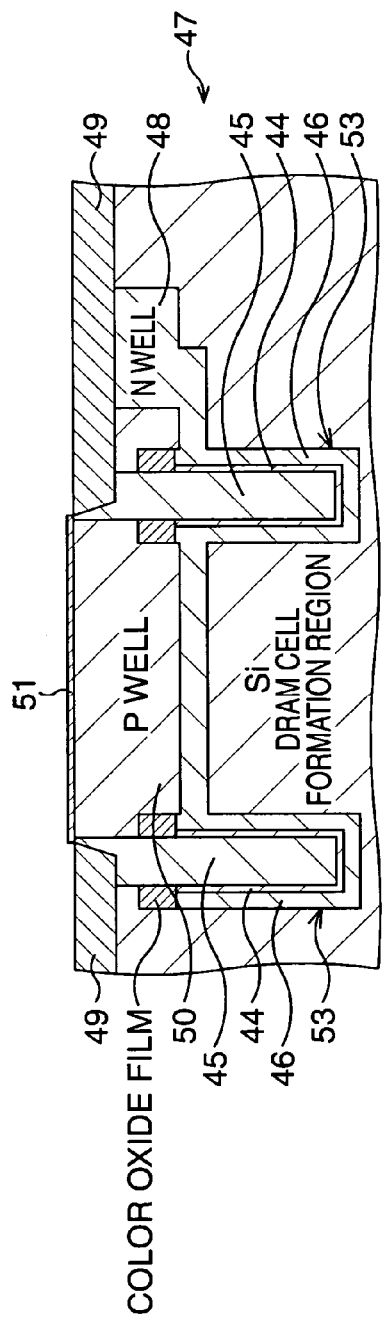
FIG. 22A and FIG. 22B are, continuous with FIG. 21A and FIG. 21B, sectional views each schematically showing the manufacturing method of the CMOS image sensor packaged with the DRAM in accordance with the second embodiment of the present invention in the processing sequence.
Figure 22B:
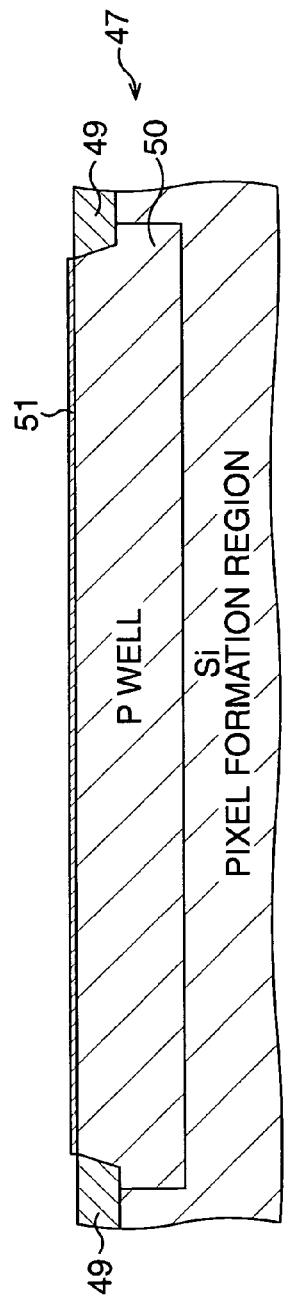

Then, as shown in FIG. 22A and FIG. 22B, on the entire surface, a gate oxide film 51 of approximately 5 nm in film thickness is formed. After forming a resist pattern, which covers the DRAM cell formation region only, a wet etching using hydrofluoric acid as a chemical is carried out to remove the gate oxide film 51 formed in the region other than the DRAM cell formation region.

Then, the photoresist is removed by means of incineration process, and the gate oxide film 51 of approximately 5 nm in film thickness is formed. Owing to this, in the DRAM cell formation region, the gate oxide film 51 of approximately 8 nm in film thickness is formed; and in the pixel formation region and the periphery logic circuit formation region, the gate oxide film 51 of approximately 5 nm in film thickness is formed respectively.

Then, a phosphorous doped amorphous silicon film, a WSi film and a silicon oxide film of approximately 50 nm, 150 nm, 200 nm respectively in film thickness are deposited. By means of photolithography process and the subsequent etching process, as shown in FIG. 23A and FIG. 23B, a gate electrodes 52 are formed on the P-type Si substrate 47.

Then, a resist pattern, which opens above the photo diode formation region in the pixel formation region, is formed. And phosphorous is ion implanted under the conditions of 30 keV to 300 keV and $1 \times 10^{12}/cm^2$ to $1 \times 10^{13}/cm^2$. Owing to this, as shown in FIG. 24B, in the photo diode formation region, an N-type diffusion layer 54 is formed to a deep level of the substrate 47. Then, boron is ion implanted under the conditions of approximately 7 keV and $1 \times 10^{13}/cm^2$ to form a P-type diffusion layer 55 as a photodiode surface shield layer in the surface portion of the substrate 47 in the photo diode formation region. Thus, in the pixel formation region, a photodiode 56 is formed.

Then, as shown in FIG. 25A and FIG. 25B, a resist pattern, which opens above the DRAM cell formation region and pixel formation region excluding the photodiode portion, is formed, and phosphorous is ion implanted under the conditions of approximately 20 keV and $2 \times 10^{13}/cm^2$. Thus, an N-type diffusion layer 57 is formed to a shallow level of the substrate in the DRAM cell formation region and the pixel formation region.

Then, a resist pattern, which opens above the periphery logic circuit formation region only, is formed, and arsenic is ion implanted under the conditions of approximately 10 keV and $6 \times 10^{13}/cm^2$. Thereby, an N-type diffusion layer is formed at a shallow level of the substrate in the periphery logic circuit formation region.

Owing to this, compared to the transistor formed in the periphery logic circuit formation region, it is possible to reduce the junction leak between the transfer transistor and the reset transistor, which are formed after the pixel formation region, to a small level.

Here, the ion implantation to the DRAM cell formation region and the pixel formation region is carried out before the ion implantation to the periphery logic circuit formation region. However, the order thereof is not particularly limited. The ion implantation process to the periphery logic circuit formation region may be carried out first.

Then, a silicon nitride film of approximately 50 nm in film thickness is formed over the entire surface. Then, a resist pattern, which covers the region from the photodiode portion to a partial upper surface of the gate electrode of the reset transistor portion in the pixel formation region and the element active region in the DRAM cell formation region, is formed. And the silicon nitride film is subjected to anisotropic dry etching.

Owing to this, as shown in FIG. 26A and FIG. 26B, a silicon nitride film is left on the element active region of the DRAM cell formation region, and on one side wall of the gate electrode in the reset transistor, on both the side walls of the gate electrode of the source follower transistor and on both the side walls of the gate electrode of the select transistor, side walls 58 are formed.

Then, a silicon oxide film of approximately 5 nm in film thickness is formed over the entire surface by means of thermal oxidation treatment. And a resist pattern, which opens above the region excluding from the photodiode to the part of upper surface of the gate electrode of the reset transistor in the pixel formation region and above the periphery logic circuit formation region, and arsenic is ion implanted under the conditions of approximately 40 keV and $2 \times 10^{15}/cm^2$. Owing to this, in addition to the N-type diffusion layer in the periphery logic circuit formation region, the N-type diffusion layer in the portion, which is not coated by the silicon nitride film in the pixel formation region, is formed as an LDD structure.

Then, after removing the silicon oxide film of approximately 5 nm in film thickness by means of wet etching treatment using hydrofluoric acid as chemical, a Co film is deposited over the entire surface by means of sputtering. Then, by carrying out RTA treatment at approximately 500° C., the impurity diffusion layer exposed in the pixel formation region and the periphery logic circuit formation region is turned into a silicide to form a $CoSi_2$ film 59. Here, as shown in FIG. 27A and FIG. 27B, in the region from the photodiode portion to the part of the upper surface of the surface gate electrode of the reset transistor in the pixel formation region, and in the element active region of the DRAM cell formation region, since the silicon nitride film is not formed, the $CoSi_2$ film 59 is not formed.

Figure 27A:
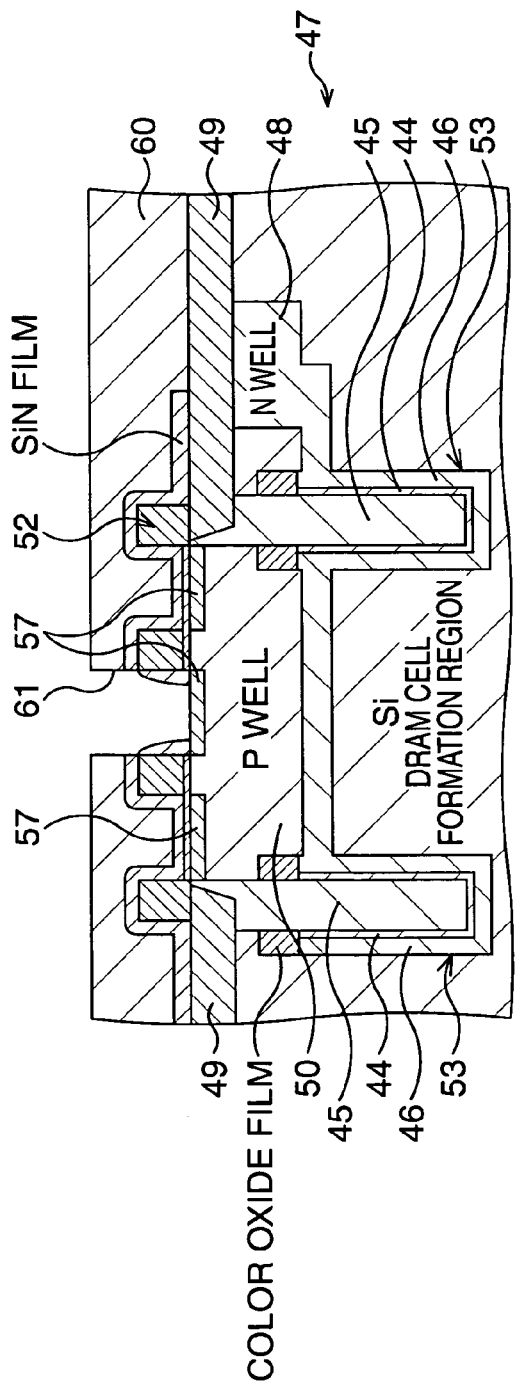
FIG. 27A and FIG. 27B are, continuous with FIG. 26A and FIG. 26B, sectional views each schematically showing the manufacturing method of the CMOS image sensor packaged with the DRAM in accordance with the second embodiment of the present invention in the processing sequence.
Figure 27B:
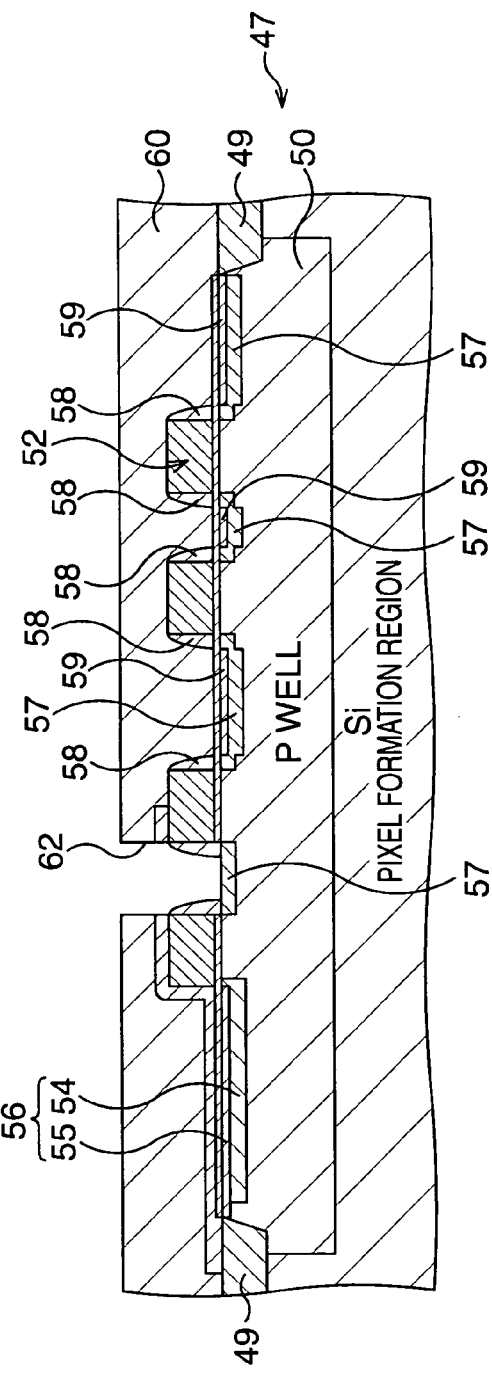

Then, as shown in FIG. 27A and FIG. 27B, after forming a silicon oxide film of approximately 50 nm in film thickness by means of plasma CVD, a BPSG (Borophosphosilicate glass) film 60 of approximately 1 μm in film thickness is further formed, and the surface thereof is flattened by means of CMP.

Then, by means of photo lithography process and the subsequent etching process, in the DRAM cell formation region, a bit line contact 61, which is an opening for connecting the bit line and the DRAM cell is formed; and in the pixel formation region, a contact (contact of the source follower transistor is not shown) 62, which is an opening for connecting the floating diffusion portion and the gate electrode of the source follower transistor and the wiring in the upper layer is formed.

The above contact hole forming process includes a first process, in which, while maintaining the select ratio with the silicon nitride film, the silicon oxide film is etched until the surface of the silicon nitride film is exposed and a second process in which the silicon nitride film is removed to open the hole.

Then, as shown in FIG. 28A and FIG. 28B, after depositing a phosphorous doped amorphous silicon film of approximately 300 nm in film thickness over the entire surface and the surface thereof is polished by means of CMP; thus, a polysilicon plug 63 is formed in the bit line contact 61 and the contact 62.

Then, a Ti film, a TiN film and a W film of approximately 20 nm, 50 nm, 100 nm respectively in film thickness are deposited in this order. Then, a rest resist pattern, which is left in the region including the polysilicon plug 63, is formed and using the resist pattern as a mask, the W film, the TiN film and the Ti film are etched. Owing to this, as shown in FIG. 28A and FIG. 28B, in the DRAM cell formation region, a bit line 64 is formed; and in the pixel formation region, a local wiring 65 for connecting the floating diffusion portion and the source follower transistor is formed.

Figure 29:
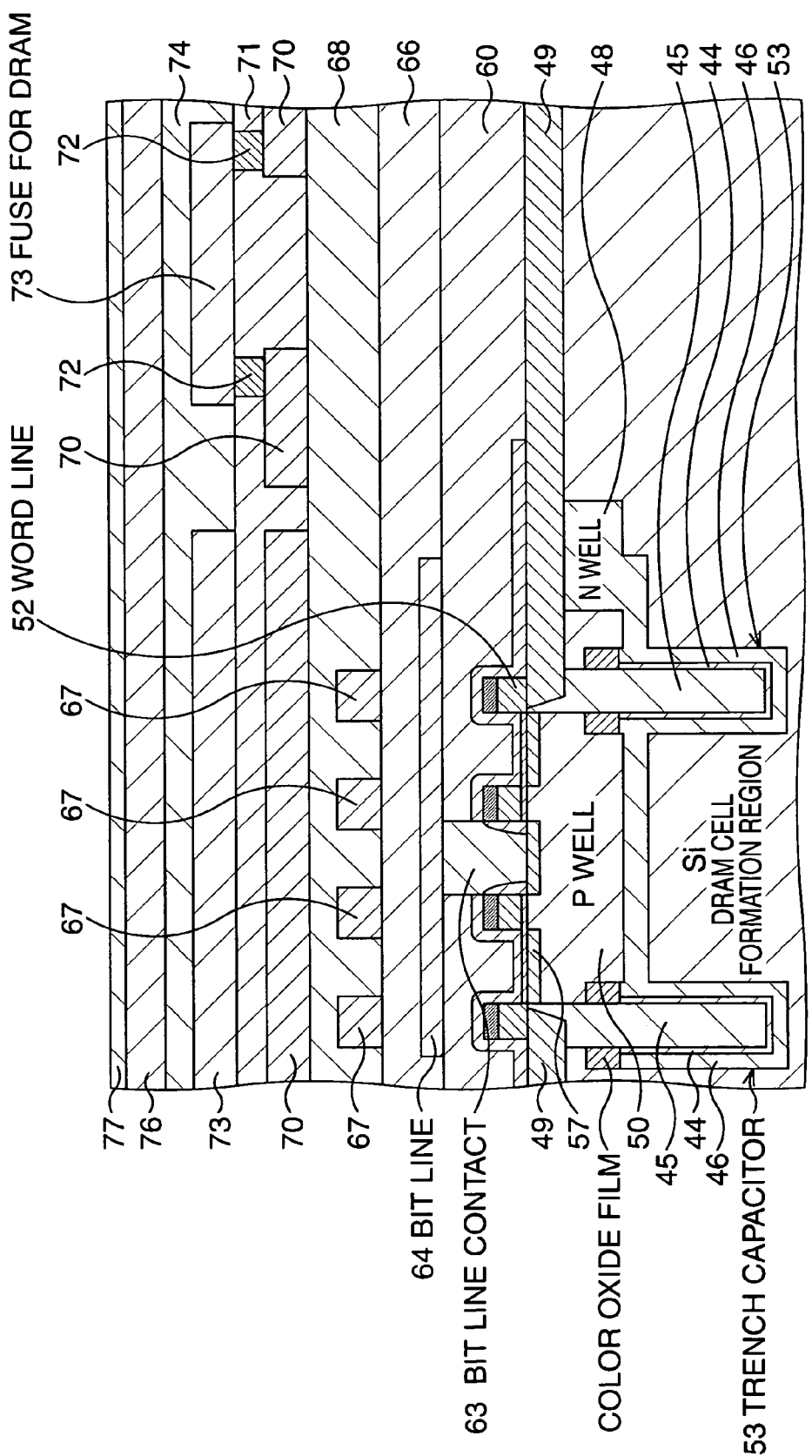
FIG. 29 is, continuous with FIG. 28A and FIG. 28B, a sectional view schematically showing the manufacturing method of the CMOS image sensor packaged with the DRAM in accordance with the second embodiment of the present invention in the processing sequence.
Figure 30:
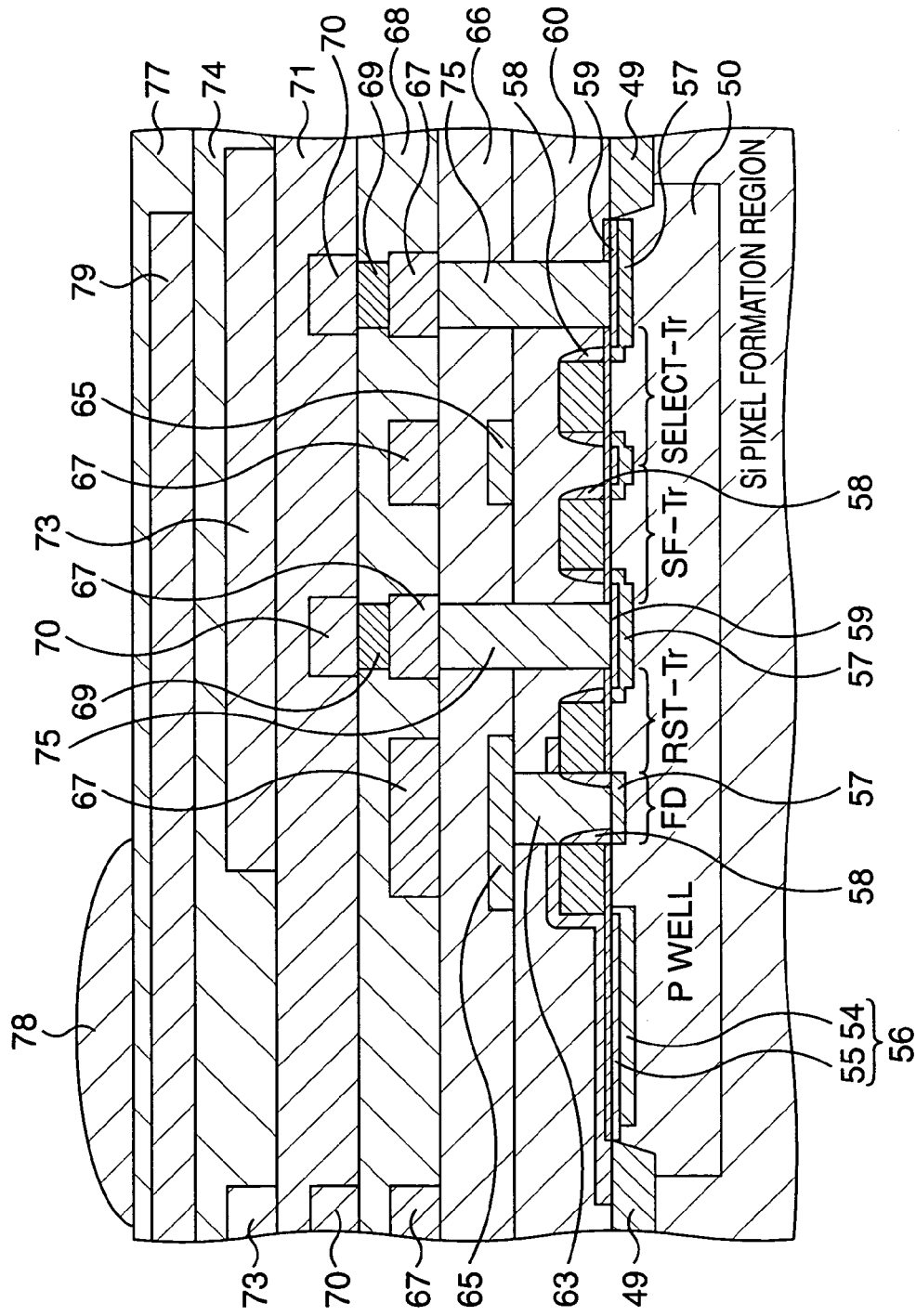
FIG. 30 is, continuous with FIG. 28A and FIG. 28B, a sectional view schematically showing the manufacturing method of the CMOS image sensor packaged with the DRAM in accordance with the second embodiment of the present invention in the processing sequence.
Figure 31:
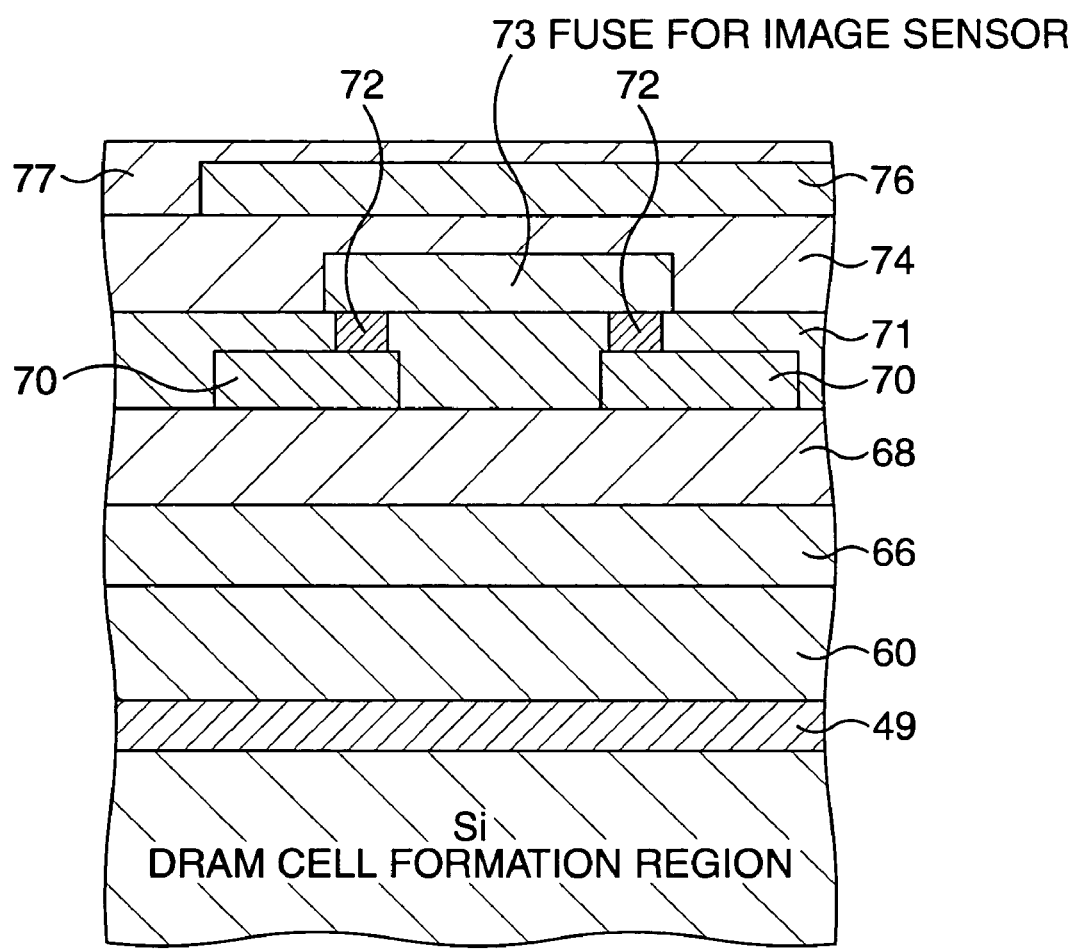
FIG. 31 is, continuous with FIG. 28A and FIG. 28B, a sectional view schematically showing the manufacturing method of the CMOS image sensor packaged with the DRAM in accordance with the second embodiment of the present invention in the processing sequence.

Then, as shown in FIG. 29 to FIG. 31, a BPSG film 66 of approximately 1 μm in film thickness is deposited, and the surface thereof is flattened by means of CMP. FIG. 29 is a sectional view showing a configuration of the DRAM cell formation region; FIG. 30 is a sectional view showing a configuration of the pixel formation region; and FIG. 31 is a sectional view showing a configuration of a fuse formation region for pixel voltage in an image sensor packaged with CMOS. In this embodiment, it is clear from the above description that the DRAM cell formation region and the pixel formation region are formed in the same process. Same as the first embodiment, the fuse formation region for pixel voltage is also formed in the same process as that of the DRAM cell formation region and the pixel formation region. Hereinafter, the manufacturing process thereof will be described.

Following the manufacturing process shown in FIG. 28A and FIG. 28B, by means of photo lithography process and the subsequent etching process, along with the periphery logic circuit formation region, a contact hole for connecting an N-type diffusion layer in the pixel formation region and a first metal wiring is formed simultaneously. Then, the contact hole is filled with tungsten W to form a W plug 75.

Then, a Ti film, a TiN film, an Al film, Ti film and a TiN film are deposited in this order by means of sputtering, the Ti film to TiN film are subjected to patterning by means of photo lithography process and the subsequent etching process, in the periphery logic circuit formation region, the DRAM cell formation region and the pixel formation region, a first metal wiring 67 is formed.

Then, by means of plasma CVD or bias high density plasma CVD (HDP-CVD), after depositing a silicon oxide film 68, the surface thereof is flattened by means of CMP.

Then, by means of photo lithography process and the subsequent etching process, the silicon oxide film 68 is subjected to patterning until the surface of the first metal wiring 67 is exposed to form a via hole. Then, the via hole is filled with tungsten W to form a W plug 69.

Subsequently, in the upper layer, a second metal wiring 70, a third metal wiring 73, a W plug 72 and interlayer insulation films 71 and 74 are formed in the DRAM cell formation region, the pixel formation region, the fuse formation region for pixel voltage and the periphery logic circuit formation region by means of the like processes.

In the DRAM cell formation region and the fuse formation region for pixel voltage, the third metal wiring 73 forms a DRAM power supply fuse and a fuse for pixel voltage. Further, in the DRAM formation region, the third metal wiring 73 forms a light-shielding layer, which covers above the trench capacitor 53.

After forming the third metal wiring 73, a silicon oxide film 74 is deposited by means of plasma CVD or HDP-CVD, and by the subsequent CMP, the surface thereof is flattened.

Then, after depositing a silicon nitride film (not shown) over the entire surface as the cover film by means of the plasma CVD, in the pad formation region (not shown), the silicon oxide film 74 and the silicon nitride film are subjected to patterning by means of photo lithography process and the subsequent etching process to expose the surface of the third metal wiring 73 to form an electrode pad.

Then, above the DRAM cell formation region and the pixel formation region, color filters 76 and 79 are formed respectively. Here, as the color filter 76 formed above the DRAM cell formation region, a black light shielding layer is used. Then, after forming a protection film 77 coating the color filters 76 and 79, a microlens 78 is formed at a position on the protection film 77 above the photodiode 56.

As for the image sensor packaged with DRAM according to the embodiment, an example of mode, in which the fuses are cut off after the test step of the DRAM and the image sensor, and then the color filter and the microlens are formed, has been shown. Accordingly, as shown FIG. 29 and FIG. 31, in the image sensor packaged with DRAM according to this embodiment, the color filter is formed so as to cover above the DRAM power supply fuse and the fuse for pixel voltage.

Figure 43:
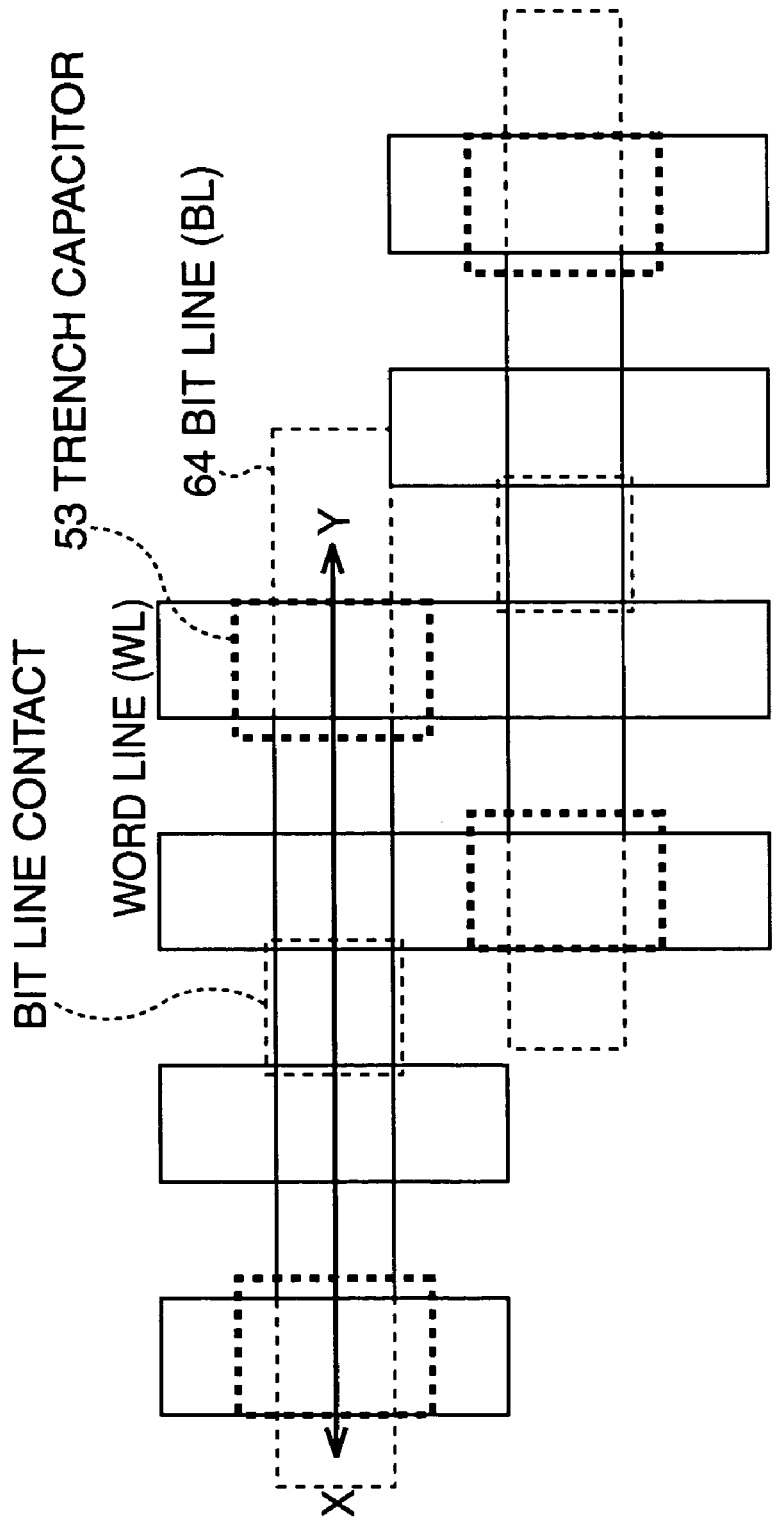
FIG. 43 is a plane configuration diagram of a trench capacitor type DRAM applied to the CMOS image sensor packaged with the DRAM according to the second embodiment of the present invention.

FIG. 43 is a plane configuration diagram of a trench capacitor-type DRAM, which is applied to the CMOS image sensor packaged with DRAM according to this embodiment. Line X-Y in FIG. 43 is a line along which the section shown in FIG. 29 is taken. The plane configuration of the pixel formation region in the CMOS image sensor packaged with DRAM according to this embodiment is the same as the examples shown in FIG. 16 to FIG. 19 excluding the floating diffusion portion, which is replaced with a SAC contact.

Third Embodiment

Next, referring to FIG. 32A to FIG. 42, a manufacturing process of a CMOS image sensor packaged with flash memory according to a third embodiment of the present invention will be described. In each of FIG. 32A to FIG. 40, the manufacturing process of both of a flash memory cell formation region and a pixel formation region in the image sensor packaged with flash memory is shown.

First of all, same as the example shown in FIG. 1A and FIG. 1B, an N-type well 81 is formed selectively on a P-type Si substrate 80 in the flash memory cell formation region. Phosphorous or arsenic is ion implanted with a high energy to form the N-type well 81 to a deep level of the Si substrate 80.

Then, an STI 82 is formed to define element active regions of the flash memory cell formation region, a pixel formation region and a periphery logic circuit formation region respectively. Then, a P-type well 83 is formed to a shallow level of the respective element active regions.

Figure 32A:
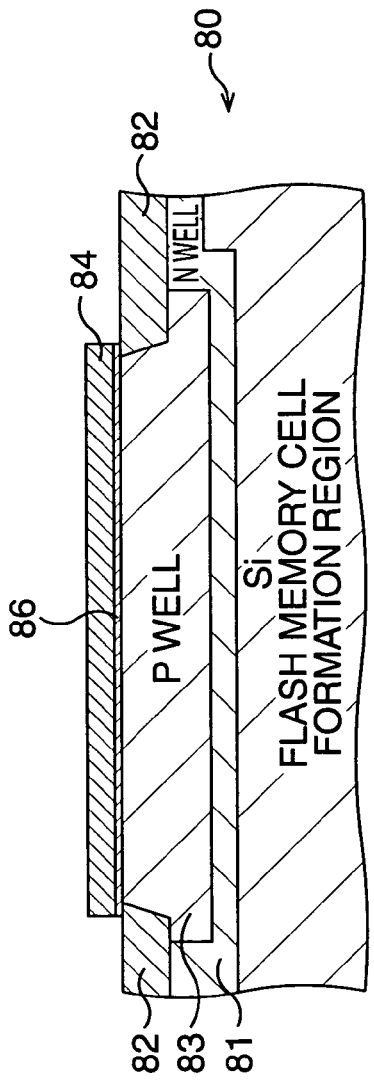
FIG. 32A and FIG. 32B are sectional views each schematically showing the manufacturing method of a CMOS image sensor packaged with a flash memory in accordance with a third embodiment of the present invention in the processing sequence.
Figure 32B:
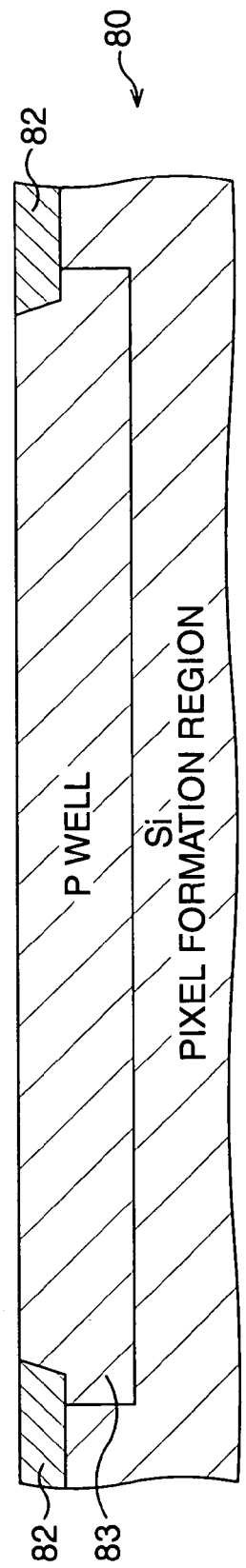

Then, by means of thermal oxidation treatment, a tunnel oxide film 86 of approximately 7 to 11 nm in film thickness is formed over the entire surface. Then, an amorphous silicon film 84 of approximately 50 to 100 nm in film thickness is deposited. By means of photolithography process and the subsequent etching process, the tunnel oxide film 83 and the amorphous silicon film 84 are removed from the region other than the flash memory cell formation region. Owing to this, as shown in FIG. 32A and FIG. 32B, in the element active region of the flash memory cell formation region, the tunnel oxide film 83 and the amorphous silicon film 84 are left.

Then, after depositing a silicon oxide film and a silicon nitride film of approximately 5 to 10 nm respectively in film thickness by means of CVD, an ONO film 85 is formed over the entire surface by means of thermal oxidation treatment.

Figure 33A:
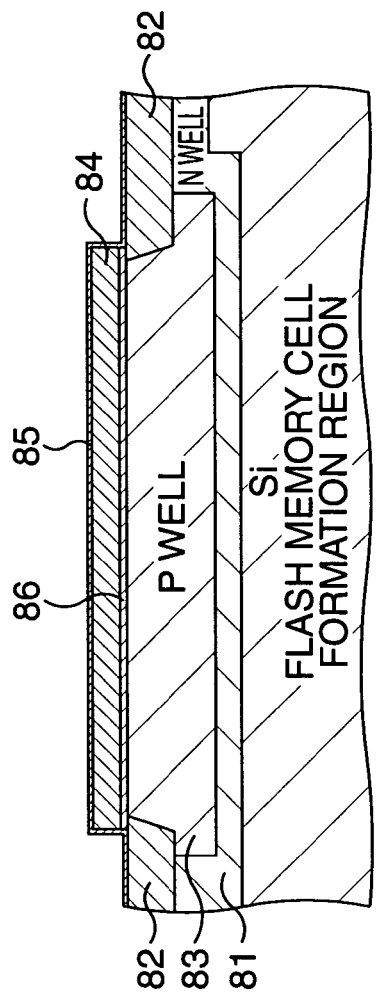
FIG. 33A and FIG. 33B are, continuous with FIG. 32A and FIG. 32B, sectional views each schematically showing the manufacturing method of the CMOS image sensor packaged with the flash memory in accordance with the third embodiment of the present invention in the processing sequence.
Figure 33B:
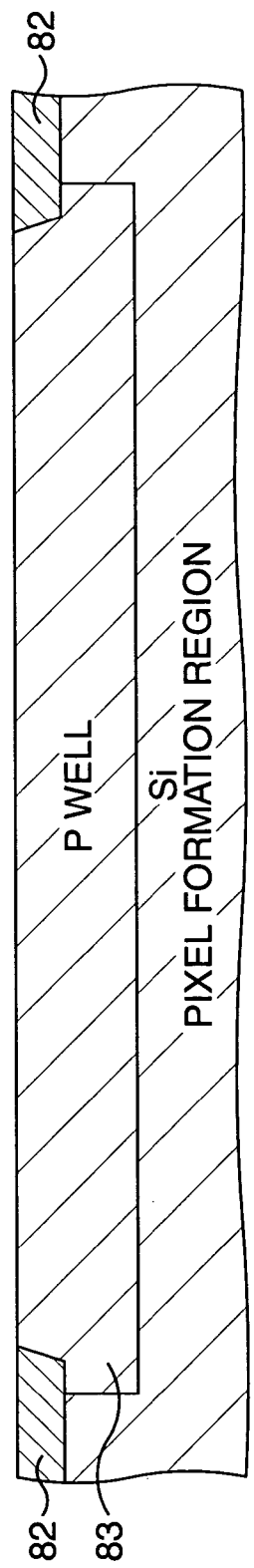

Then, as shown in FIG. 33A and FIG. 33B, by means of photo lithography process and the subsequent etching process, on the element active region of the flash memory cell formation region, the ONO film 85 is left.

Figure 34A:
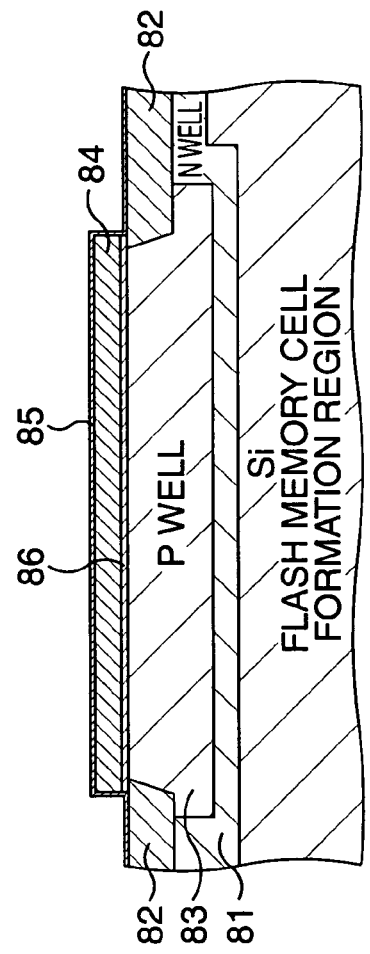
FIG. 34A and FIG. 34B are, continuous with FIG. 33A and FIG. 33B, sectional views each schematically showing the manufacturing method of the CMOS image sensor packaged with the flash memory in accordance with the third embodiment of the present invention in the processing sequence.
Figure 34B:
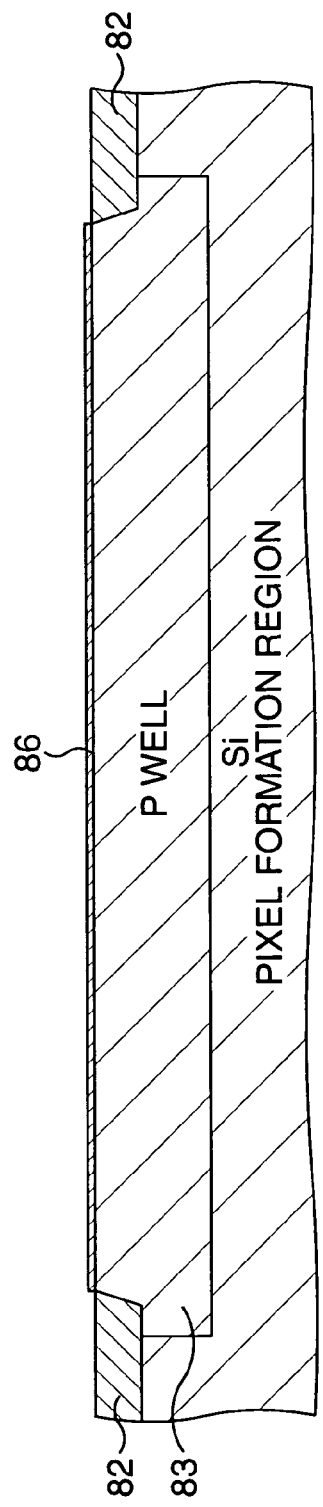

Then, as shown in FIG. 34A and FIG. 34B, thermal oxidation treatment is carried out to form a gate oxide film 86 in the region other than the flash memory cell formation region.

Then, as show in FIG. 35A and FIG. 35B, a polysilicon film 87 of approximately 180 nm in film thickness is deposited over the entire surface. Photolithography process and the subsequent etching process are carried out to form gate electrodes 88 in the flash memory cell formation region, the pixel formation region and the periphery logic circuit region.

Figure 36A:
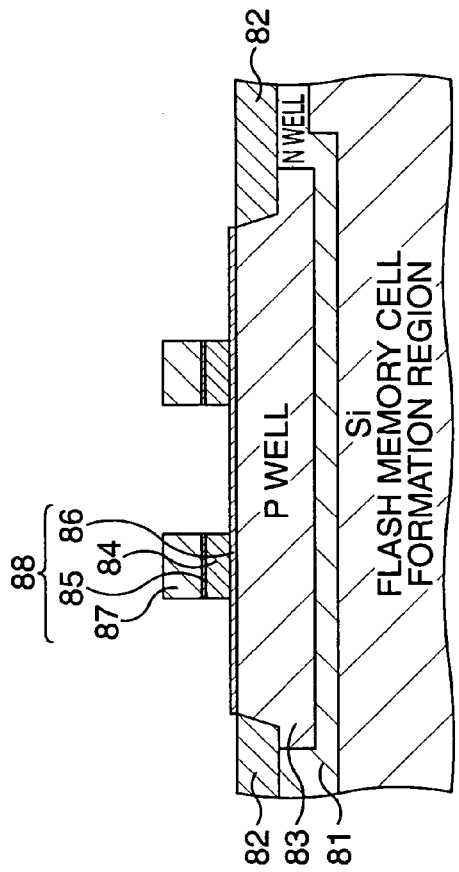
FIG. 36A and FIG. 36B are, continuous with FIG. 35A and FIG. 35B, sectional views each schematically showing the manufacturing method of the CMOS image sensor packaged with the flash memory in accordance with the third embodiment of the present invention in the processing sequence.
Figure 36B:
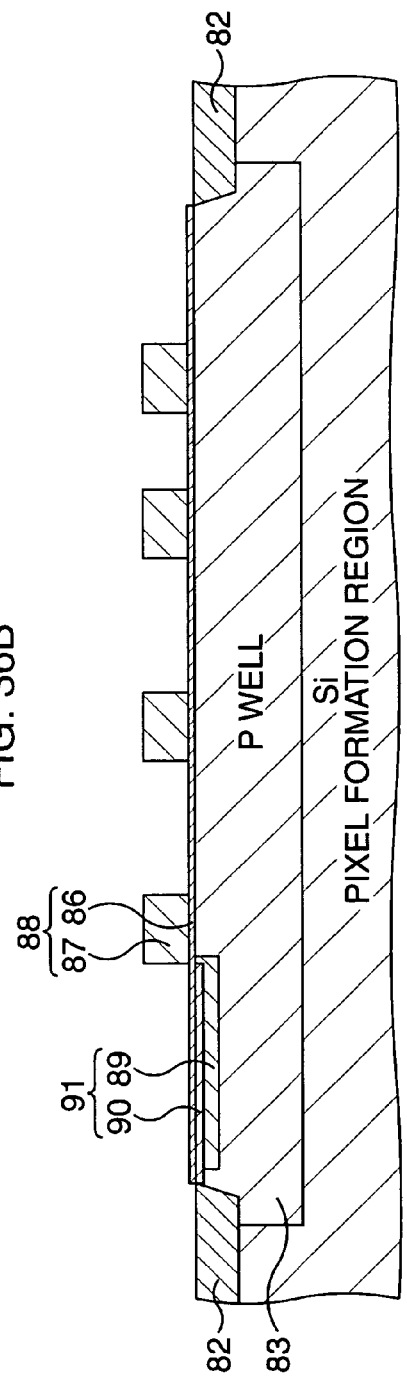

Then, a resist pattern, which opens above the photo diode formation region in the pixel formation region is formed, and phosphorous is ion implanted under the conditions of 30 keV to 300 keV and $1\times10^{12}/cm^2$ to $1\times10^{13}/cm^2$. Owing to this, an N-type diffusion layer 89 is formed to a deep level of the substrate in the photo diode formation region. Then, boron is ion implanted under the conditions of approximately 7 keV and $1\times10^{13}/cm^2$ to form a P-type diffusion layer 90 in the surface portion of the substrate in the photo diode formation region as a photodiode surface shield layer. Thus, as shown in FIG. 36B a photodiode 91 is formed in the pixel formation region.

Figure 37A:
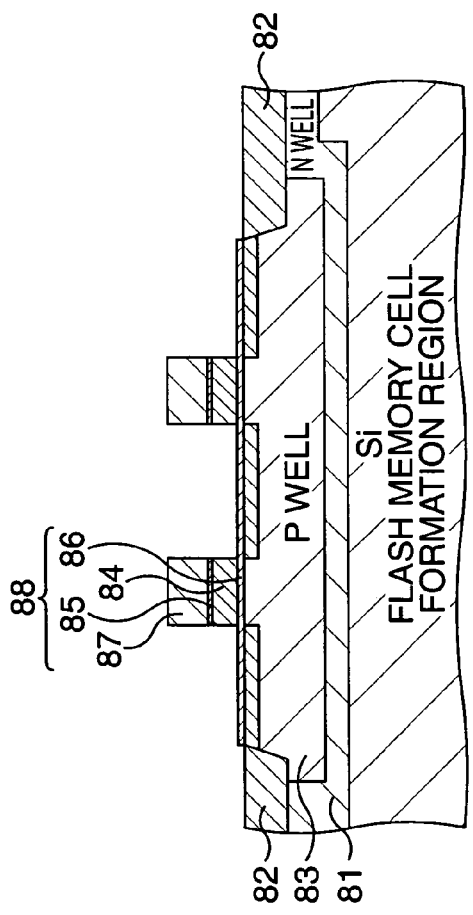
FIG. 37A and FIG. 37B are, continuous with FIG. 36A and FIG. 36B, sectional views each schematically showing the manufacturing method of the CMOS image sensor packaged with the flash memory in accordance with the third embodiment of the present invention in the processing sequence.
Figure 37B:
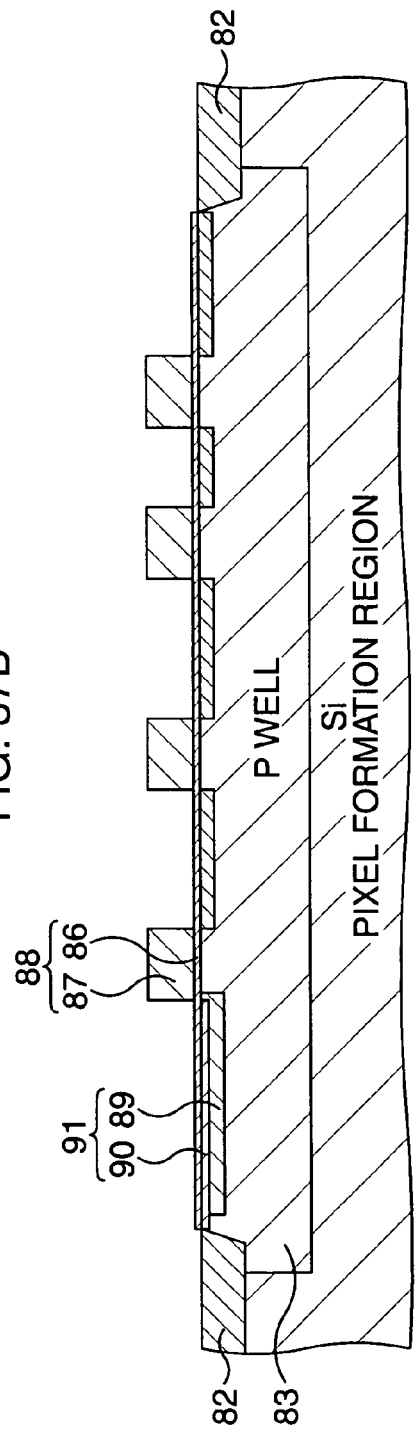

Then, as shown in FIG. 37A and FIG. 37B, a resist pattern, which opens above the source formation region in the flash memory cell formation region, is formed and phosphorous is ion implanted. Then, after removing the photoresist by means of incineration process, a resist pattern, which opens above a drain formation region in the flash memory cell formation region, is formed, and then arsenic is ion implanted. The order of the ion implantation to the source formation region and the drain formation region in the flash memory cell formation region is not limited to the above. The ion implantation may be carried out to the drain formation region first.

Then, as shown in FIG. 37A and FIG. 37B, a resist pattern, which opens in the region from the photodiode to the reset transistor excluding a part of gate electrode in the pixel formation region, is formed; and then phosphorous is ion implanted. The order of the ion implantation to the flash memory cell formation region and the pixel formation region is not particularly limited. The ion implantation may be carried out to the pixel formation region first. The ion implantation to the source formation region and the drain formation region may be carried out simultaneously in the flash memory cell formation region and the pixel formation region.

Then, a silicon oxide film of approximately 100 nm in film thickness is deposited over the entire surface. Then, a resist pattern, which covers the region from the photodiode portion to a partial upper surface of the gate electrode of the reset transistor portion in the pixel formation region, is formed. And the silicon oxide film is subjected to anisotropic dry etching.

Owing to this, as shown in FIG. 38A and FIG. 38B, side walls 92 are formed on the gate side wall of the flash memory cell, one side wall of the gate electrode in the reset transistor, both side walls of the gate electrode of the source follower transistor and both side walls of the gate electrode of the select transistor.

Then, after forming a silicon oxide film of approximately 5 nm in film thickness over the entire surface by means of thermal oxidation treatment, a resist pattern, which opens above the region excluding from the photodiode to the part of the gate electrode of the reset transistor in the pixel formation region and the periphery logic circuit formation region, is formed; and then arsenic is ion implanted under the conditions of approximately 40 keV and $2\times10^{15}/cm^2$. Owing to this, along with the N-type diffusion layer in the periphery logic circuit formation region, the N-type diffusion layer of the portion which is not coated by the silicon oxide film 92 in the pixel formation region is formed as an LDD structure.

Then, after removing the silicon oxide film of approximately 5 nm in film thickness by means of wet etching treatment using hydrofluoric acid as a chemical, a Co film is deposited over the entire surface by means of sputtering. Then, RTA treatment at approximately 500° C. is carried out to react Co and Si. After removing un-reacted Co film, the RTA treatment at approximately 800° C. is further carried out to form a $CoSi_2$ film 93. Here, as shown in FIG. 39A and FIG. 39B, since the silicon oxide film is formed in the region from the photodiode portion to the partial upper surface of the gate electrode of the reset transistor in the pixel formation region, Co and Si does not react. Accordingly, the $CoSi_2$ film 93 is not formed in this region.

Then, as shown in FIG. 40A and FIG. 40B, after forming a SiN film of 50 to 100 nm in film thickness or a SiON film of approximately 100 to 200 nm in film thickness over the entire surface, a BPSG film 94 of approximately 1.5μ in film thickness is further formed, and the surface thereof is flattened by means of CMP.

Then, the SiN film or SiON film and BPSG film 94 are subjected to patterning by means of photo lithography process and the subsequent etching process, in each of the flash memory cell formation region, the pixel formation region and the periphery logic circuit formation region, a contact hole, which is an opening for connecting the N-type diffusion layer and the wiring in the upper layer, is formed. Then, the contact hole is filled with tungsten W to form a W plug 95.

Then, a Ti film, a TiN film, an Al film, a Ti film and a TiN film are deposited in this order by means of sputtering. And the Ti film to the TiN film are subjected to patterning by means of photo lithography process and the subsequent etching process to form a first metal wiring 96 on the periphery logic circuit formation region, the flash memory cell formation region and the pixel formation region.

Figure 41:
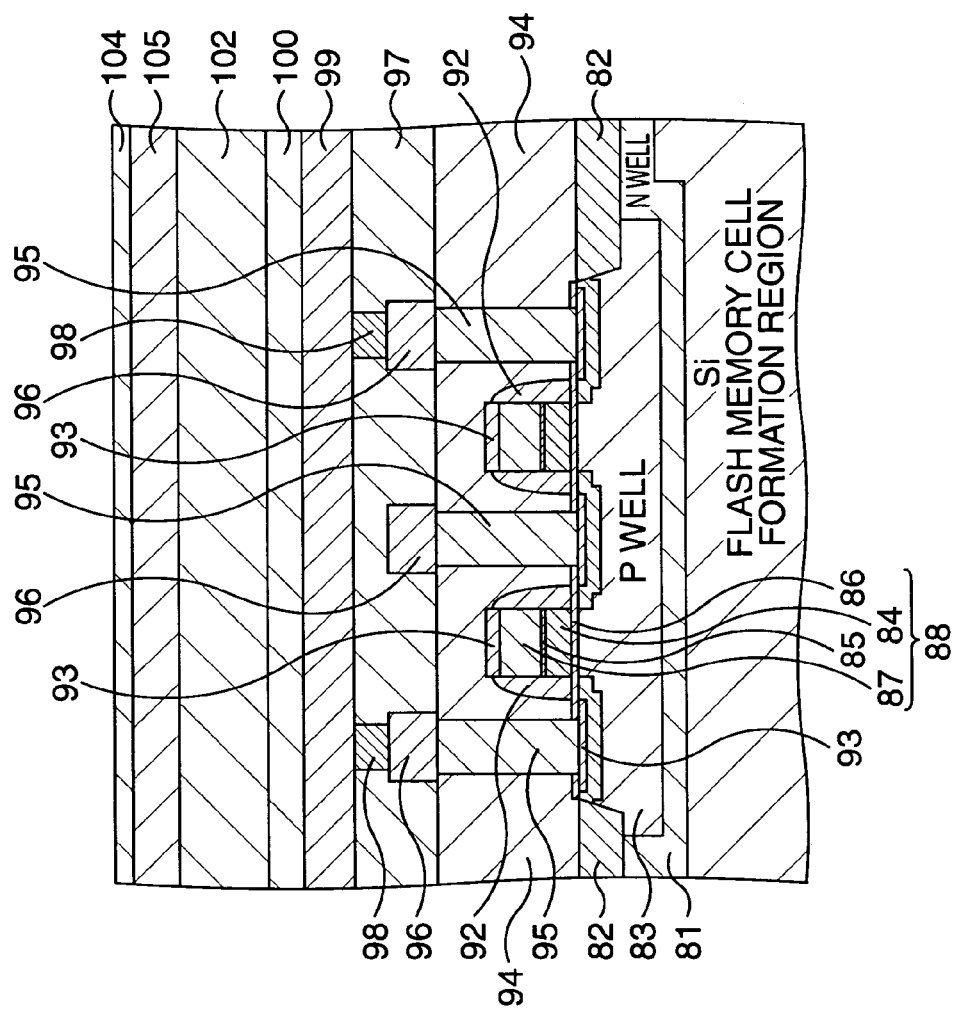
FIG. 41 is, continuous with FIG. 40A and FIG. 40B, a sectional view schematically showing the manufacturing method of the CMOS image sensor packaged with the flash memory in accordance with the third embodiment of the present invention in the processing sequence.
Figure 42:
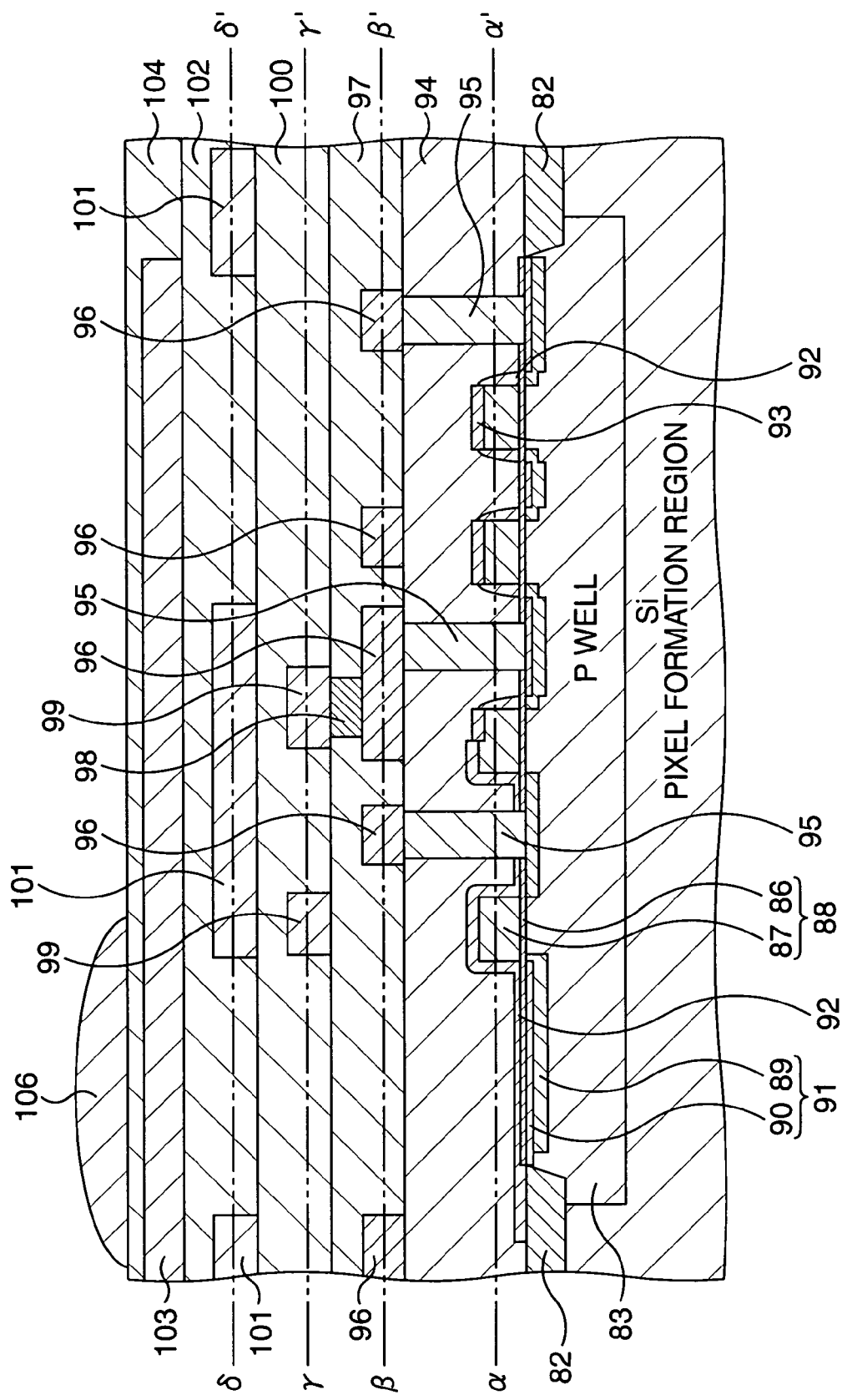
FIG. 42 is, continuous with FIG. 40A and FIG. 40B, a sectional view schematically showing the manufacturing method of the CMOS image sensor packaged with the flash memory in accordance with the third embodiment of the present invention in the processing sequence.

Then, as shown in FIG. 41 and FIG. 42, after depositing a silicon oxide film 97 by means of plasma CVD or bias high density plasma CVD (HDP-CVD), the surface thereof is flattened by means of CMP.

Then, by means of photo lithography process and the subsequent etching process, the silicon oxide film 97 is subjected to patterning until the surface of the first metal wiring 96 is exposed to form a via hole. Then, the via hole is filled with tungsten W to form a W plug 98.

Subsequently, in the further upper layer, a second metal wiring 99, a third metal wiring 101, a W plug and an interlayer insulation film 100 are formed in the flash memory cell formation region, the pixel formation region and the periphery logic circuit formation region by means of the like processes. Then, by means of plasma CVD or HDP-CVD, a silicon oxide film 102 is deposited and the surface thereof is flattened by means of the subsequent CMP.

Then, after depositing a silicon nitride film (not shown) over the entire surface as the cover film by means of plasma CVD, in the pad formation region (not shown), by means of photo lithography process and the subsequent etching process, the silicon oxide film 102 and the silicon nitride film are subjected to patterning to expose the surface of the third metal wiring 101; thus the electrode pad is formed.

Then, color filters 103 and 105 are formed above the flash memory formation region and the pixel formation region. Here, as the color filter 105 formed above the flash memory formation region, a black light shielding layer is used. Then, after forming a protection film 104 for coating the color filters 103 and 105, a microlens 106 is formed in a position on the protection film 104 above the photodiode 91.

In this embodiment, any description has not been given about a fuse for pixel voltage or a flash memory power supply fuse. However, it is needless to say that those fuses may be formed by means of the like process as that in the above-described first and second embodiments.

Figure 46:
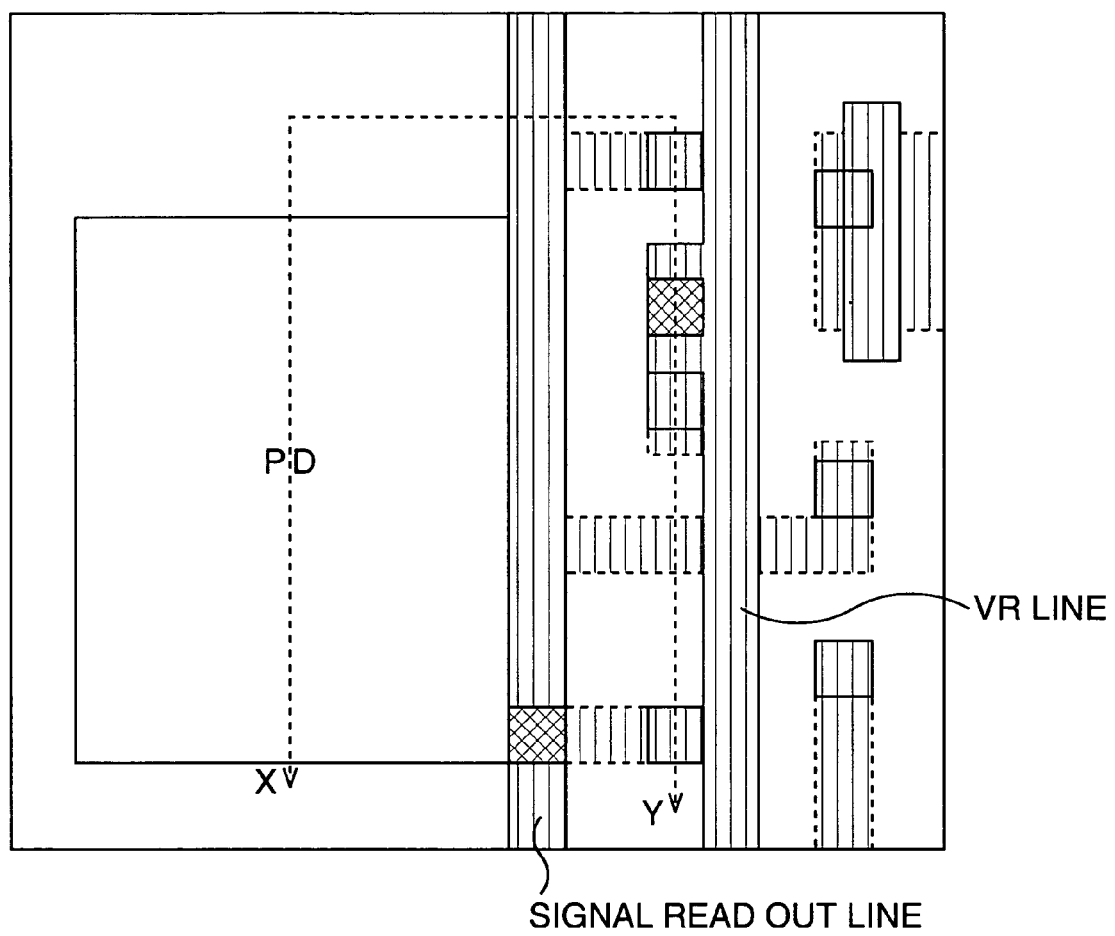
FIG. 46 is a plane configuration diagram of a pixel formation region in the CMOS image sensor packaged with the flash memory in accordance with the third embodiment of the present invention.
Figure 47:
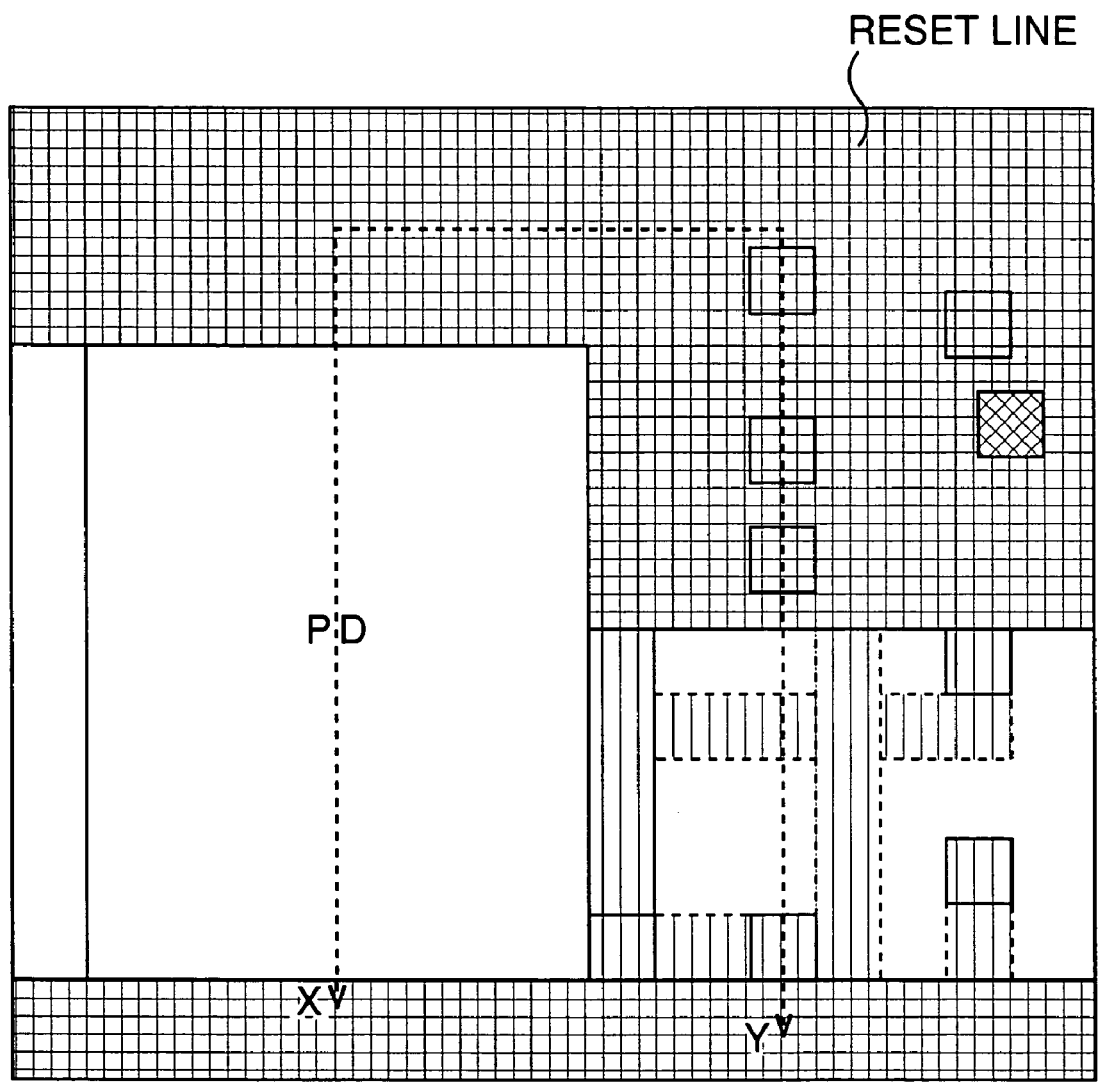
FIG. 47 is a plane configuration diagram of a pixel formation region in the CMOS image sensor packaged with the flash memory in accordance with the third embodiment of the present invention.
Figure 48:
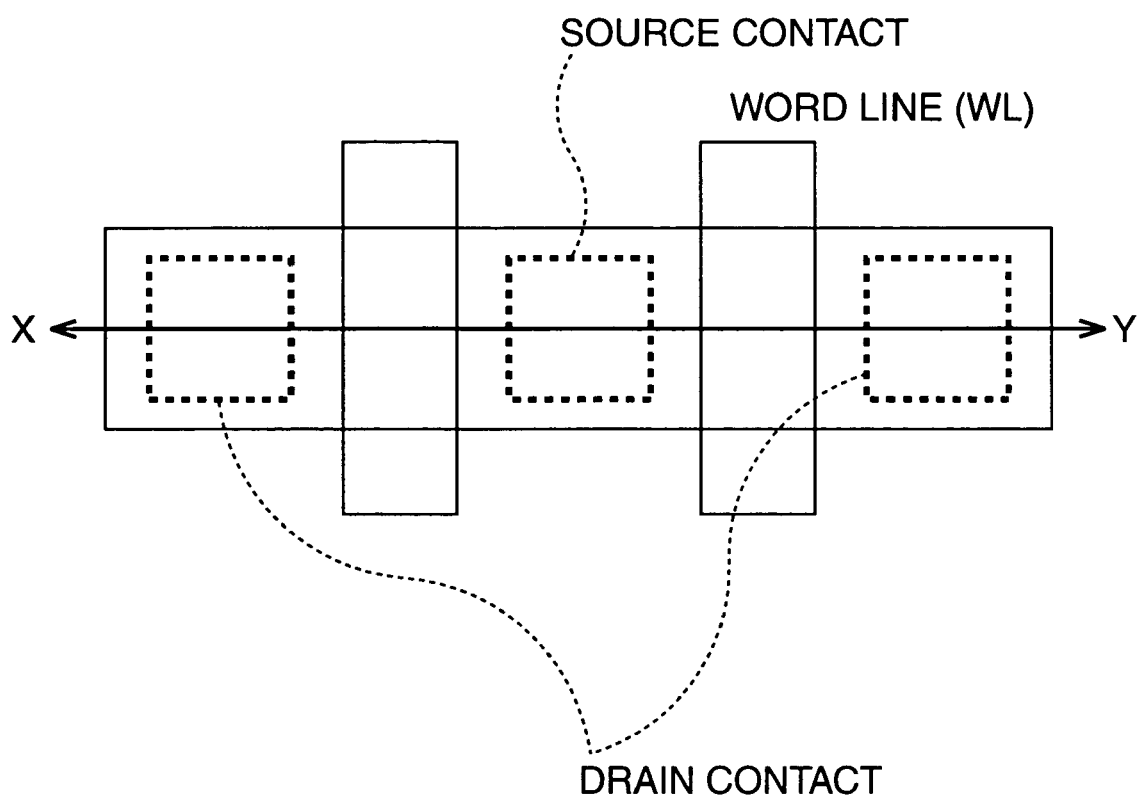
FIG. 48 is a plane configuration diagram of the flash memory applied to the CMOS image sensor packaged with the flash memory in accordance with the third embodiment of the present invention.

FIG. 44 to FIG. 47 are diagrams each showing a plane configuration of the pixel formation region in the CMOS image sensor packaged with flash memory according to the embodiment. FIG. 48 shows a plane configuration of the flash memory applied to the CMOS image sensor packaged with flash memory according to this embodiment. X-Y line in FIG. 44 to FIG. 48 is the line along which the section in FIG. 42 is taken. The meshed portions in FIG. 44 to FIG. 48 indicates connection portions between the via hole or contact hole and a metal wiring.

Figure 44:
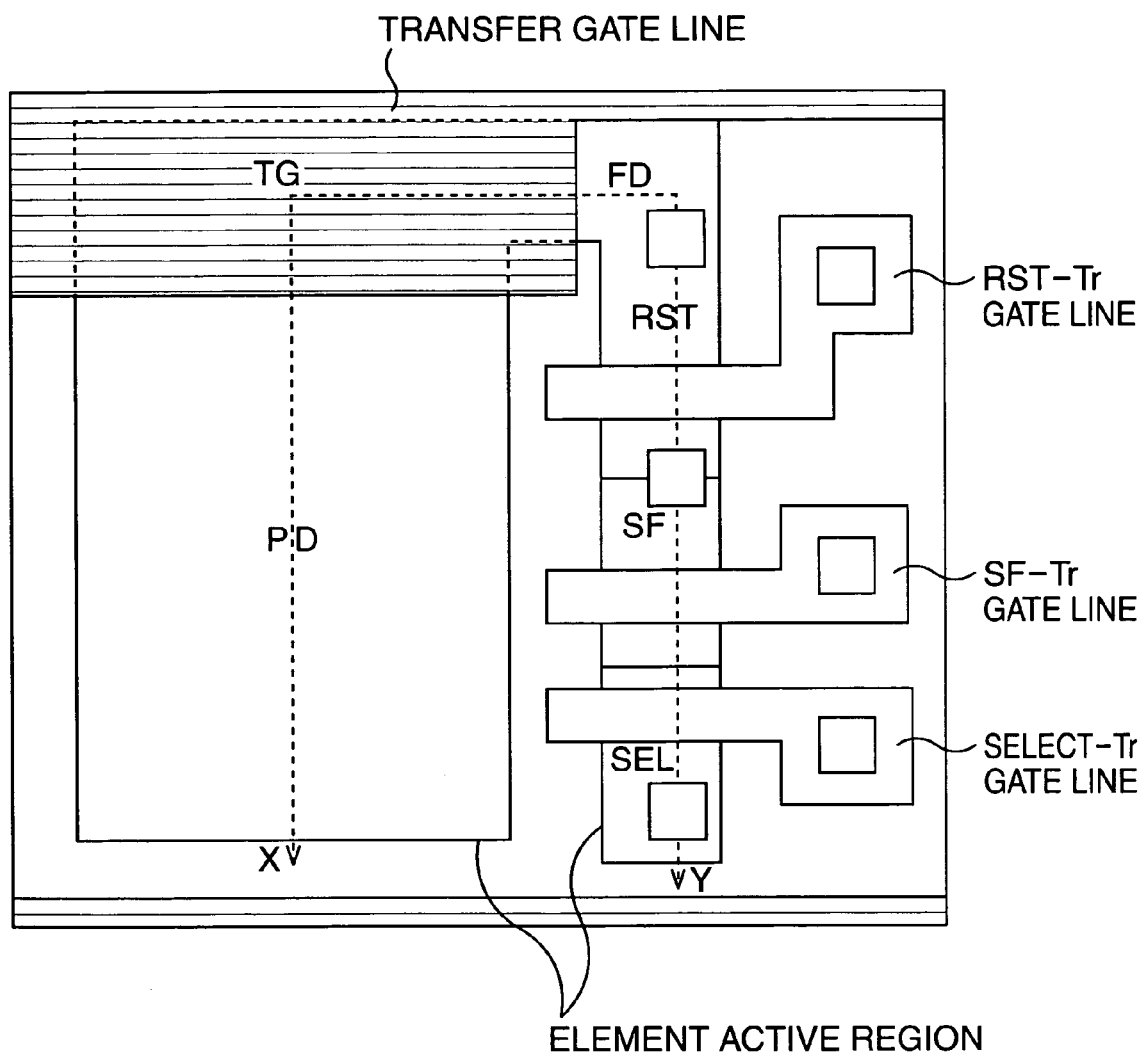
FIG. 44 is a plane configuration diagram of a pixel formation region in the CMOS image sensor packaged with the flash memory in accordance with the third embodiment of the present invention.
Figure 45:
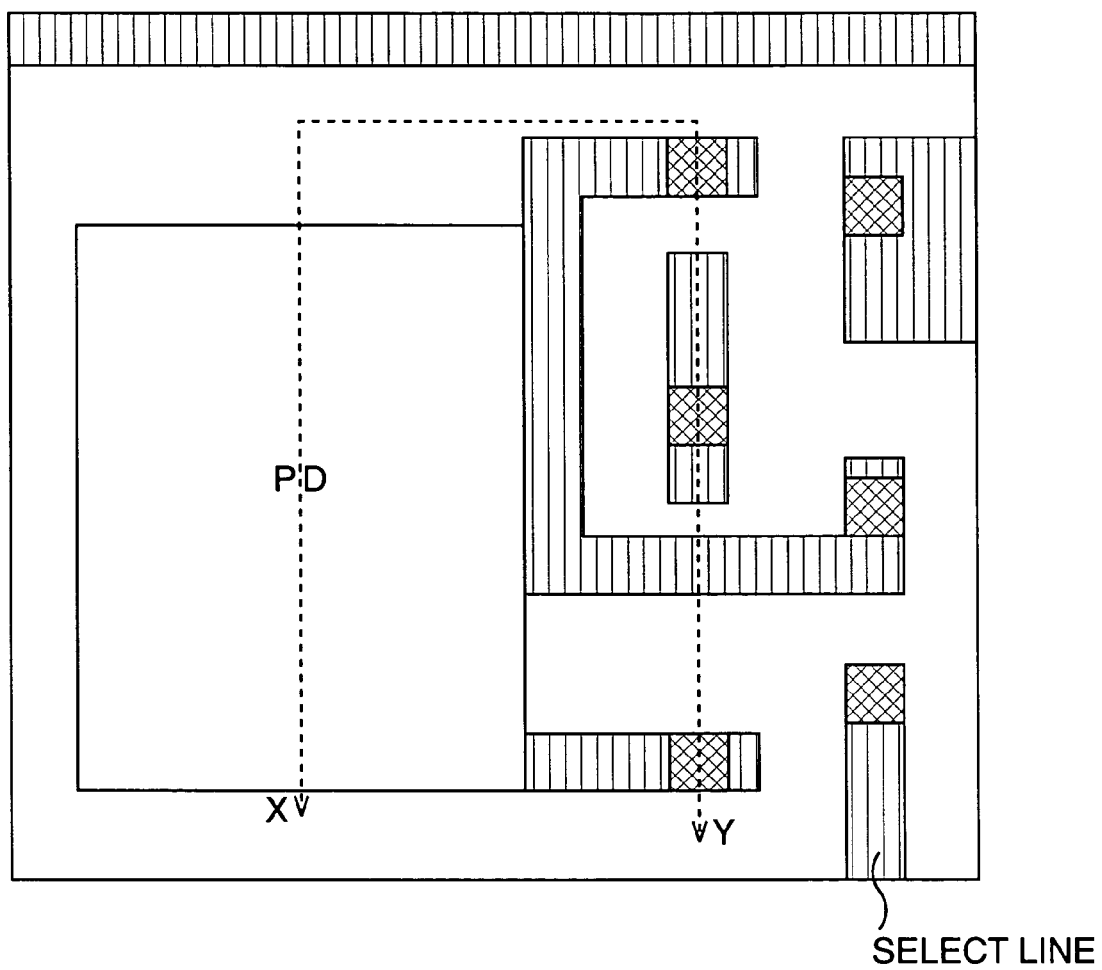
FIG. 45 is a plane configuration diagram of a pixel formation region in the CMOS image sensor packaged with the flash memory in accordance with the third embodiment of the present invention.

FIG. 44 shows a plane configuration taken along the α-α' line in FIG. 42. FIG. 45 shows a plane configuration taken along the β-β' line in FIG. 42. FIG. 46 shows a plane configuration taken along the γ-γ' line in FIG. 42. FIG. 47 shows a plane configuration taken along the δ-δ' line in FIG. 42. In the CMOS image sensor packaged with flash memory according to this embodiment, as shown in FIG. 45, the wiring for connecting the floating diffusion and the source follower transistor is formed using the first metal wiring. Accordingly, in this embodiment, the following configuration is employed. That is, the third metal wiring forms the reset line, and the reset line is commonly used as the light-shielding layer for light shielding a portion of the pixel formation region excluding a photodiode portion.

Other Embodiment

Figure 49:
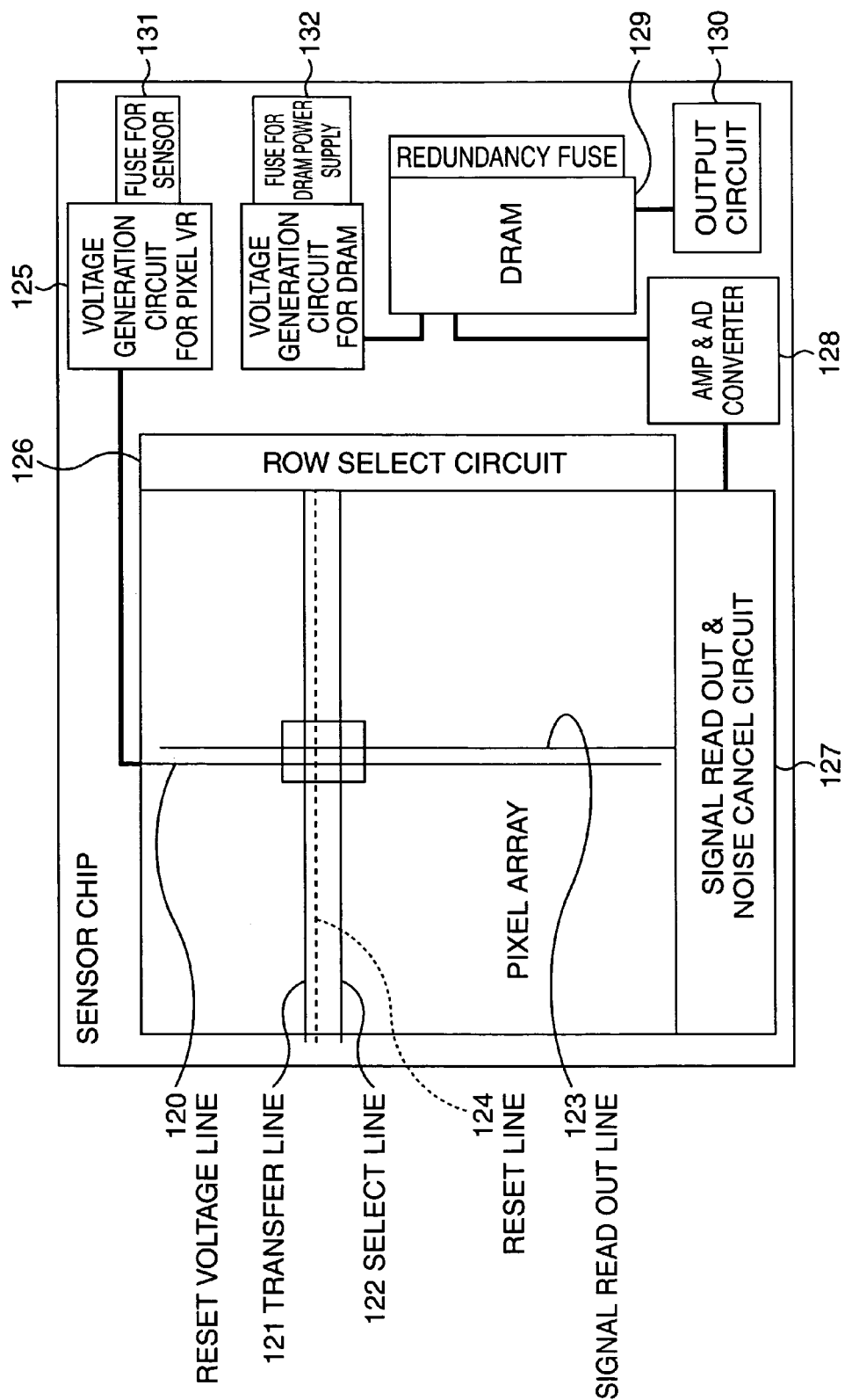
FIG. 49 is a diagram schematically showing a plane configuration of the CMOS image sensor packaged with the DRAM.

FIG. 49 is a diagram schematically showing a plane configuration of a CMOS image sensor packaged with DRAM.

As shown in FIG. 49, in the CMOS image sensor packaged with DRAM according to this embodiment, a CMOS image sensor and a DRAM are packaged together, and the CMOS image sensor has a pixel array in which pixels are disposed in two-dimension.

Each pixel is connected to a reset voltage line 120, a transfer gate line 121, a select line 122, a signal read out line 123 and a reset line 124. The reset voltage line 120 is a wiring for transmitting a reference voltage at resetting from a voltage generation circuit 125 for pixel to each pixel. The transfer gate line 121 is a wiring for transmitting control signals for controlling read out of electric signals from the photodiode of each pixel to each pixel from a row select circuit 126. The reset line 124 is a wiring for transmitting control signals for resetting the photodiode and floating diffusion portion from the row select circuit 126 to each pixel. The signal read out line 123 is a wiring for a signal read out & noise cancel circuit 127 to read out output signals from each of the pixels.

The signal read out from each pixel is executed in accordance with the control of the signal read out & noise cancel circuit 127. After reading output signals from each pixel and removing noises, the signal read out & noise cancel circuit 127 outputs the signals to an amplifier & AD converter circuit 128. After amplifying and digitalizing the input signals, the amplifier & AD converter circuit 128 outputs the signals to an output circuit 130 and a DRAM 129.

Image data for approximately ¼ to ¹/₁₀ of total pixels are transferred from the amplifier & AD converter circuit 128 to the output circuit 130. The transferred image data are outputted from the output circuit 130 to the outside of the chip, and after being subjected to display configuration process, displayed on a screen of, for example, a mobile telephone. On the other hand, from the amplifier & AD converter circuit 128 to the DRAM 129, the image data of total pixels are transferred and temporarily recorded therein. In the DRAM, data of signals from the pixels immediately after A/D conversion are stored. After that, for example, in the case where a user wants to store the image data displayed on the screen of the mobile telephone, when a predetermined operation is carried out, the temporarily stored image data for total pixels are subjected to display configuration process by the DRAM 129 and stored in a recording medium such as a memory card.

In a conventional CMOS image sensor, as a reset voltage for resetting photodiode and floating diffusion portion, ordinarily, a voltage lower than a power supply voltage is used. The reset voltage VR varies depending on the manufacturing differences in transistor or the like. Assuming that a voltage at which a PNP-type embedded photodiode is perfectly depleted is Vpd, the difference between the reset voltage VR and the Vpd is the dynamic range of the signals. Therefore, when the reset voltage VR is lower than a desired value due to manufacturing differences, the dynamic range becomes narrower accordingly.

Contrarily, when the reset voltage VR is larger than a desired value, the junction leak becomes larger resulting in a reduction of S/N ratio. In addition to the reset voltage, for example, the gate voltage of transfer transistor or reset transistor may be set to a voltage different from the power supply voltage. In this case also, voltage differences due to manufacturing differences give an influence on the performance of an imaging element.

Figure 50:
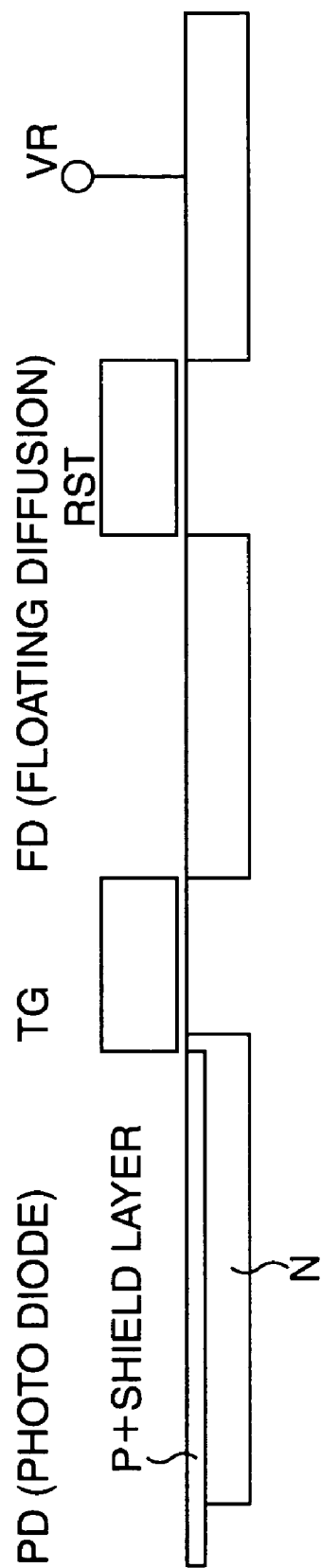
FIG. 50 is a diagram schematically showing a sectional configuration from a photodiode to a reset transistor of a 4-transistor type pixel.
Figure 51:
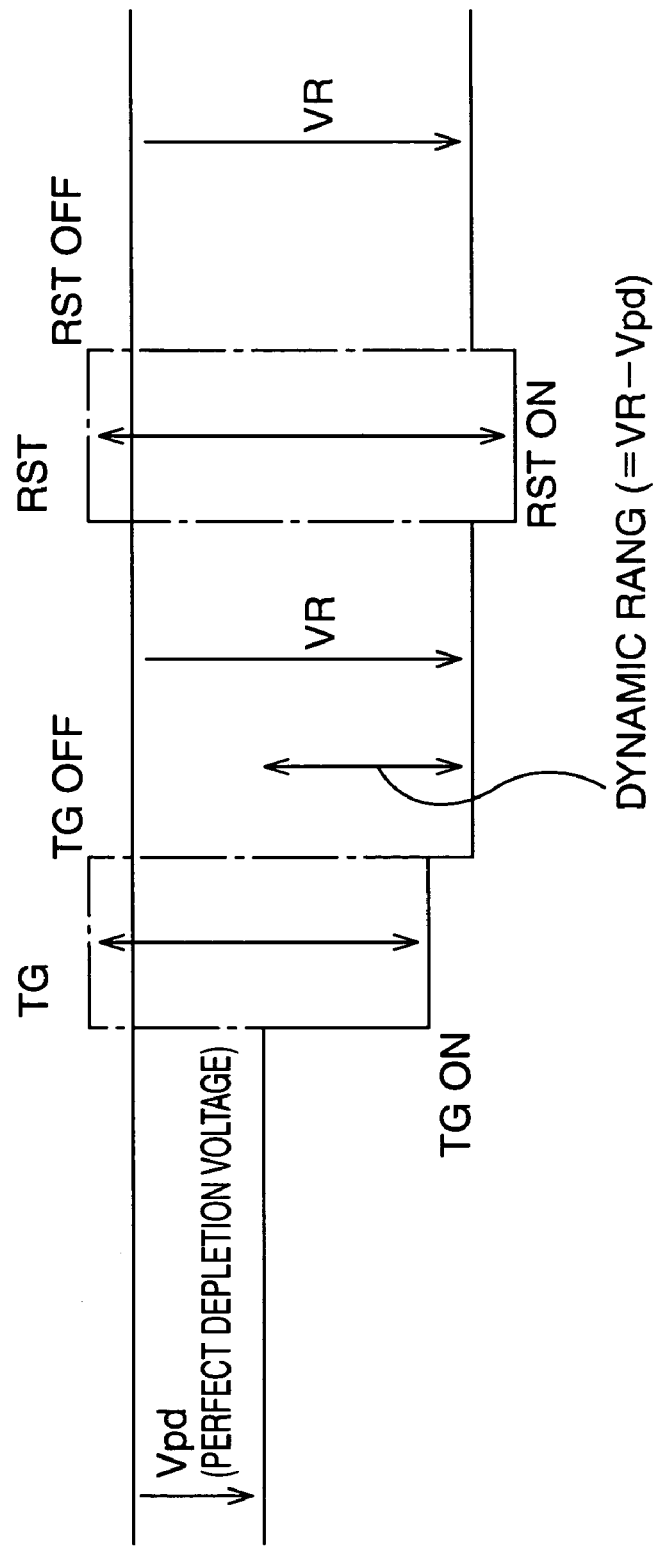
FIG. 51 is a diagram showing a potential status from the photodiode to the reset transistor in the 4-transistor type pixel.

FIG. 50 schematically shows a sectional configuration from a photodiode to a reset transistor in a 4-transistor type pixel. FIG. 51 shows a potential status from the photodiode to the reset transistor in the 4-transistor type pixel.

When reading out the charge from the photodiode or resetting the photodiode, to pull out the charge completely from the photodiode, the voltage at the floating diffusion portion has to be Vpd or more, and the dynamic range is limited to VR-Vpd or less.

The reset voltage VR is supplied to the photodiode or the floating diffusion portion via the reset transistor. In order to avoid a voltage drop equal to the threshold voltage (Vth) of the transistor, the threshold of the reset transistor has to be lowered, or a sufficiently high voltage has to be impressed to the gate electrode of the reset transistor. When a low threshold voltage Vth is used, the leak current when the reset transistor is turned OFF may cause a problem.

Contrarily, the CMOS image sensor packaged with DRAM according to the first and second embodiments of the present invention is, as shown in FIG. 49, provided with a pixel voltage fuse 131 and a DRAM power supply fuse 132. By cutting off these fuses, these differences in internally generated voltages, which are caused from manufacturing differences such as threshold voltage, can be adjusted. In the CMOS image sensor packaged with DRAM according to the embodiments, since the fuse 131 for pixel voltage can be manufactured in the same process as that of the DRAM power supply fuse 132, the manufacturing process does not has to be increased.

According to the above embodiments, particularly, the differences of the reset voltage (VR) can be reduced. The adjustment of the reset voltage VR and the like by means of the voltage fuse 131 for pixel is effective not only in the case where the image sensor is packaged with DRAM but also where the image sensor is packaged with SRAM, or the image sensor only is used.

Figure 52:
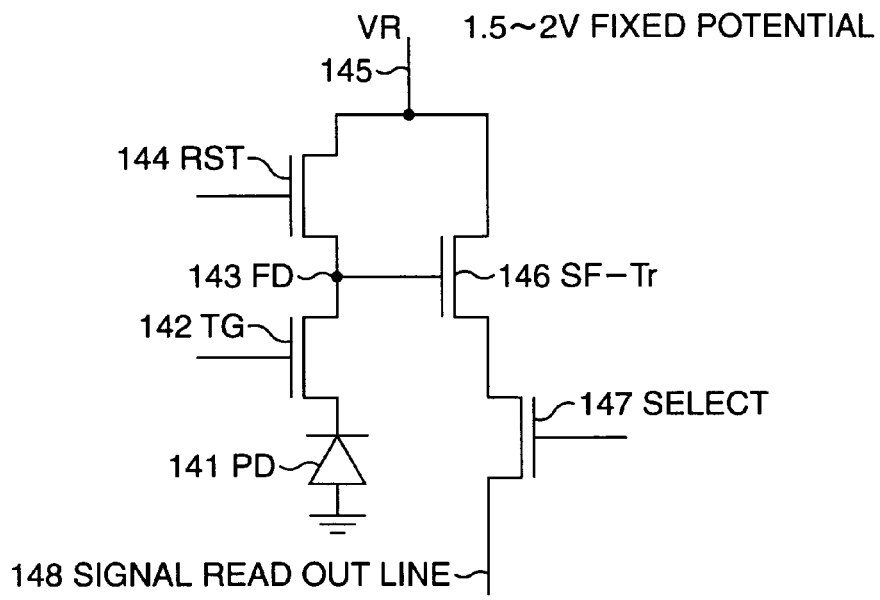
FIG. 52 is an equivalent circuit diagram of a 4-transistor type pixel.

FIG. 52 is an equivalent circuit diagram of a 4-transistor type pixel.

The pixel applied to the above embodiments is a 4-transistor type pixel, which has one photodiode and four transistors as shown in FIG. 52. Reference numeral 141 denotes a photodiode (PD in the figure), 142 denotes a transfer transistor (TG in the figure), 143 denotes a floating diffusion (FD in the figure), 144 denotes a reset transistor (RST in the figure), 145 denotes a reset voltage line (VR in the figure), 146 denotes a source follower transistor (SF-Tr in the figure), 147 denotes a select transistor (Select in the figure), and 148 denotes a signal read out line.

Figure 53:
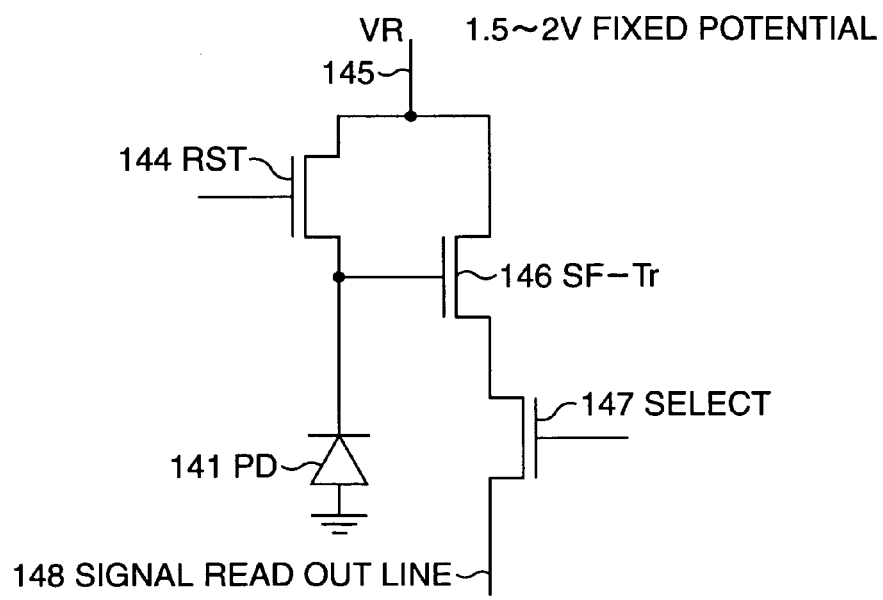
FIG. 53 is an equivalent circuit diagram of a 3-transistor type pixel.

In the above embodiments, the description has been made taking the 4-transistor type pixel as an example. However, a 3-transistor type pixel, which includes one photodiode and three transistors, may be applied to the present invention. FIG. 53 is an equivalent circuit diagram of a 3-transistor type pixel.

As shown in FIG. 53, a 3-transistor type pixel has a configuration in which a transfer transistor is removed from a 4-transistor type pixel. In the case where the 3-transistor type pixel is applied to the present invention, the adjustment of the reset voltage VR is possible by the above-described fuse.

Figure 54:
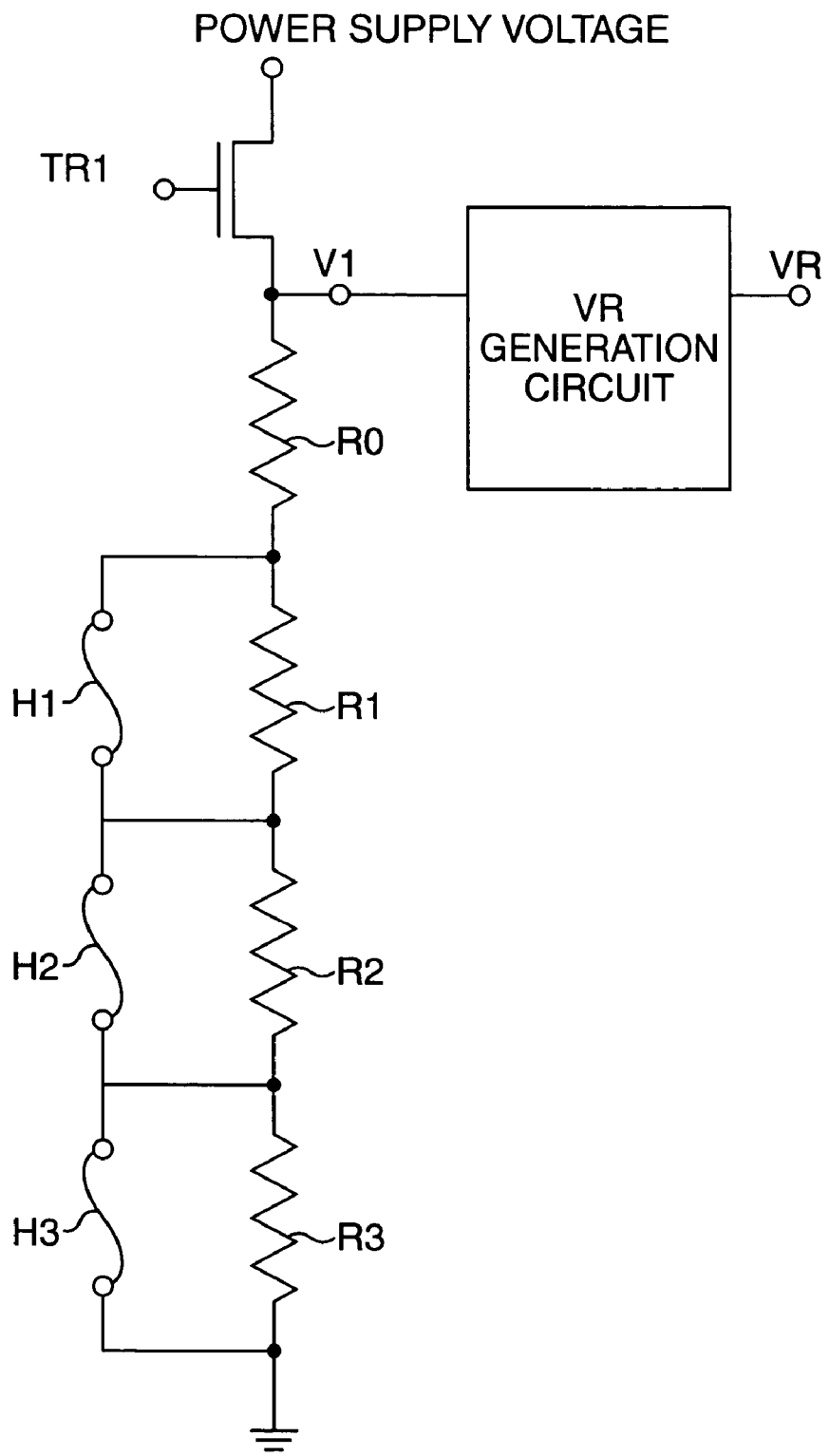
FIG. 54 is a diagram showing an example of a configuration of a fuse capable of adjusting the reset voltage VR.

FIG. 54 shows an example of a configuration of a fuse capable of adjusting the VR voltage.

Between a power supply voltage to a GND 0 V, resistances R0 to R3 and fuses H1 to H3 are connected to each other in parallel. If necessary, a part or all of fuses H1 to H3 may be selected and cut off. Thereby, the resistance value between a node V1 and the ground is changed; thus, the voltage value of the node V1 can be adjusted. Actually, a voltage value, which appears on the node V1, is inputted to the VR generation circuit and thereby, a desired reset voltage VR can be obtained.

The above fuse for voltage adjustment is a type which is cut off by laser. However, another type of fuse may be used. For example, as shown in FIG. 64, using a capacitor, which has a thin insulation film as the capacitor insulation film, and by impressing a voltage greater than the insulation voltage, the insulation is broken and the conductivity can be established. By controlling the insulation/conductivity between the electrodes of a capacitor, the function as a fuse can be obtained. As for the fuse for adjusting the voltage of the image sensor, an electrical fuse as described above may be used. In this case, since contaminations due to the fuse cut-off can be prevented, an advantage as the fuse for image sensor is obtained.

Figure 55:
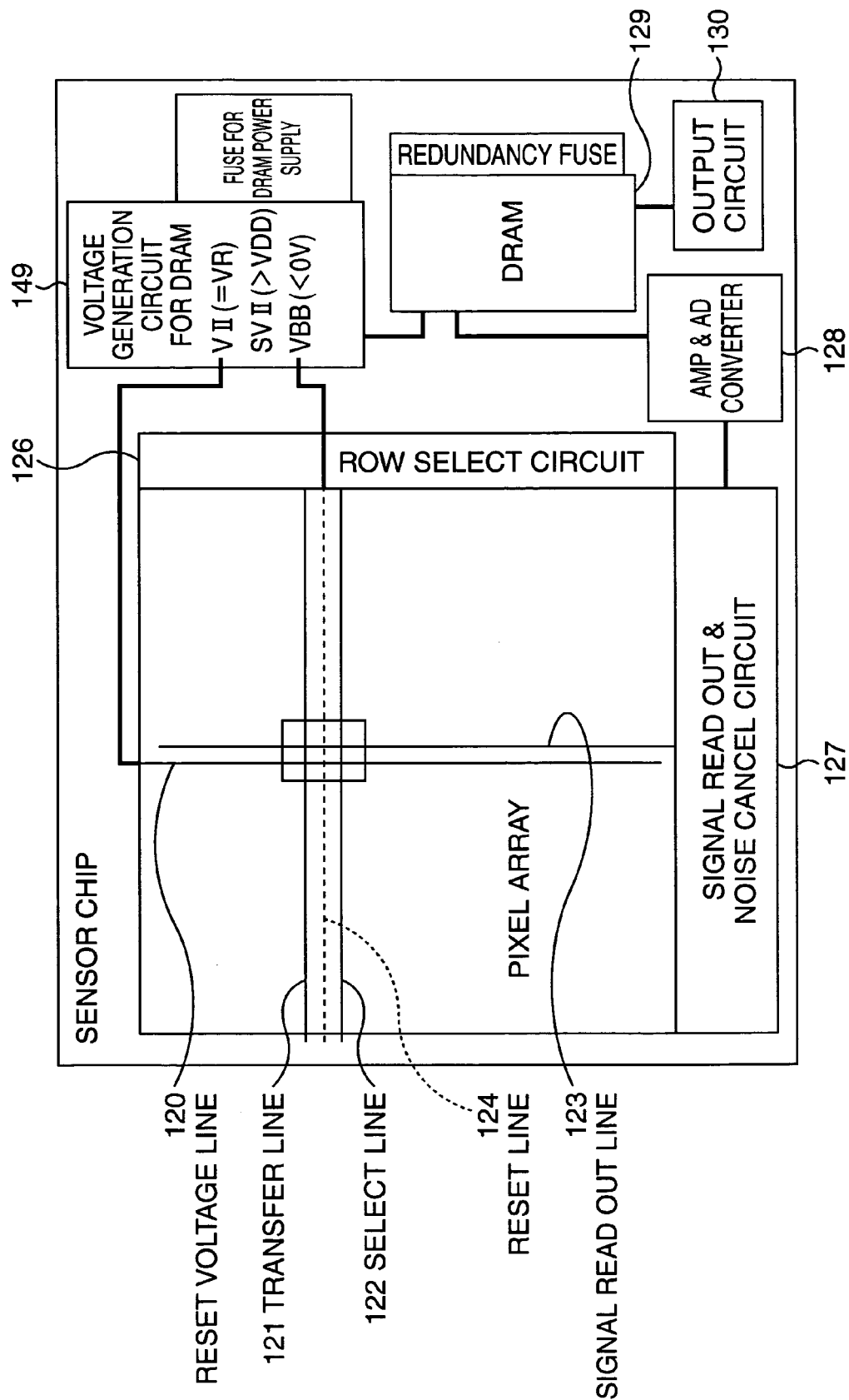
FIG. 55 is a diagram schematically showing an example of another plane configuration of the CMOS image sensor packaged with a DRAM.

FIG. 55 schematically shows another plane configuration example of the CMOS image sensor packaged with DRAM.

In the CMOS image sensor packaged with DRAM, a voltage VII for DRAM (a voltage in which power supply voltage 3.3V to 2.5V is dropped to 1 to 2V within the chip) is commonly used as a reset voltage VR for pixel in a voltage generation circuit 149 for the DRAM; further, a voltage VBB of −0.1V to −1.0V generated within the chip is used as a gate voltage for turning off the reset transistor.

As shown in FIG. 50 and FIG. 51, the reset transistor has a function as a gate for writing a reset voltage VR to FD or PD. Since the reset transistor is constituted of an Nch transistor, if the impressed gate voltage (VG) is too low, the VR cannot be written correctly. As a result, a voltage (VG−Vth≦VR) with a voltage drop equal to a threshold voltage Vth is written. Therefore, it is preferred to set up the threshold voltage Vth for the reset transistor to a low level.

When the threshold voltage Vth is set up to a low level, in order to ensure the leak current generated when the reset transistor is turned off, a VBB is impressed to the gate of the reset transistor when the transistor is turned off. Also, the image sensor and the DRAM use the internal power generation circuit (voltage generation circuit for DRAM) 149 commonly; thus, the chip region can be reduced.

As described above, in the case not only where the image sensor is packaged with DRAM, but also where the image sensor is packaged with SRAM, or where the image sensor only is packaged without DRAM or SRAM, to set up the gate voltage of the reset transistor at turning off to a minus voltage is effective for preventing the leak current.

Also, by using the VBB for the voltage when the gate of the transfer transistor is turned OFF, it is possible to prevent the leak current from being generated as well as to reduce the threshold voltage Vth of the transfer transistor.

Further, in addition to the VBB, in the case where the DRAM uses a word line negative reset (a negative voltage VNWL of −0.1 to −1 V is used as a voltage for turning OFF the word line), the VNWL may be impressed to the gate of the reset transistor at turning OFF.

In the above description, the plane configuration has been described taking the CMOS image sensor packaged with DRAM as an example. The CMOS image sensor packaged with flash memory according to the third embodiment of the present invention may have the same plane configuration.

Figure 56:
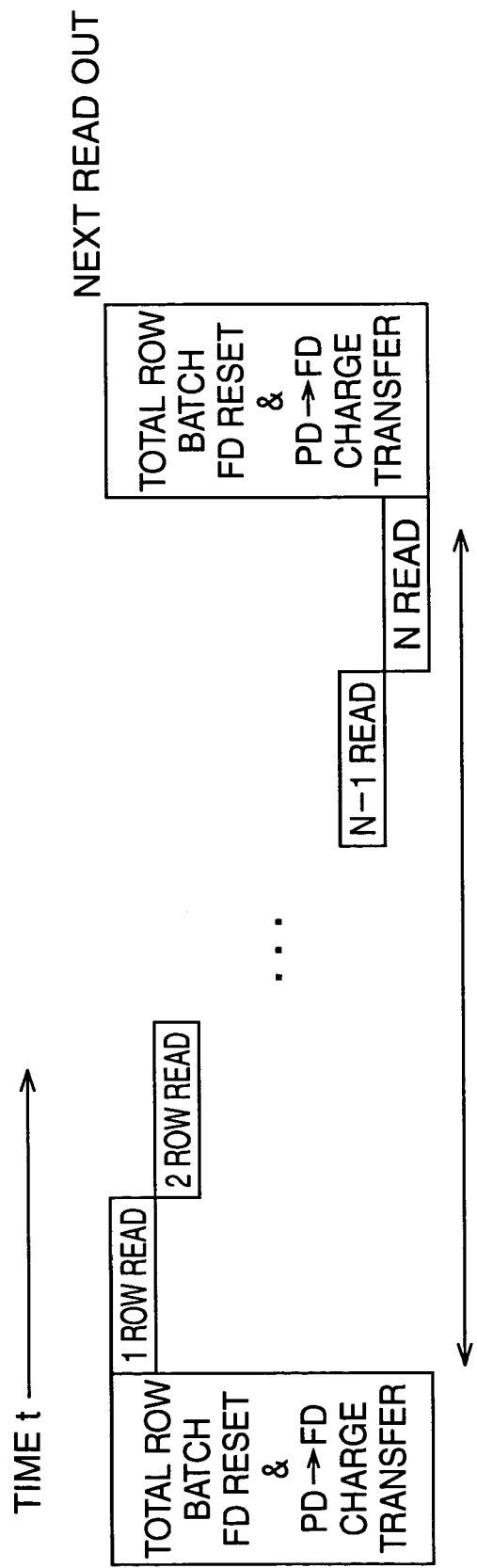
FIG. 56 is a diagram schematically showing an ordinary batch shutter operation.

FIG. 56 schematically shows an ordinary batch shutter operation. The abscissa axis indicates time axis; the ordinate axis indicates rows of the pixel array in the image sensor.

In the batch shutter operation shown in FIG. 56, first, floating diffusion portions of pixels in all rows are reset as a batch, and charge transfer to the floating diffusion portion from the photodiode portion is carried out to all rows as a batch. And then, voltage signals in the floating diffusion portion are read out from the first row.

The read out of the voltage signals on each row takes a large part of time for ordinary imaging sequence. For example, in the imaging at a speed of 30 frame/sec., between the first row and the last row; i.e., from the charge transfer from the photodiode portion to the floating diffusion portion to the read out of the voltage signals from the floating diffusion portion, a time difference of maximum 33 ms is resulted in. Therefore, in the latter rows, the junction leak in the floating diffusion portion becomes large. As a result, the S/N ratio of the read out voltage signals is reduced resulting in a degradation of the image quality.

On the other hand, after the charge transfer from the photodiode portion to the floating diffusion portion is carried out as a batch, by carrying out the read out operation of the voltage signals from the floating diffusion portion at a high speed, even in the latter rows, the influence of the junction leak can be reduced to a small level.

Figure 57:
FIG. 57 is a diagram schematically showing a batch shutter operation with a CMOS image sensor packaged with a DRAM or a CMOS image sensor packaged with a flash memory according to one embodiment of the present invention.

FIG. 57 schematically shows the batch shutter operation by the CMOS image sensor packaged with DRAM or CMOS image sensor packaged with flash memory according to the embodiments of the present invention.

According to the embodiments of the present invention, the read out operation of the voltage signals from the floating diffusion portions can be carried out at a high speed. Even when the voltage signals are read out from the floating diffusion portions of the all rows at a high speed, by controlling so that, the read out voltage signals are stored once in the DRAM 129 in the chip and outputted later out of the chip from the DRAM 129, the transfer of the voltage signals out of the chip can be carried out at the same frequency as that in the case where the a sequence shown in FIG. 56 is executed.

Figure 58:
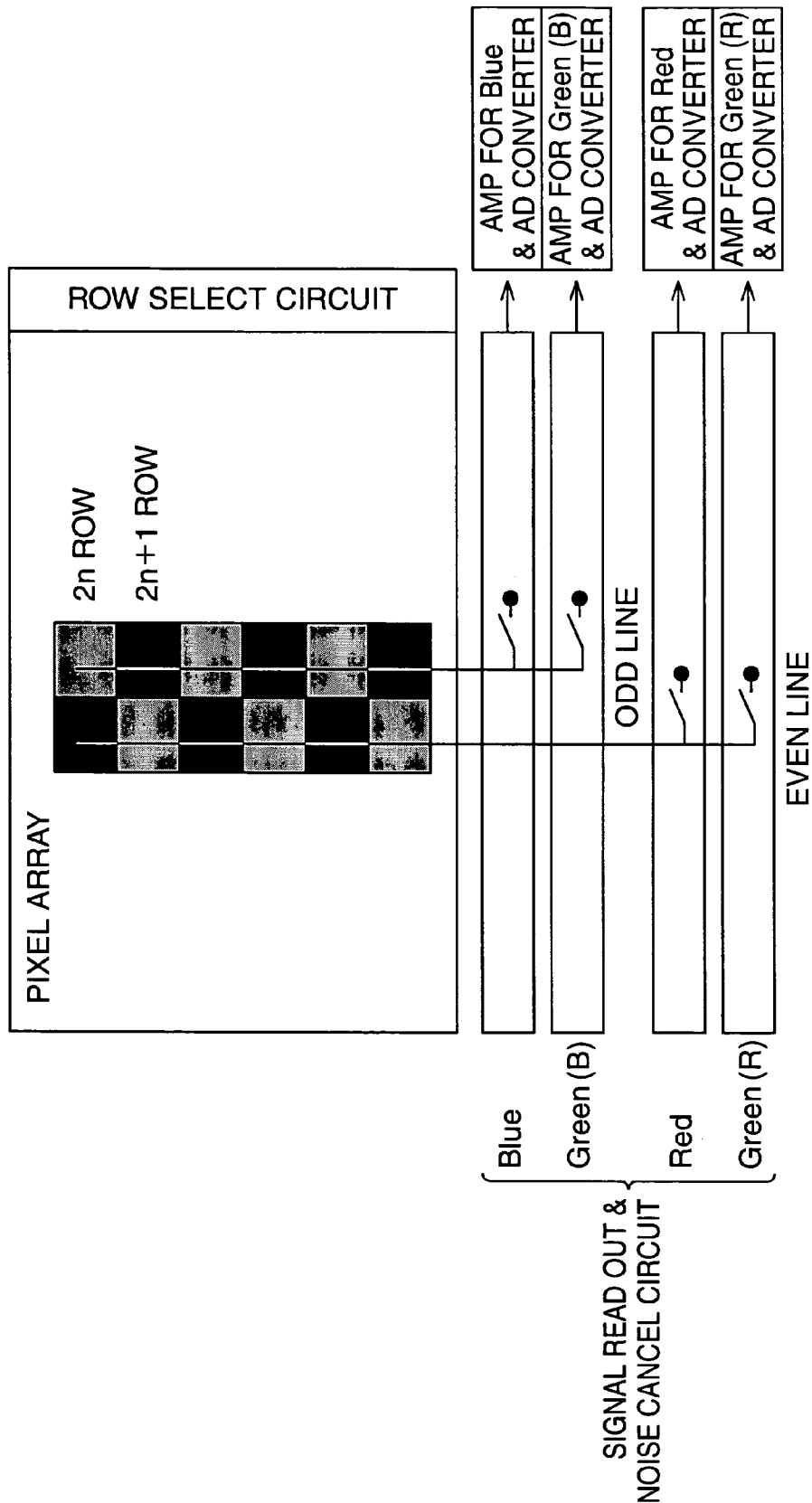
FIG. 58 is a diagram showing an example of a circuit configuration ensuring the batch shutter operation shown in FIG. 57

FIG. 58 shows an example of a circuit configuration that realizes the batch shutter operation shown in FIG. 57.

Ordinarily, the pixels in an image sensor have a Bayer arrangement in which pixels for RGB (red, green, blue) are disposed in a checkered pattern. In the circuit configuration shown in FIG. 58, four circuits for reading out the voltage signals from each of the floating diffusion portions are provided. Here, signal read out lines for pixels disposed in odd lines (Blue line) are connected to read out circuit for Blue and read out circuit for Green (B) in Blue line each being interposed by a switch transistor; and signal read out lines for pixels disposed in even lines (Red line) are connected to read out circuit for Red and read out circuit for Green (R) in Red line each being interposed by a switch transistor. Also, four amplifiers and AD inverters are provided for read out circuit for Blue, read out circuit for Green (B), read out circuit for Red and read out circuit for Green (R). Thus, the transfer of the voltage signals from each of the read out circuits to the amplifier and AD converter can be carried out in parallel.

FIG. 59A schematically shows the read out operation of voltage signals by the circuit shown in FIG. 58. FIG. 59B schematically shows the read out operation of ordinary voltage signals. In FIGS. 59A and 59B, the portion marked with inclined solid lines indicates a signal read out period from the pixel to the signal read out & noise cancel circuit 127. In FIGS. 59A and 59B, the portion marked with inclined alternate long and short dash lines indicates a signal read out period from the signal read out circuit & noise cancel circuit 127 to the amplifier & AD converter circuit 128.

As shown in FIG. 59A, when a 2n (n: 1, 2, 3, . . . ) row is selected, the signal read out circuit for Green (B) and the signal read out circuit for Red in the signal read out & noise cancel circuit 127 are connected to the signal line to read out voltage signals from the pixels. When the read out of the voltage signals from the pixels to the signal read out & noise cancel circuit 127 is completed, the signal read out circuit for Green (B) and the signal read out circuit for Red are cut off from the signal line, the signal read out operation shifts to the next row ((2n+1) row).

When the (2n+1) row is selected as an object of signal read out, the signal read out circuit for Blue and the signal read out circuit for Green (R) are connected to the signal line to read out the voltage signals from the pixels. When the read out of the voltage signals from the pixels to the signal read out & noise cancel circuit 127 is completed, the signal read out circuit for Blue and the signal read out circuit for Green (R) are cut off from the signal line and signal read out operation shifts to the next row ((2n+2) row). The above operation is executed in order to carry out the signal read out operation on every row.

Here, as shown in FIG. 58, since each of the read out circuits reads out the signals from the pixels in half of lines of the entire pixels, even when the signal transfer from the signal read out & noise cancel circuit 127 to the amplifier & AD converter circuit 128 is carried out using the same clock frequency as that used in an ordinary voltage signal read out operation, the signals can be transferred in a half time.

The signal read out is carried out using two read out circuits for each line so that, as for the pixels in an odd line, the signal read out is carried out by using the read out circuit for Blue and the read out circuit for Green (B); and as for the pixels in even line, the signal read out by using the read out circuit for Red and the read out circuit for Green (R). Accordingly, when the signal read out is carried out using the same clock frequency as that used in an ordinary voltage signal read out operation, total signal read out time is resulted in about a quarter at minimum of the ordinary read out operation time. The larger becomes the ratio of the signal transfer time (a portion marked with inclined alternate long and short dash lines in FIG. 59A) from the signal read out & noise cancel circuit 127 to the amplifier & AD converter circuit 128 with respect to the signal read out time (a portion marked with inclined solid lines in FIG. 59A) from the pixels to the read out circuit, the closer the total signal read out time is to a quarter of the ordinary read out operation time.

Figure 60:
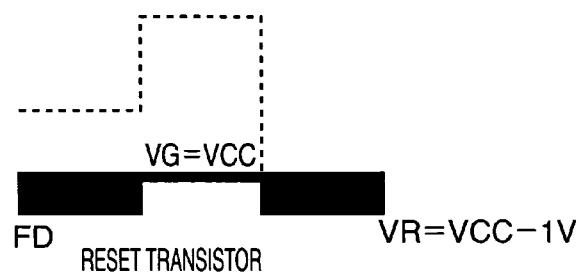
FIG. 60 is a diagram for illustrating a comparison example with respect to a reset operation in the embodiments of the present invention.

In a CMOS image sensor having a 4-transistor type pixel or 3-transistor type pixel, a reset voltage VR is written to the floating diffusion via the reset transistor. At that time, as shown in FIG. 60, ordinarily, the reset voltage VR is set to a low voltage of approximately (VCC−1) V so that the power supply voltage VCC is impressed to the gate electrode of the reset transistor, and the reset voltage VR is written in the state that the channel is sufficiently turned ON. However, accompanying the tendency of miniaturization in recent semiconductor integrated circuits, since the power supply voltage VCC to be supplied to each pixel is also reduced, when the reset voltage VR is set to a low value, necessary dynamic range for pixel is hardly ensured.

Figure 61:
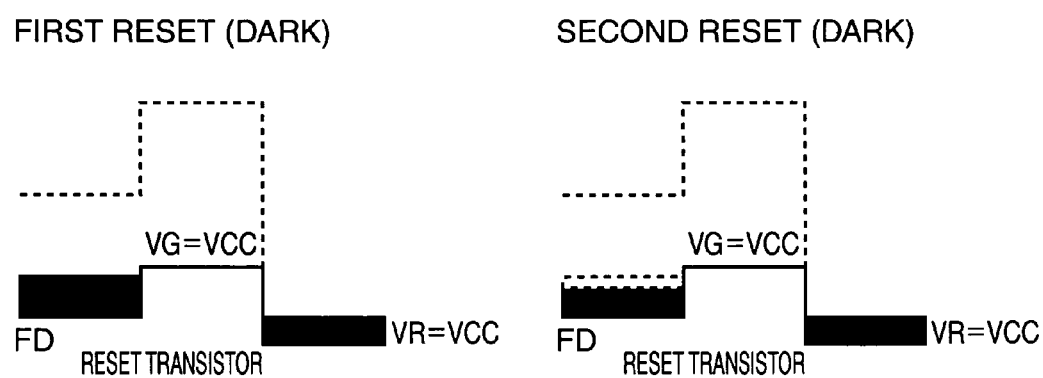
FIG. 61 is a diagram for illustrating a comparison example with respect to a reset operation in the embodiments of the present invention.

Further, when writing the reset voltage VR to the floating diffusion and the photodiode, when the power supply voltage VCC is impressed to the gate electrode of the reset transistor, and the reset voltage VR is set to the same voltage value as the power supply voltage VCC, a voltage higher than the voltage when the reset voltage VR is set to (VCC−1) V is written to the floating diffusion portion. However, during the writing, the channel of the reset transistor turns OFF, and the reset transistor enters into a sub-threshold region. Therefore, as shown in FIG. 61, when a continuous imaging is carried out in dark mode, at the second reset, a voltage further higher than that at the previous reset is written to the floating diffusion portion. Therefore, the voltage, which is actually written on the floating diffusion portion, may be varied.

Figure 62A:
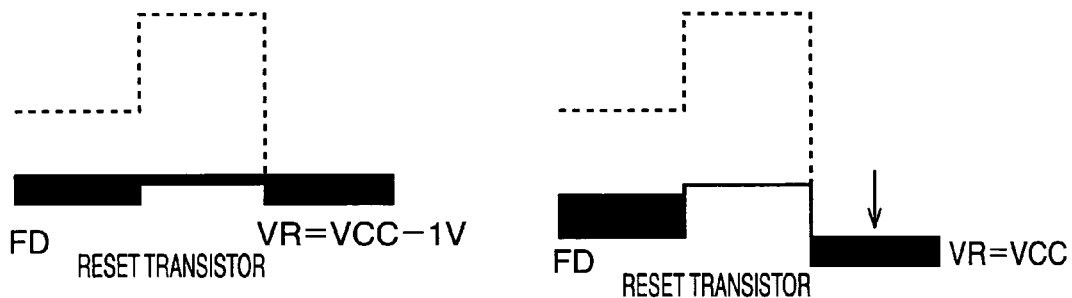
FIG. 62A and FIG. 62B are diagrams for illustrating the reset operation in one embodiment of the present invention.
Figure 62B:
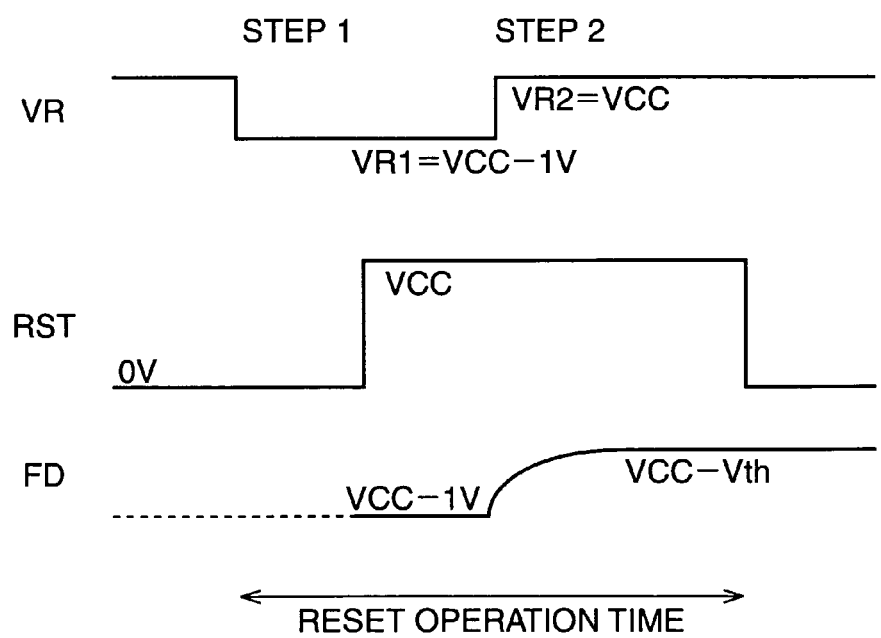

FIG. 62A shows potential from the floating diffusion portion to the VR terminal of the reset transistor in the reset operation of this embodiment. FIG. 62B is a timing chart showing the operation of the reset transistor in the floating diffusion portion.

As step 1 of the reset operation in this embodiment, after reducing the impressed voltage of the VR terminal from VCC to (VCC−1), the impressed voltage of the gate electrode of the reset transistor is set from 0 V to VCC. Owing to this, (VCC−1) is written to the floating diffusion portion in a state in which the channel of the reset transistor is sufficiently turned ON.

As the subsequent step 2, the impressed voltage of the VR terminal is returned from (VCC−1) to VCC. Owing to this, in the floating diffusion portion, VCC−Vth is written. The channel of the reset transistor is turned OFF and shifts to the state of sub-threshold region.

Owing to the above reset operation, VCC−Vth (in particular, approximately VCC−0.5 V), which is a voltage higher than VCC−1 V, is written to the floating diffusion portion. Here, the voltage written in the floating diffusion portion depends on the Vth of the reset transistor. However, by carrying out CDS (correlated double sampling), the dependency is eliminated.

Further, by creating a state in which the channel of the reset transistor turns OFF (the sub-threshold region) when writing the voltage to floating diffusion portion by reset operation as described above, when the writing is completed, such a state in which, between the floating diffusion portion and the VR terminal, only an extremely minute flow of electron from the floating diffusion portion to the VR terminal exists; i.e., a state that no electron enters/goes out between the floating diffusion portion and the VR terminal is created. Owing to this, an advantage such that random noise (kTC noise) caused from fluctuation in electron number within the floating diffusion portion is reduced is obtained.

Figure 63:
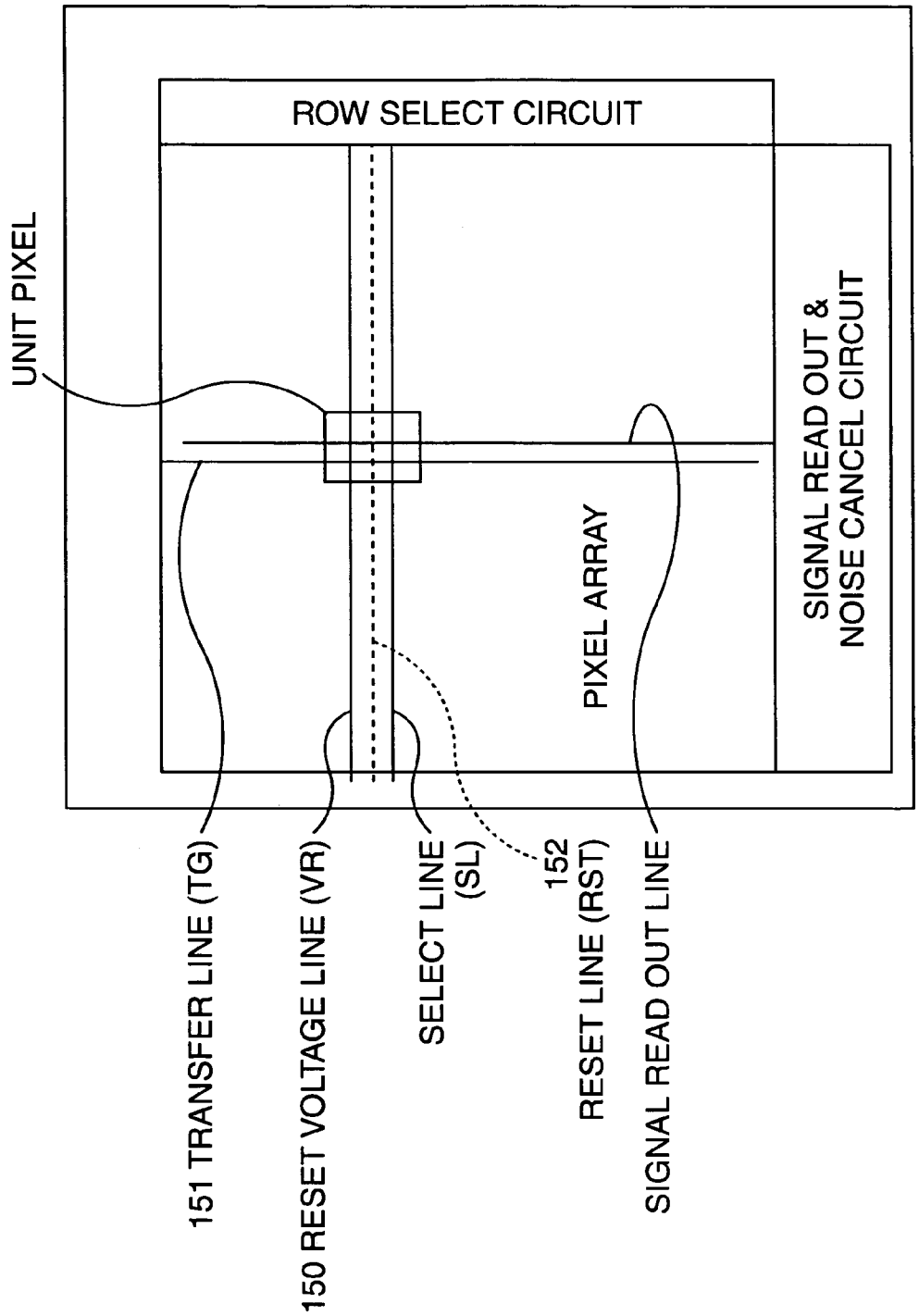
FIG. 63 is a plane diagram schematically showing a pixel array of a 4-transistor type pixel capable of ensuring the reset operation shown in FIG. 62A and FIG. 62B.
Figure 65:
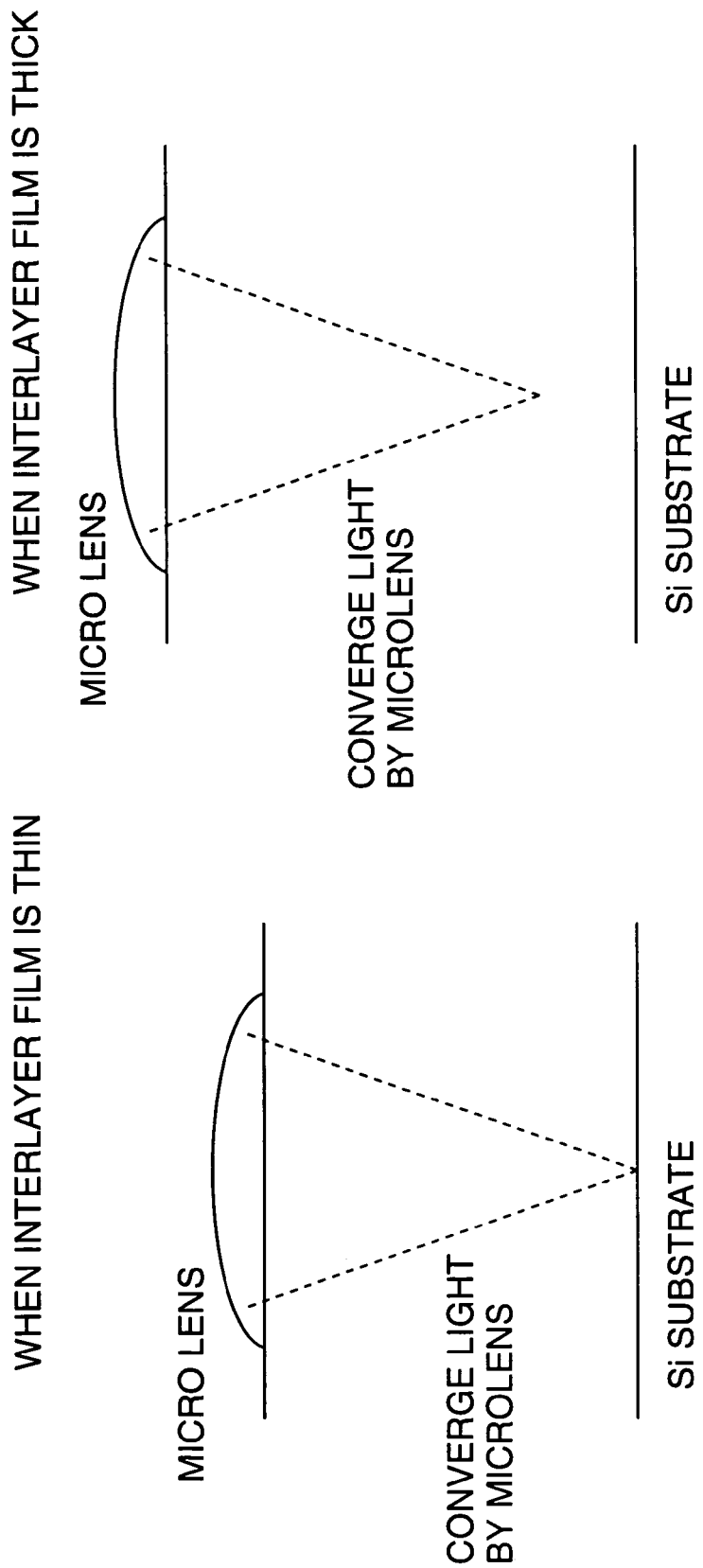
FIG. 65 is a diagram for illustrating a reduction of sensitivity due to an insufficient condensation of light by a photodiode.

FIG. 63 is a plane view schematically showing a pixel array in a 4-transistor type pixel capable of achieving the above described reset operation.

In the reset operation, in order to drive a reset voltage line 150 between VCC−1V and VCC, the reset voltage line 150 is connected to a row select circuit capable of controlling the supply voltage value, the reset voltage line 150 is wired in the row direction, and only the reset voltage line (VR line) 150 in the read out row is charged/discharged. In an ordinary 4-transistor type pixel, the transfer gate line (TG line), the reset line (RST line) and the select line (SL line) are wired in the row direction. As described above, since a reset line (VR line) 152 is wired in the row direction, a transfer gate line (TG line) 151 is connected to an internal voltage generation circuit and wired in the line direction.

By the wiring method of the transfer gate line (TG line), "rolling shutter", in which charge transfer from the pixels to the read out circuit and the read out from the read out circuit to the outside of the chip are carried out in order, cannot be carried out. However, when a "batch shutter operation", in which the charges are transferred from the pixels to the read out circuit at the same time in every row, and the voltage signals are read out of the chip on the basis of row, is carried out, the transfer gate line (TG line) 151 is made only to turn ON/OFF every row at the same time; the imaging operation can be carried out by the above-described reset operation.

Above described wiring method has advantage in power consumption. But, even in the case of ordinary wiring (FIG. 55), above described reset method can be executed.

INDUSTRIAL APPLICABILITY

According to the present invention, the pixel region and the storage element region are formed in the same process. Accordingly, in a semiconductor device in which the pixel region and the storage element region are packaged together, the thickness of the lamination on the substrate is reduced. Thus, it is possible to prevent the sensitivity from being degraded by the light irradiated through a microlens being focused in front of the pixel.

What is claimed is:

1. A semiconductor device, comprising:
a pixel region in which one or more pixels are formed, a pixel including a photodiode and a floating diffusion for temporarily holding a charge generated by said imaging element, and a plurality of transistors, said floating diffusion being an impurity diffusion region formed on a semiconductor substrate;
a storage element region in which one or more storage elements for storing output signals from said pixels are formed,
a bit line connected to a drain of each transistor constituting said storage element, and
wiring structure connected to said floating diffusion
wherein said wiring structure connected to said storage section and said bit line connected to said storage element are formed in the same process in the same layer.

2. The semiconductor device according to claim 1, wherein said storage element has a roughened surface configuration.

3. The semiconductor device according to claim 2, wherein said storage element is a stack type capacitor.

4. The semiconductor device according to claim 1, wherein said storage element is a trench type capacitor.

5. The semiconductor device according to claim 1, wherein said storage element is a flash memory cell.

6. The semiconductor device according to claim 1, wherein said pixel further includes a transfer transistor for switching the transfer operation of the charge from said imaging element to said floating diffusion,
said wiring structure connected to the gate electrode of said transfer transistor is formed along with said bit line in the same process.

7. The semiconductor device according to claim 1, further comprising a fuse for pixel for adjusting the voltage supplied to said pixel, said fuse is formed in an interlayer insulation film above a semiconductor substrate in said storage element region, and said fuse and said pixel region are formed on a same semiconductor wafer.

8. The semiconductor device according to claim 7, further comprising a fuse for storage element for adjusting the voltage supplied to said storage element, wherein
said fuse for pixel and said fuse for storage element are formed in the same process.

9. The semiconductor device according to claim 1, further comprising an internal voltage generation circuit for generating a voltage to be supplied to each of said pixel and said storage element.

10. The semiconductor device according to claim 9, wherein
said pixel includes at least a reset transistor for resetting electrical charge held by said storage section,
said internal voltage generation circuit supplies a minus voltage to said reset transistor as a gate voltage when said reset transistor is turned off.

11. The semiconductor device according to claim 10, wherein said internal voltage generation circuit supplies a word line negative reset voltage for said storage element to said reset transistor as a gate voltage when said reset transistor is turned off.

12. The semiconductor device according to claim 1, wherein a part of all output signals from said plurality of pixels stored in said storage element is outputted to the outside of the semiconductor device, and after that if any instruction is given, said all output signals are outputted from said storage element to the outside of the semiconductor device.

13. The semiconductor device according to claim 1, further comprising signal read out unit for reading out the output signals from said plurality of pixels disposed in a matrix configuration, wherein
said signal read out unit includes a first signal read out section for pixels disposed in odd lines and a second signal read out section for pixels disposed in even lines.

14. The semiconductor device according to claim 13, wherein said first signal read out section and said second signal read out section include a number of signal read out circuits corresponding to the kinds of color signals obtained by said each pixel respectively.

15. An imaging device, comprising:
an imaging element and one or more pixels including a reset transistor of which one impurity diffusion layer functions as a floating diffusion for temporarily holding a charge generated by said imaging element, said floating diffusion being an impurity diffusion region formed on a semiconductor substrate, an internal voltage generation circuit that generates a voltage to be supplied to said pixels, a row select circuit that selects the objective pixels of which signals are read out by said signal read out unit in said plurality of pixels disposed in a matrix configuration on the basis of row, and is capable of controlling the voltage value supplied to said pixels from said internal voltage generation circuit, wherein said pixels further include a transfer transistor for switching the transfer operation of the charge from said imaging element to said floating diffusion, the signal line connected to the gate electrode of said transfer transistor is connected to said internal voltage generation circuit and disposed in the line direction of said pixel group, the signal line connected to the gate electrode of said reset transistor is connected to said row select circuit and disposed in the row direction of said pixel group, wherein a voltage lower than a value in which a voltage impressed to the gate electrode of said reset transistor is subtracted by a threshold voltage of said reset transistor is once impressed to the other impurity diffusion layer of said reset transistor, after that, by impressing a voltage, which is substantially the same level as that of the impressed voltage to said gate electrode, to said other impurity diffusion layer, the electrical charge held by said storage section is reset.

16. A semiconductor device, comprising:

a pixel region in which one or more pixels are formed, a fuse for the pixel region, said fuse is formed in an interlayer insulation film above a semiconductor substrate in a storage element region, and one or more storage elements for storing output signals from the pixels are formed in said storage element region, a color filter and micro-lens on the pixel region, wherein said filter and micro-lens are not on the fuse, the color filter is formed above a photodiode formed in a semiconductor substrate, the microlens is formed above the color filter, said fuse and said pixel region are formed on a same semiconductor wafer, and each of said color filter and said micro-lens is formed above the pixel.

17. The semiconductor device according to claim 1, wherein a plurality of transistors included in said pixel comprises a select transistor, a transfer transistor, a source follower transistor and a reset transistor.

18. The semiconductor device according to claim 1, wherein the same layer is a layer provided at the same height on a semiconductor substrate.

* * * * *